(12) United States Patent
Lowrey et al.

(10) Patent No.: US 7,646,630 B2
(45) Date of Patent: Jan. 12, 2010

(54) PROGRAMMABLE MATRIX ARRAY WITH CHALCOGENIDE MATERIAL

(75) Inventors: Tyler Lowrey, San Jose, CA (US); Ward Parkinson, Boise, ID (US); Guy Wicker, Southfield, MI (US)

(73) Assignee: Ovonyx, Inc., Rochester Hills, MI (US)

( * ) Notice: Subject to any disclaimer, the term of this patent is extended or adjusted under 35 U.S.C. 154(b) by 91 days.

(21) Appl. No.: 11/209,079

(22) Filed: Aug. 22, 2005

(65) Prior Publication Data

US 2006/0097240 A1     May 11, 2006

Related U.S. Application Data

(63) Continuation-in-part of application No. 11/012,571, filed on Dec. 15, 2004, now Pat. No. 7,365,355, and a continuation-in-part of application No. 10/983,491, filed on Nov. 8, 2004, now abandoned, which is a continuation-in-part of application No. 10/983,491, filed on Nov. 8, 2004, now abandoned, application No. 11/209,079, which is a continuation-in-part of application No. 11/032,792, filed on Jan. 11, 2005, now abandoned.

(51) Int. Cl.
    *G11C 11/00* (2006.01)
(52) U.S. Cl. ............... 365/163; 326/39; 365/148
(58) Field of Classification Search ............. 365/148, 365/163, 174; 326/39–41
    See application file for complete search history.

(56) References Cited

U.S. PATENT DOCUMENTS

| | | | | |
|---|---|---|---|---|
| 4,786,904 A | * | 11/1988 | Graham et al. | 326/38 |
| 5,166,758 A | * | 11/1992 | Ovshinsky et al. | 257/3 |
| 5,296,716 A | * | 3/1994 | Ovshinsky et al. | 257/3 |
| 5,341,328 A | * | 8/1994 | Ovshinsky et al. | 365/163 |
| 5,359,205 A | * | 10/1994 | Ovshinsky | 257/3 |
| 5,406,509 A | * | 4/1995 | Ovshinsky et al. | 365/113 |
| 5,414,271 A | * | 5/1995 | Ovshinsky et al. | 257/3 |
| 5,534,711 A | * | 7/1996 | Ovshinsky et al. | 257/3 |
| 5,534,712 A | * | 7/1996 | Ovshinsky et al. | 257/3 |
| 5,536,947 A | * | 7/1996 | Klersy et al. | 257/3 |
| 5,596,522 A | * | 1/1997 | Ovshinsky et al. | 365/113 |
| 5,825,046 A | * | 10/1998 | Czubatyj et al. | 257/2 |
| 6,087,674 A | * | 7/2000 | Ovshinsky et al. | 257/2 |
| 6,448,576 B1 | * | 9/2002 | Davis et al. | 257/50 |
| 6,469,364 B1 | * | 10/2002 | Kozicki | 257/529 |
| 6,487,113 B1 | * | 11/2002 | Park et al. | 365/163 |
| 6,692,994 B2 | * | 2/2004 | Davis et al. | 438/128 |
| 6,795,338 B2 | * | 9/2004 | Parkinson et al. | 365/163 |
| 7,236,394 B2 | * | 6/2007 | Chen et al. | 365/184 |
| 7,589,343 B2 | * | 9/2009 | Lowrey | 257/4 |
| 7,590,918 B2 | * | 9/2009 | Parkinson | 714/763 |

* cited by examiner

*Primary Examiner*—Tuan T Nguyen
*Assistant Examiner*—Alexander Sofocleous
(74) *Attorney, Agent, or Firm*—Kevin L. Bray

(57) ABSTRACT

A memory element, a threshold switching element, or the series combination of a memory element and a threshold switching element may be used for coupling conductive lines in an electrically programmable matrix array. Leakage may be reduced by optionally placing a breakdown layer in series with the phase-change material and/or threshold switching material between the conductive lines. The matrix array may be used in a programmable logic device.

23 Claims, 41 Drawing Sheets

FIG - 2B
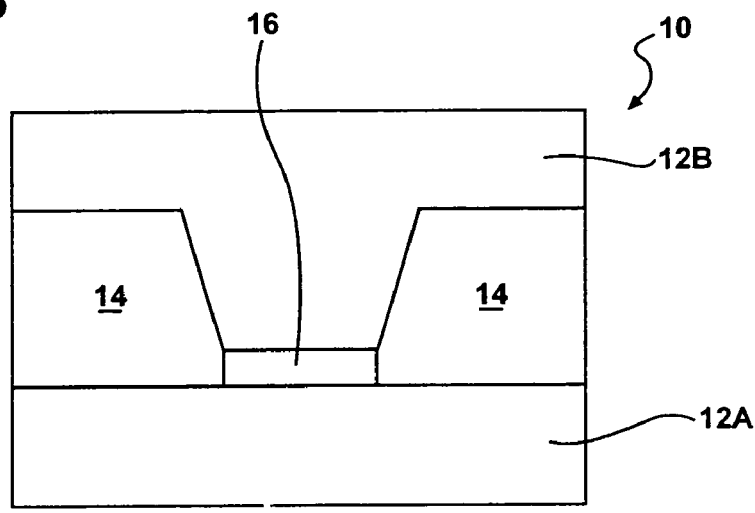
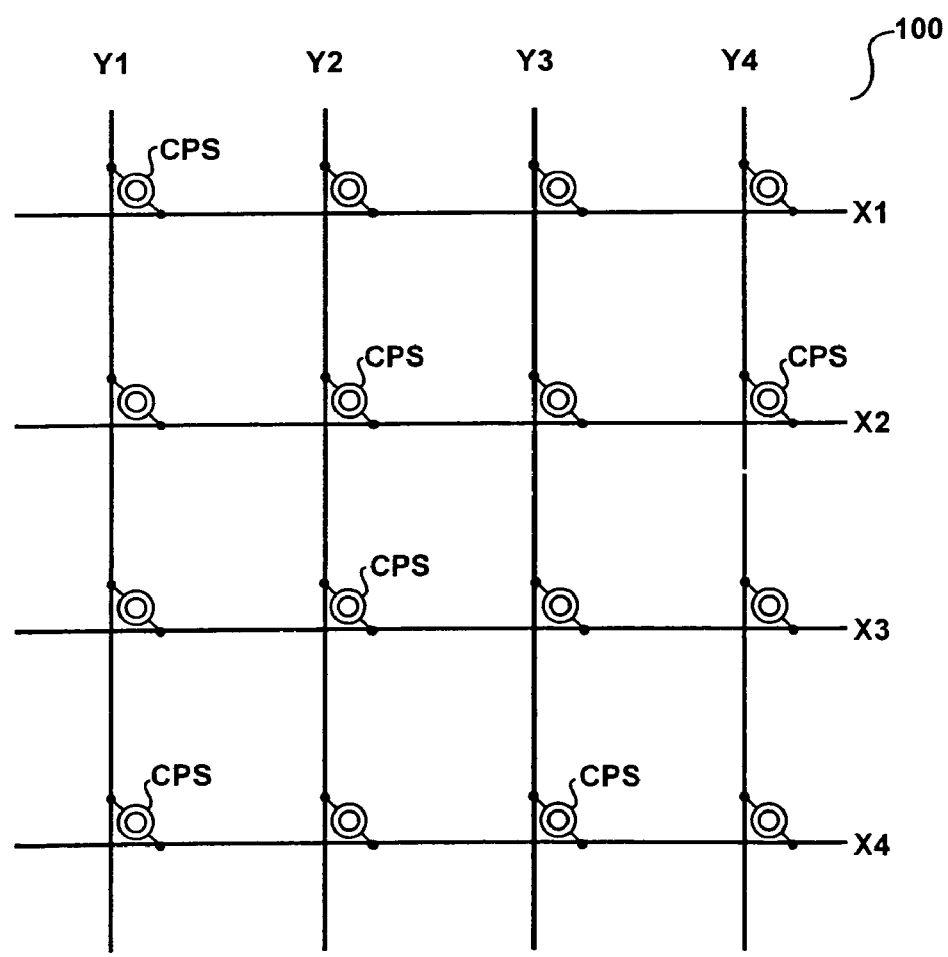
FIG - 3A

PROGRAMMABLE MATRIX ARRAY WITH CHALCOGENIDE MATERIAL

RELATED APPLICATION INFORMATION

This application is a continuation-in-part of U.S. patent application Ser. No. 10/983,491, filed on Nov. 8, 2004 now abandoned. This application is also a continuation-in-part of U.S. patent application Ser. No. 11/012,571, filed on Dec. 15, 2004 now U.S. Pat. No. 7,365,355, which is a continuation-in-part of U.S. patent application Ser. No. 10/983,491, filed on Nov. 8, 2004 now abandoned. This application is also a continuation-in-part of U.S. patent application Ser. No. 11/032,792, filed on Jan. 11, 2005 now abandoned. U.S. patent application Ser. No. 10/983,491 is hereby incorporated by reference herein. U.S. patent application Ser. No. 11/012,571 is hereby incorporated by reference herein. U.S. patent application Ser. No. 11/032,792 is hereby incorporated by reference herein.

FIELD OF THE INVENTION

The present invention generally relates to programmable integrated circuit devices, and more particularly to a programmable matrix array with programmable connections made with phase-change materials and/or threshold switching materials.

BACKGROUND OF THE INVENTION

Phase-change materials are capable of being electrically programmed between a first structural state where the material is generally amorphous and a second structural state where the material is generally crystalline. The term "amorphous", as used herein, refers to a structural condition which is relatively less ordered or more disordered than a single crystal. The term "crystalline", as used herein, refers to a structural condition which is relatively more ordered than amorphous. The phase-change material exhibits different electrical characteristics depending upon its state. For instance, in its crystalline, more ordered state the material exhibits a lower electrical resistivity than in its amorphous, less ordered state. Each material phase can be conventionally associated with a corresponding logic value. For example, the lower resistance crystalline state may be associated with a set state and a logic "1" while the higher resistance amorphous state may be associated with a reset state and a logic "0".

Materials that may be used as a phase-change material include, without limitation, alloys of the elements from group VI of the Periodic Table. These group VI elements are referred to as the chalcogen elements and include the elements Te and Se. Alloys that include one or more of the chalcogen elements are referred to as chalcogenide alloys. An example of a chalcogenide alloy useful as a phase-change memory material is the alloy $Ge_2Sb_2Te_5$ (also referred to as GST225).

Hence, certain chalcogenide materials are phase-change materials that may be electrically programmed to undergo structural change. As will be discussed in more detail below, there are other chalcogenide materials that may not readily undergo such structural changes and may remain in a relatively amorphous state. Such materials may be useful as threshold switching materials which become highly conductive (without substantial change of structure) by application of a sufficiently high voltage. A volume of phase-change material can be reversibly programmed between a high resistance state referred to as a reset state and a low resistance state referred to as a set state to provide a binary mode of operation. A volume of phase-change material may also be programmed back and forth among three or more resistance states of intermediate resistance values to provide a multi-state mode of operation.

The phase-change materials may change states through application of an electrical signal. The electrical signal may be a voltage across or a current through the phase-change material. The signal may be applied from either a voltage source or a current source. The electrical signal may be in the form of one or more electrical pulses. For example, the volume of material may be programmed from its high resistance reset state to its low resistance set state through application of an electrical pulse (e.g. a current pulse) referred to as a set pulse.

While not wishing to be bound by theory, it is believed that the set pulse is sufficient to change at least a portion of the volume of memory material from a less-ordered amorphous state to a more-ordered crystalline state. The volume of material may be programmed back from the low resistance set state to the high resistance reset state by application of an electrical pulse (e.g. a current pulse) referred to as a reset pulse. While not wishing to be bound by theory, it is believed that application of a reset pulse to the volume of material is sufficient to change at least a portion of the volume of memory material from a more-ordered crystalline state to a less-ordered amorphous state. It is conceivable that other forms of energy, such as optical energy, acoustical energy or thermal energy, may be used to change the state of the volume of material.

A phase-material material may be used to form a phase-change memory element. A phase-change memory array may be arranged as an array of rows and columns of phase-change memory cells. Associated with each of the columns is a bit line and associated with each of the rows is a word line. Each memory cell may comprise a memory element in series with an access device (also referred to as a select device or isolation device). Examples of access devices include diodes, transistors (such a MOS transistors) and threshold switches such as chalcogenide threshold switches or S-type threshold switches (explained in more detail below). Memory elements may be programmed to store different logic states and be interrogated to read the logic state stored therein. They may be used to store program instructions or data for executing a program in, for example, a processing unit.

A memory cell can be selected for a reading operation, for example, by applying suitable select voltages to the word and bit lines corresponding to the selected memory cell and by applying deselect voltages to the word and bits lines corresponding to the deselected element. When current is forced into the selected column, for example, a voltage reached at the selected bit line depends on the resistance of the memory element (which corresponds to logic value stored in the selected memory cell).

For general memory use, either commodity or embedded, the logic value stored in the memory cell may be evaluated by sense amplifiers of the memory. Typically, a sense amplifier includes a comparator receiving the bit line voltage (or a related voltage) and a suitable reference voltage. As an example, if the bit line driven by a read current achieves a voltage that is higher than the reference voltage for having higher resistance than the lower resistance case, the bit may be decreed to correspond to a stored logic value "0", whereas if the bit line voltage is smaller than the reference voltage for the cell having lower resistance, then the bit may be decreed to correspond to the stored logic value "1".

Products, such as programmable logic devices, achieve random logic designs by providing standard logic interconnected to user specifications through an X-Y grid. A programmable logic device may include one or more logic gates. A logic gate may perform a logic operation such as, for example, INVERSION, AND, OR, EXCLUSIVE OR, NAND, NOR or EXCLUSIVE NOR. A programmable logic device may include one or more logic blocks. The X-Y grid of a programmable logic device may be conceptually similar to the X-Y grid of a memory array and may include a plurality of X lines (corresponding, for example, to row or word lines) and a plurality of Y lines (corresponding, for example, to column or bit lines). An X line may end at a Y line or a Y line may end at an X line. The X lines may cross (either over or under) the Y lines. The point at which an X line crosses (either over or under) a Y line may be referred to as a cross-over point, a cross-point or a cross-connect.

The X lines may be oriented in a first direction while the Y lines are oriented in a second direction different from the first direction. The X lines may be substantially perpendicular to the Y lines. The X lines may be physically spaced apart from the Y lines. The X lines are preferably insulated from the Y lines, however, it is possible that the X lines may be connected to the Y lines (or even to other X lines) such as through a shorting contact or shorting bar. When interconnecting logic instead of memory elements of a memory array, the X-Y grid may be more random in spacing and more irregular in length than the X-Y grid of the memory array.

In a memory array, the impedance between an X line and a Y line may be very high, like an open circuit, until the select device (also referred to as an isolation device or an access device) is enabled, such as by row selection. Such selection may entail lowering or raising the X line and/or Y line. The select device may be configured such that selecting a particular X line and/or Y line may lower the impedance between a memory element and a corresponding X line or Y line, or between a memory element and a fixed voltage such as ground.

The X-Y grid of conducting lines used for interconnecting logic (such as in a programmable logic array) may have a relatively linear resistance between the lines (instead of a piecewise linear resistance which may exist in a memory array). That is, for a logic device such as a programmable logic array, an OPEN connection between an X line and a Y line may, for example, be represented by a resistance which is relatively high where an open circuit is intended (and may remain open for any combination of voltages on X or Y that are less than the normal operating range (except when programming). Likewise, a CLOSED connection between an X line and a Y line may be represented by a resistance which is relatively low where a short circuit is intended. Or at least a low resistance after a small percentage of the power supply develops across the programmed element. And that low resistance remains whether the two lines are selected or not (unlike a memory where the impedance has to become high when a different memory bit is selected—so that information in the other bit is selected and information in the other bit may be interrogated without being adversely affected by the prior bit selected (thus avoiding a misread or read-disturb during interrogation of the memory bit).

The appropriate programmable connections between the X lines and Y lines (which may be at the cross-points) of programmable logic may be programmed in different ways. One type of programming technology used to selectively determine connections is mask programming. This is done by the semiconductor manufacturer during the chip fabrication process. Examples of mask programmable devices include mask programmable gate arrays, mask programmable logic arrays and mask programmable ROMs. In the case of mask programming, a CLOSED connection may be an actual short circuit, using a contact or via plug between an X line and a Y line at a cross-point, while an OPEN connection may be an actual open circuit where the insulator between the layers is not cleared because a contact or via plug is not present there on the "mask" used to fabricate the chip. This approach is characterized by good layout efficiency and performance, but higher tooling costs and time delay to first article product, since custom masks and layout are used for each different customer product.

In contrast to mask programmable devices, field programmable devices are programmed after they are manufactured. Examples of field programmable devices include programmable ROM (PROM), electrically erasable ROM (EEPROM), field programmable logic arrays (FPLA), the programmable array logic device (PAL®), the complex programmable logic device (CPLD), and the field-programmable gate array (FPGA).

Field programmable devices make use of programmable connections at the cross-points of the X lines and the Y lines that can be programmed after the time of manufacture, and such programming may be done by the manufacturer to customer specification, or by the OEM upon receipt, or by the end customer in the field, and even updated periodically such as through an internet download.

For field programmable devices such as field programmable logic arrays, the programmable connections may be made so that a relatively high resistance between the lines represents an OPEN connection between the lines while a relatively low resistance represents a CLOSED connection between the lines. Products with lower resistance for CLOSED connections may be faster with improved voltage margin, especially if the capacitance of the programmable connection tied to the interconnect lines is low. Programmable connections having a higher resistance for OPEN connections may have lower leakage and better voltage margin (those connections intended to be OPEN connections may have a larger voltage difference across the lines).

The power drained off and heat generated (battery drain in mobile units) by the cross-points intended to be OPEN may be a larger problem in larger logic arrays with more X-Y interconnects, and hence more cross-points. Hence, for non-mask programmed field programmable devices, whether tying together logic or other electronic functions, there is a need for a programmable connection that may provide a relatively low resistance in CLOSED connections and a relatively high resistance in OPEN connections.

A programmable connection for a field programmable device (such as a field programmable logic array-FPLA) may be a volatile or non-volatile connection (the difference being whether the device needs to be re-programmed each time power is restored). For example, when a computer is turned off, the logic pattern desired in the field programmable logic chips may be stored in hard disc. Upon power-on restart, the logic interconnect pattern may be reloaded into the logic device (such as FPLA), at the expense of delayed restart. Such a volatile approach, may store the state of the programmable connection at each cross-point node on a static RAM (SRAM) driving an n-channel cross point transistor, as shown in FIG. 1.

FIG. 1 shows an example of a programmable connection that uses an SRAM to drive the gate of an n-channel transistor at the cross-point of an X line and a Y line. The X line and Y line may be part of a larger X-Y matrix. The p-channel pull-up transistors Q2 and Q4, provide a high logic level near the power supply, and the n-channel pull-down transistors Q6 and Q8, provide a pull-down to the lower power supply, in the usual CMOS fashion. Here, the transistors are also cross coupled into an SRAM so that node N2 or node N4 may be high and the other low. Line PX may select the SRAM through transistor Q12 so that data may be written on line PY (such data may be furnished by a processor on or off-chip). Output node N2 drives the gate of transistor QI (the interconnect transistor), making it conductive when the gate is high or non-conductive when the gate is driven (by programming the SRAM) to a low or off state. The transistor Q10 is coupled between the Y conductive line and the X conductive line.

The programmable connection may be characterized by its worst case capacitance and resistance over the voltage and temperature range of the lines interconnected, a lower resistance when CLOSED providing less delay and better voltage margin. A higher resistance when OPEN provides lower leakage and battery drain, as well as improved voltage margin by reducing line and driver voltage drop from leakage.

In the SRAM type programmable connection example shown in FIG. 1, the source to drain "on" resistance is lower for voltages on the X and Y lines coupled that are less than the power supply to which the gate is driven, since the resistance from source to drain of the n-channel transistor tends to increase when the source or drain voltages approach the gate voltage. Accordingly, in some versions of greater complexity, the n-channel transistor QI may have a special low threshold voltage Vt or may be in parallel with a p-channel transistor with gate driven by node N4. This full mux approach provides lower resistance but at the expense of greater capacitance and increased chip area for each matrix switch.

As a further example, to make such an approach non-volatile, the SRAM in FIG. 1 may be replaced by an EPROM, EEPROM, or Flash transistor properly loaded to drive the n-channel transistor QI, or the SRAM may be mirrored with non-volatile memory such as FeRAM. Programming the non-volatile memory may be accomplished with a special higher voltage or current for the non-volatile element. However, such an approach increases process complexity.

The SRAM or the non-volatile alternative require considerable area in the base silicon to implement the switching element across the X and Y lines. For example, the cross-point transistor alone may take up considerable area that could otherwise be dedicated to logic and interconnect. Further, considerable extra interconnect is necessary to X-Y select the SRAM or its non-volatile equivalent, such as PX and PY wires at each intersection to uniquely select the SRAM cross-point transistor driver or non-volatile programming element as shown in FIG. 1. Extra interconnect similarly may require extra chip area or interconnect layers that may raise cost and complexity of the delivered product.

The programmable connections in field programmable devices such as FPLAs may be formed as non-volatile anti-fuses at the X-Y interconnect. Products using anti-fuses (for example FPLAs from Actel, Inc.), desirably reduce the chip area and layers dedicated to programming the programmable connection, by reducing the semiconductor active devices and interconnect (e.g. PX and PY) at each cross-point.

This approach may also free up base silicon by forming the programmable connection as a thin-film layer between interconnect layers. FIG. 2A shows an anti-fuse 10 coupled between an X line and a Y line. The anti-fuse 10 acts as an OPEN connection before it is programmed. The anti-fuse may be implemented using an insulative breakdown material that is broken down to provide a conductive pathway through application of a sufficiently high voltage across the material. The anti-fuse may be a metal-metal anti-fuse. FIG. 2B shows an example of an anti-fuse 10 that includes a first metal layer 12A, a second metal layer 12B, a dielectric layer 14 and a breakdown layer 16. The metal layers 12A,B may be formed of an alloy of tungsten, titianum and siligon. The breakdown layer 16 may be formed of an amorphous silicon. Once programmed to a lower resistance state, an anti-fuse cannot be readily reversed. Accordingly, testing in the field may be difficult and reversing a programmed anti-fuse may not be possible.

Manufacturers of equipment may find an error in FPLA operation after programming at the factory and shipment to the customer that could be fixed if the programming is reversible, perhaps allowing correction through remote dial-up and download to re-program the logic if the cross-point programming is reversible. Or, the chip may be removed in the field and re-programmed by plugging into an adaptor to a computer.

However, while such an option is possible with SRAM or its non-volatile equivalent, such an option may not be possible with a fuse-based or anti-fuse based approach where reversing the programming is not practical. Instead, the part may be removed and replaced at considerable expense to the manufacturer and inconvenience to the customer.

Further, due to the testing limitations of using irreversible cross-point link anti-fuses to program the interconnect, testing of the arrays intended for use by the customer may be done only indirectly by programming spare but representative anti-fuses before a part is shipped. However, when needed, actual programming of (previously untested) links used by the customer may be unsuccessful, since the links or cross-points actually used may be defective, since they are untested before being shipped or used. Programmable connections found unprogrammable may require return of the unit to the factory or even replacement in the final equipment if personalization is done after assembly and is unsuccessful in attempting to program an (untested) fuse.

Each of these discards may be at successively higher cost and require an undesirable manufacturing and field use flow which is incompatible with a more preferred zero-defect manufacturing and use. To better improve "yield" and reduce defects in the field, the size and complexity of irreversible fuse or anti-fuse based approaches may be limited to relatively small arrays of interconnect compared to the more testable SRAM based approaches.

Further, the non-SRAM based approaches may add processing steps, beyond those of making the logic to be interconnected, that excessively raise cost. Customer preferences for lower cost suggest that such additional processing steps are preferably offset by reduced chip size, processing steps, and/or reduced test cost relative to SRAM, since SRAM may take up more chip area but does not add extra process steps.

Accordingly, there is a need for a programmable matrix array (such as, for example, a field programmable matrix array) using a non-volatile programmable connection that may be reversible in the field.

SUMMARY OF THE INVENTION

One aspect of the present invention is a programmable connection comprising a programmable resistance material such as a phase-change material. Such a thin-film programmable connection may be located and fabricated between the intersection of the lines to be coupled by programming. Such a programmable connection may be programmed by the lines to be coupled, without additional programming lines located at or connected to the programmable connection. Instead, the programming control lines and programming devices/drivers may be located anywhere along the interconnect lines, and, for example, more conveniently and efficiently on the ends of the interconnectable lines. Thus the programming devices and lines are shared across more than one programmable connection to reduce programming overhead area for improved efficiency and cost.

The low resistance or set state of the phase-change material may be used where a CLOSED connection (for example, a short circuit) is desired between the X and Y lines. The high resistance or reset state may be used where an OPEN connection (for example, an open circuit) is desired between the X and Y lines. Leakage through OPEN connections may be reduced by lowering the power supply relative to the threshold voltage Vth of the phase change material, or by raising Vth relative to the normal operating range of the power supply. Lowering the voltage may be accomplished by a regulator outputting a regulated voltage Vreg, and preferably this regulator is adjustable block to block and/or die to die either at probe or after packaging, dynamically adjustable in the field (either by the user or by on-chip self-diagnosis). The TC of the regulator may be adjusted to be as near zero as possible, or more optimally to fit circuit requirements.

Raising the threshold voltage Vth of the phase-change memory element may be accomplished by using higher current amplitude when programming the bit into the reset or higher resistance state. For example 1 ma amplitude of 50 nsec may result in a reset resistance Rreset (corresponding to the amorphous state) of 500K and threshold voltage Vth of 1.1V. Next, programming the same bit at 1.5 ma amplitude of 50 nsec may result in Rreset of 750K and Vth of 1.25V. Such amplitude, like the regulator output, may be adjusted at the factory using (laser) fuses or anti-fuses, for example—or later adjusted in the field as needed (such as by measuring the margin after a cross-point bit is written).

As a further alternative, the memory element may be deleted and a threshold switch (such as a chalcogenide threshold switch) may be coupled between an X line and Y line without a memory element. In this case, the programmable connection is volatile and may be reloaded/reprogrammed after turning off the power or after a power glitch where the power is outside its allowed range (high or low). The threshold voltage Vth(T) of the threshold switch may be adjusted to exceed maximum voltage of the power supply. Then, unless programmed on power up, the threshold switch remains off. However, if programmed on at power up, the threshold switch may stay on if the transitions are fast enough and/or adequate leakage is provided to keep the bit on during and after transitions.

To further reduce power on unused cross-points, any of the programmable connections described may further comprise a thin-film breakdown layer. The breakdown layer is preferably formed of a dielectric material. The breakdown layer may have an adequately high resistance so that no significant increase in leakage or battery drain occurs for those programmable connections having a breakdown layer that is not selected and penetrated. The breakdown layer may be disposed such that it is in series with the phase-change material between the interconnected X and Y line, and/or in series with the threshold switching material between the X and Y lines, and/or in series with the serially coupled combination of phase-change material and threshold switching material between the X and Y lines. With a breakdown, layer, the creation of the CLOSED connection may require creating one or more conductive pathways through the breakdown layer by puncturing, popping or breaking down the breakdown layer with voltage or current.

The programmable connection, which may be formed at a cross-point, may be tested by programming the phase-change material to the high resistance reset state and then to the low resistance set state. It is noted, that only those phase-change programmable connections which may potentially be CLOSED (initially or later) would need their breakdown layers penetrated at factory or at initial customer test. For example, if a customer knows that certain cross-points in a general purpose FPLA will probably not be used in certain applications, the breakdown layers of the corresponding programmable connections need not be penetrated. Since the breakdown layer causes the programmable connection to have higher impedance until penetrated, the leakage is thereby reduced while retaining general flexibility at each X-Y interconnection to program it later.

In sections of the design where lower resistance is desired at a cross-point, such as to drive the heavy capacitance load of a driver device input, several X-Y lines may be wired in parallel. Alternately, a small buffer gate may be permanently wired-in to drive the higher capacitance input. Permanently wired interconnects may also be used for other logic connections in order to reduce the number of programmable connections, thereby further reducing leakage as well as test requirements. Alternately, an SRAM programmable connection (or one or more other existing alternatives) may be wired in parallel with or used on the same chip with the phase-change programmable connections disclosed herein.

Advantageously, the programmable connection may be made as a thin-film phase-change material, a thin-film threshold switching material or a series combination of phase-change material and threshold switching material (and optionally, a breakdown layer in series therewith) and located between the interconnect conductive layers, preferably reducing chip size and/or freeing up more underlying chip area for logic while still being reversible for improved testability and field repair/changes.

The breakdown layer is penetrated in those programmable connections which are actually programmed to a low resistance or tested to assure field programmability (that may be of interest to program later). With testability as described herein, a limitation against use of a thin-film programmable connection for larger logic arrays is overcome.

To further assist testability, an optional read current source may be used that includes, for example, an operational amplifier and a reference voltage VREF (as an input to the operational amplifier) to read and confirm the resulting resistance of a programmable connection after programming. (A re-write may be initiated if the results are not acceptable). Such reference voltage VREF may be adjusted to be a fixed value that is adjusted at probe to fit wafer characteristics, and may also be dynamically adjustable to be higher when reading a phase-change programmable connection programmed to the high resistance or reset state, and VREF may be adjusted lower, by on-chip electronic means, when reading a programmable connection programmed to the low resistance or set state (such adjustment to assure additional resistance margin beyond the resistance merely required).

An embodiment of the invention is an apparatus, comprising: a first conductive line; a second conductive line; a threshold switching material coupled between the first conductive line and the second conductive line. The apparatus may be an integrated circuit. The apparatus may be a programmable logic device.

Another embodiment of the invention is a programmable logic array, comprising: a first conductive line; a second conductive line; a threshold switching material coupled between the first conductive line and the second conductive line. The programmable logic array may include a plurality of first conductive lines and a plurality of second conductive lines.

Another embodiment of the invention is an apparatus, comprising: a first conductive line; a second conductive line; and a chalcogenide material coupled between the first and second conductive line. The apparatus may be an integrated circuit. The apparatus may be a programmable logic device. The first conductive line may cross the second conductive line. It is possible that in an embodiment of the invention there is no diode or transistor in series with the chalcogenide material between the first and second conductive lines.

Another embodiment of the invention is an apparatus, comprising: a plurality of first conductive lines; a plurality of second conductive lines; a threshold switching material coupled between at least a certain one of the first conductive lines and at least a certain one of the second conductive lines. The apparatus may be a integrated circuit. The apparatus may be a programmable logic device.

Another embodiment of the invention is an apparatus comprising, comprising: a plurality of first conductive lines; a plurality of second conductive lines; a plurality of programmable connections, each of the programmable connections coupled between one of the first conductive lines and one of the second conductive lines, each of the programmable connections comprising a threshold switching element coupled between the corresponding first and second conductive lines. The apparatus may be an integrated circuit. The apparatus may be a programmable logic device.

Another embodiment of the invention is a programmable matrix array, comprising: a plurality of first conductive lines; a plurality of second conductive lines; a chalcogenide material coupled between at least a certain one of the first conductive lines and at least a certain one of the second conductive lines.

Another embodiment of the invention is an apparatus, comprising: a plurality of first conductive lines; a plurality of second conductive lines; a chalcogenide material coupled between at least a certain one of the first conductive lines and at least a certain one of the second conductive lines. The apparatus may be an integrated circuit. The apparatus may be a programmable logic device.

Another embodiment of the invention is an apparatus, comprising: a plurality of first conductive lines; a plurality of second conductive lines; a plurality of programmable connections, each of the programmable connections coupled between a corresponding one of the first conductive lines and a corresponding one of the second conductive lines, at least a certain one of the programmable connections including a threshold switching material coupled between the corresponding first and second conductive lines. The apparatus may be an integrated circuit. The apparatus may be a programmable logic device.

Another embodiment of the invention is an integrated circuit, comprising: a plurality of row lines; a plurality of column lines; and a plurality of threshold switching elements, each of the threshold switching elements coupled between one of the row lines and one of the column lines. In one embodiment, the integrated circuit may be a programmable logic device. In another embodiment, the integrated circuit may be a memory device.

Another embodiment of the invention is a method of operating a programmable matrix array, comprising the steps of: providing the programmable matrix array, the matrix array including at least a first conductive line, at least a second conductive line, a chalcogenide material coupled between the first and second lines; floating the second conductive line; and providing an electrical signal on the first conductive line.

Another embodiment of the invention is a method of operating a programmable matrix array, comprising the steps of: providing the programmable matrix array, the matrix array including at least a first conductive line, at least a second conductive line, a phase-change memory element coupled in series with a threshold switching element between the first and second conductive lines; floating the second conductive line; and providing an electrical signal on the first conductive line.

Another embodiment of the invention is a method of operating a programmable matrix array, comprising: providing the programmable matrix array, the matrix array including at least a first conductive line, at least a second conductive line, a chalcogenide material coupled between the first and second lines; providing an electrical signal on the first conductive line while floating the second conductive line.

Another embodiment of the invention is a method of operating a programmable matrix array, comprising: providing the programmable matrix array, the matrix array including at least a first conductive line, at least a second conductive line, a phase-change memory element coupled in series with a threshold switching element between the first and second conductive lines; providing an electrical signal on the first conductive line while floating the second conductive line.

Another embodiment of the invention is method of operating a programmable matrix array, comprising: providing the programmable matrix array, the matrix array including at least a first conductive line, at least a second conductive line, a phase-change memory element coupled in series with a threshold switching element between the first and second conductive lines; providing an electrical signal on the first conductive line, the electrical signal satisfying the relationship:

$|Vth(T)+Vh(T)| < |Vhigh-Vlow| < |Vth(T)+Vth(M)|$, where Vhigh is the maximum voltage of the electrical signal, Vlow is the minimum voltage of the electrical signal, Vth(T) is the threshold voltage of the threshold switching element, Vth(M) is the threshold voltage of the memory element in its reset state and Vh(T) is the holding voltage of the threshold switching element.

Another embodiment of the invention is a method of operating a programmable matrix array, comprising: providing the programmable matrix array, the matrix array including a plurality of first conductive lines, a plurality of second conductive lines, a plurality of programmable connections, each the connections coupled between a corresponding one of the first conductive lines and a corresponding one of the second conductive lines, each of the programmable connections comprising a phase-change memory element coupled in series with a threshold switching element between the corresponding first and second conductive lines; substantially simultaneously applying a plurality of electrical signals to the plurality of first conductive lines where each of the electrical signals satisfying $|Vth(T)| < |Vhigh-Vlow| < |Vth(T)+Vth(M)|$, where Vhigh is the maximum voltage of the electrical signal, Vlow is the minimum voltage of the electrical signal, Vth(T) is the threshold voltage of the threshold switching elements and Vth(M) is the threshold voltage of the memory elements in the reset state.

Another embodiment of the invention is a method of operating a programmable matrix array, comprising: providing the programmable matrix array, the matrix array including a plurality of first conductive lines, a plurality of second conductive lines, a plurality of programmable connections, each the connections coupled between a corresponding one of the first conductive lines and a corresponding one of the second conductive lines, each of the programmable connections comprising a phase-change memory element coupled in series with a threshold switching element between the corresponding first and second conductive lines; substantially simultaneously applying a plurality of electrical signals to the plurality of first conductive lines where each of the electrical signals satisfying the relationship: $|Vth(T)|<|Vhigh-Vlow|<|Vth(T)+Vth(M)|$, where Vhigh is the maximum voltage of the electrical signal, Vlow is the minimum voltage of the electrical signal, Vth(T) is the threshold voltage of the threshold switching elements and Vth(M) is the threshold voltage of the memory elements in the reset state.

Another embodiment of the invention is a method of operating a programmable matrix array, comprising: providing the programmable matrix array, the matrix array including a plurality of first conductive lines, a plurality of second conductive lines, a plurality of programmable connections, each the connections coupled between a corresponding one of the first conductive lines and a corresponding one of the second conductive lines, each of the programmable connections comprising a phase-change memory element coupled in series with a threshold switching element between the corresponding first and second conductive lines; substantially simultaneously applying a plurality of electrical signals to the plurality of first conductive lines where each of the electrical signals sufficient to switch on a corresponding threshold switching element when the corresponding memory element is in a first state and insufficient to switch on the corresponding threshold switching element when the corresponding memory element is in a second state. The first state may be a first resistance state and the second state may be a second resistance state different from the first resistance state. The resistance of the second resistance state may be greater than the resistance of the first resistance state. The first resistance state may correspond to the set state of the memory element while the second resistance state may correspond to the reset state of the memory element.

Another embodiment of the invention is a method of operating a programmable matrix array, comprising: providing the programmable matrix array, the matrix array including a plurality of first conductive lines, a plurality of second conductive lines, a plurality of programmable connections, each the connections coupled between a corresponding one of the first conductive lines and a corresponding one of the second conductive lines, each of the programmable connections comprising a phase-change memory element coupled in series with a threshold switching element between the corresponding first and second conductive lines; substantially simultaneously applying a plurality of electrical signals to the plurality of first conductive lines where each of the electrical signals sufficient to switch on a corresponding threshold switching element when the corresponding memory element is in its set state and insufficient to switch on the corresponding threshold switching element when the corresponding memory element is in its reset state.

Another embodiment of the invention is a method of operating a programmable matrix array, comprising: providing the programmable matrix array, the matrix array including a plurality of first conductive lines, a plurality of second conductive lines, a first programmable connection coupled between a first one of the first conductive lines and one of the second conductive lines, the first programmable connection comprising a first phase-change memory element in series with a first threshold switching element, a second programmable connection coupled between a second one of the first conductive lines and one of the second conductive lines, the second programmable connection comprising a second phase-change memory element in series with a second threshold switching element; applying a first electrical signal to the first one of the first conductive lines and a second electrical signal to the second one of the first conductive lines, at least a portion of the first signal and at least a portion of the second signal applied at substantially the same time, the first signal sufficient to switch on the first threshold switching element when the first memory element is in its set state and insufficient to switch on the first threshold switching element when the first memory element is in its reset state, the second signal sufficient to switch on the second threshold switching element when the second memory element is in its set state and insufficient to switch on the second threshold switching element when the second memory element is in its reset state.

Another embodiment of the invention is a method of operating a programmable matrix array, comprising: providing the matrix array, the matrix array including a first plurality of conductive lines, a second plurality of conductive lines, a plurality of programmable connections, each of the programmable connections coupled between one of the first conductive lines and one of the second conductive lines, each of the programmable connections comprising a threshold switching element coupled in series with a phase-change memory element between the corresponding first and second conductive lines; programming the memory elements such that when a certain one of the memory elements is programmed to its set state then no other of the memory elements in the corresponding first and/or second conductive lines is programmed to its set state.

Another embodiment of the invention is a method of operating a programmable logic device, comprising: providing the programmable logic device, the logic device including a programmable matrix array, the matrix array including a plurality of first conductive lines, a plurality of second conductive lines, a plurality of programmable connections, each of the programmable connections coupled between one of the first and one of the second conductive lines, each of the programmable connections comprising a threshold switching element coupled in series with a phase-change memory element between the corresponding first and second conductive lines, each of the memory elements being programmable between a first resistance state and a second resistance state, the resistance of the second resistance state being greater than the resistance of the first resistance state; and programming the logic of the programmable logic device by programming the memory elements between their first and second resistance states.

Another embodiment of the invention is an integrated circuit chip, comprising: a programmable logic device; and a memory device, the logic device and the memory device each comprising a chalcogenide material.

BRIEF DESCRIPTION OF THE DRAWINGS

FIG. 2B shows an example of an anti-fuse;

FIG. 3A is an embodiment of a programmable matrix array comprising programmable connections;

DETAILED DECRIPTION

Figure 1:
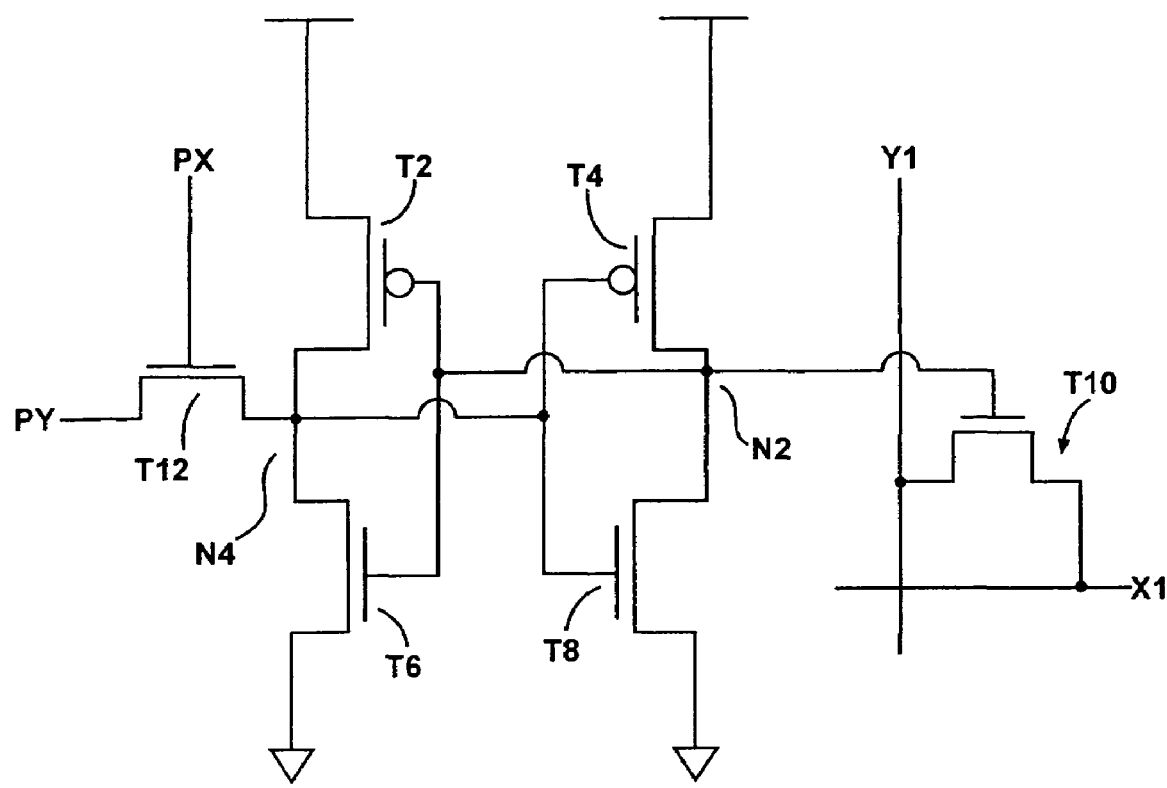
FIG. 1 shows an example of a volatile programmable connection using SRAM technology.

FIG. 3A shows an embodiment of an electrically programmable matrix array 100 of the present invention. The matrix array includes a first set of conductive lines X1 through X4 which are also referred to as X lines. The matrix array includes a second set of conductive lines Y1 through Y4 which are also referred to as Y lines. In the example shown there are four X lines and four Y lines. However, more generally, there may be one or more X lines, and there may be one or more Y lines. There may be a plurality of X lines. There may be a plurality of Y lines. Each of the X lines may be adjacent to a segment of a Y line. Each of the X lines may cross (either over or under) each of the Y lines at an angle. The angle may be substantially 90° (that is, substantially perpendicular). The points at which a line crosses over (or under) another or are adjacent to another are referred to as the crossover points or cross-points.

The embodiment of the matrix array 100 includes a plurality of programmable connections CPS. Each programmable connection CPS is coupled between an X line and a Y line. In the embodiment shown, it is seen how each programmable connection CPS may be electrically coupled between a corresponding one of the X lines and a corresponding one of the Y lines. Furthermore, in the embodiment shown, it is seen that the programmable connection CPS may be electrically coupled to one of the X lines and one of the Y lines. While, a programmable connection is coupled between a corresponding one of the X lines and a corresponding one of the Y lines, the programmable connection does not have to be physically disposed between the two corresponding lines. It may, for example, be electrically coupled to each of the lines without being physically located between the lines. Two lines may be on the same layer and physically adjacent for an adequate distance to allow coupling by the programmable connection.

In an embodiment of the invention, a programmable connection may comprise a phase-change material. At least one programmable connection may comprise a phase-change material. Generally, any phase-change material which is programmable between at least a first and second resistance state may be used. The phase-change material may comprise at least one chalcogen element. Material comprising one or more chalcogen elements are referred to as chalcogenide materials. An example of a phase-change material that is a chalcogenide material (and which may be used in the programmable connection) is $Ge_2Sb_2Te_5$. This alloy is also referred to as GST 225. GST 225 may be preferred since targets are readily available commercially and may be deposited by standard semiconductor equipment.

Other examples of phase-change materials which may be used are discussed in U.S. Pat. Nos. 5,166,758, 5,296,716, 5,341,328, 5,359,205, 5,406,509, 5,414,271, 5,534,711, 5,534,712, 5,536,947, 5,596,522, 5,825,046 and 6,087,674, all of which are hereby incorporated by reference herein. As used herein, a programmable connection that includes a phase-change material may also be referred to as a phase-change programmable connection.

It is noted that other embodiments of the invention are possible where a programmable connection is formed from programmable resistance materials that can be electrically programmed between at least a first resistance state and a second resistance state, but which are not phase-change materials. Hence, it is possible that the programmable connection be made from programmable resistance materials other than phase-change materials.

Figure 4A:
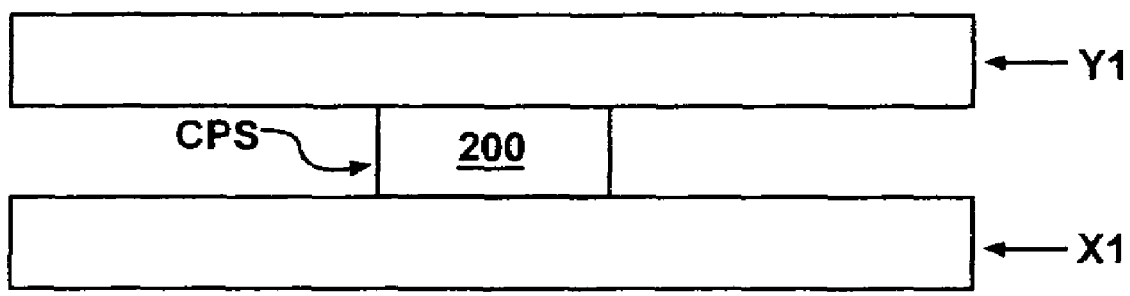
FIG. 4A shows an embodiment of a programmable connection of the present invention comprising a phase-change material.

FIG. 4A shows a simplified diagram of an embodiment of a programmable connection CPS that includes a phase-change material 200. The phase-change material is electrically coupled between an X conductive line and a Y conductive line. The X line may represent any of the X lines in the X-Y matrix while the Y line may represent any of the Y lines in the X-Y matrix. In the embodiment of FIG. 4A, the phase-change material is electrically coupled as well as directly connected to both the X line and Y line. This embodiment shows that a programmable connection may be formed without using any additional electrodes. Portions of the conductive X and Y lines themselves may be used for programming the phase-change material.

In this embodiment, the phase-change material is physically disposed between the X line and Y line. However, the phase-change material does not have to be physically disposed between the X line and the Y line. The phase-change material may be laterally adjacent to an X line and/or a Y line.

Figure 4B:
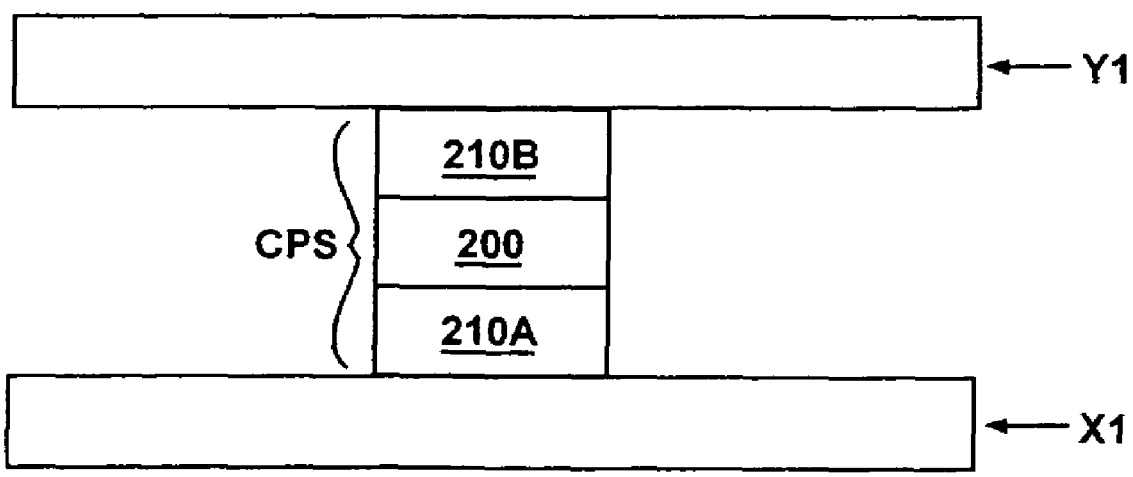
FIG. 4B shows an embodiment of a programmable connection of the present invention comprising a phase-change material and electrodes.

FIG. 4B shows a simplified diagram of another embodiment of a programmable connection CPS comprising a phase-change material 200 electrically coupled between an X line and a Y line. In this embodiment, the programmable connection further includes a first electrode (or contact layer) 210A and a second electrode (or contact layer) 210B. Here, the phase-change material is coupled to the X line through electrode 210A and to the Y line though the electrode 210B. Electrode 210A may be referred to as a bottom electrode while electrode 210B may be referred to as a top electrode. In FIG. 4B, each of the electrodes 210A and 210B is shown as a single layer. However, each electrode may be formed as a plurality of layers. Also, each layer may have multiple sub-layers. In addition, while two electrodes 210A and 210B are shown, it is possible that only a single electrode (either 210A or 210B) be used. In the embodiments shown in. FIGS. 4A and 4B, the programmable connection CPS is electrically coupled to both the X conductive line and the Y conductive line. Also, the phase-change material 200 is in the current pathway (also referred to as the conduction pathway) between the X and Y lines.

Generally, the electrodes may be formed of any conductive material. Examples of conductive materials which may be used include, but are not limited to, n-type doped polysilicon, p-type doped polysilicon, p-type doped silicon carbon alloys and/or compounds, titanium, titanium-tungsten, tungsten, tungsten silicide, molybdenum, titanium nitride, titanium carbon-nitride, titanium aluminum-nitride, titanium silicon-nitride, carbon, silicon carbide, and tantalum nitride. Combinations of materials may also be used.

The thickness of the electrodes is not limited to any particular value. As an example, the electrodes may be a thin film material having a thickness ranging from about 20 angstroms (Angstroms) to about 2000 Angstroms. In one embodiment, the thickness of the electrodes may range from about 100 Angstroms to about 1000 Angstroms. In another embodiment, the thickness of the electrodes may be about 300 Angstroms to about 600 Angstroms.

In the embodiment shown in FIGS. 4A, B, the conductive lines X and Y may cross each other (in the embodiment shown, Y crosses over X). Line Y is may be oriented in a first direction while line X may be oriented in a second direction which is different from the first direction. Line Y and line X may be substantially perpendicular to each other.

In another embodiment of the invention, the programmable connection may include one or more breakdown layers coupled in series with a layer of phase-change material. The series combination of phase-change material and one or more breakdown layers is coupled between an X line and a Y line. The breakdown layer may be a layer of a dielectric material. The breakdown layer is preferably electrically coupled between the phase-change material and one of the conductive lines X or Y. An additional breakdown layer may be electrically coupled between the phase-change material and the other conductive line.

Figure 4C:
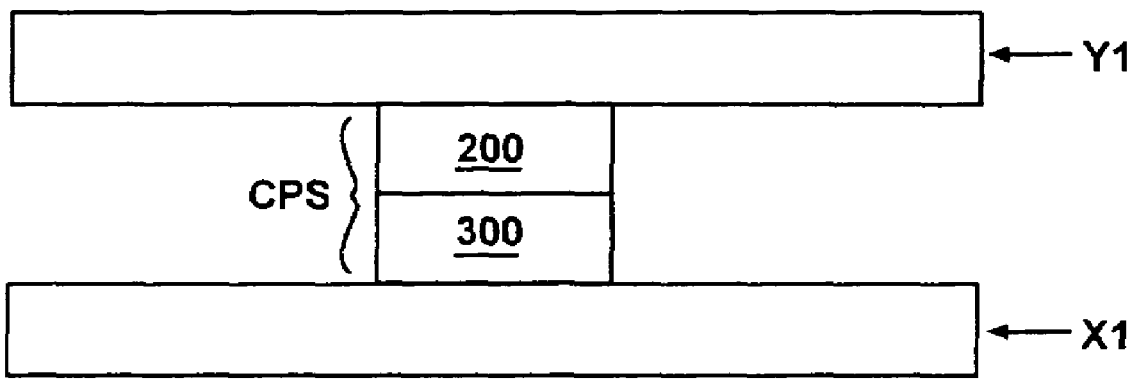
FIG. 4C shows an embodiment of a programmable connection of the present invention comprising a phase-change material in series with a breakdown layer.
Figure 4D:
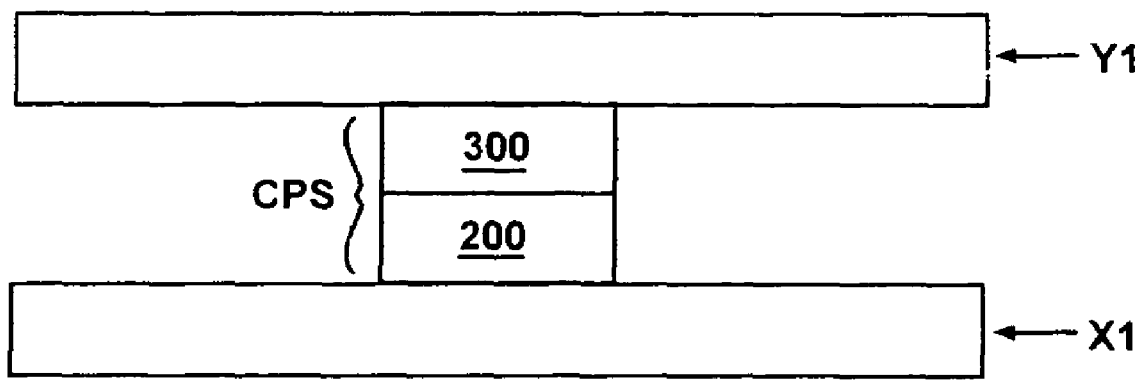
FIG. 4D shows an embodiment of a programmable connection of the present invention comprising a phase-change material in series with a breakdown layer.

In the embodiments of the invention shown in FIGS. 4C-H, the programmable connection includes a phase-change material 200 in series with a breakdown layer 300. The series combination of phase-change material and breakdown material is coupled between the X and Y line. The phase-change material and the breakdown layer are each in the current pathway (also referred to as the conduction pathway) between the X line and Y line. In the embodiments shown in FIGS. 4C-H, the programmable connection CPS is electrically coupled between the X and Y lines. In these embodiments, the programmable connection CPS is electrically coupled to both the X line Y line. In FIG. 4C, the breakdown layer is electrically coupled between the X line and the phase-change material 200. In FIG. 4D, the breakdown layer 300 is electrically coupled between the phase-change material 200 and the Y line. In the embodiments shown in FIGS. 4C-H, the programmable connection CPS is shown as being physically disposed between the X and Y lines. However, in other embodiments, this does not have to be the case.

In the embodiments shown in FIGS. 4C-H, the phase-change material and the breakdown material are coupled in series between the X line and Y line. The phase-change material and the breakdown material are each in the current pathway between the X line and Y line. Also, the series combination is in the current pathway between the X line and Y line. If the breakdown material is not broken down, the electrical resistance through the programmable connection CPS is high. If a voltage is applied across the X line and Y line, there is substantially no current flow between the X line and Y line through the programmable connection CPS regardless of the state of the phase-change material 200. This condition may be characterized as an OPEN connection between the lines at the cross-over point (with substantially no communication between the lines).

After a sufficient voltage is placed across the breakdown layer 300, the breakdown layer may break down so as to create one or more conductive pathways through the breakdown layer. With the breakdown material broken down, if the phase-change material 200 is in its high resistance state then there will be lower resistance than before breaking down the breakdown layer but still relatively high resistance and substantially little current flow between the X line and the Y line if voltage is applied across the lines. The condition for this connection will still be OPEN (and substantially no communication between the lines, but it may have increased leakage compared to the leakage before the breakdown layer is broken down (e.g. punctured or popped into a short).

After the breakdown layer is broken down, the phase-change material may be programmed from its reset state to its set state by application of a current approaching or greater than Ireset with a slow trailing edge (such as greater than 1 usec). With the phase-change material in its low resistance state, then the connection will be a CLOSED connection. There will be current flow between the X line and Y line (through the programmable connection) when a voltage is applied.

FIGS. 4E-H show programmable connections CPS that include a phase-change material 200, a breakdown material 300 as well as electrodes 210A,B. While two electrodes are shown in FIGS. 4E-H, it is possible that only a single electrode be used. In addition, it is possible that an electrode be placed between the memory material 200 and the breakdown material 300. This electrode may be used alone or in combination with electrode 210A and/or 210B. The electrodes may be formed as one or more layers of conductive material.

Figure 4E:
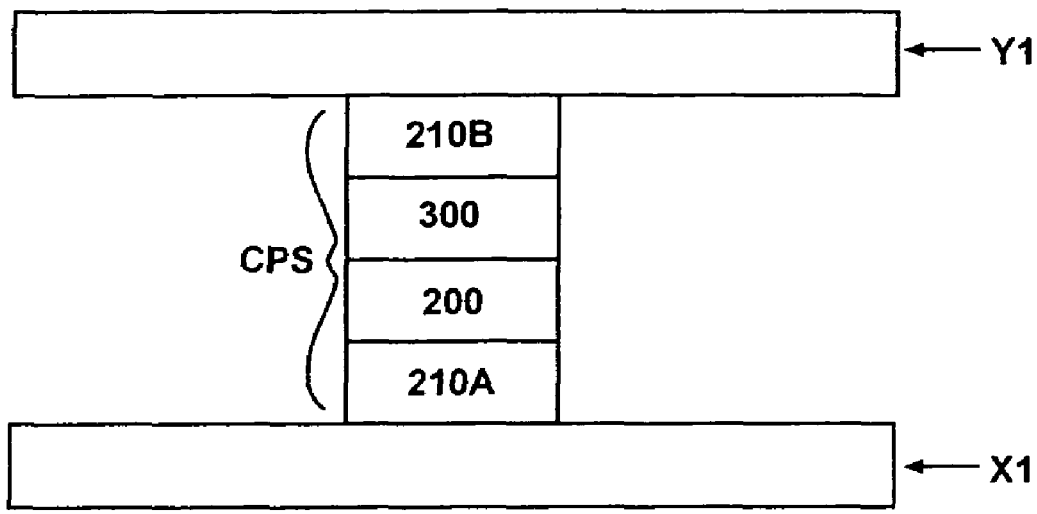
FIG. 4E shows an embodiment of a programmable connection of the present invention comprising a phase-change material, a breakdown layer and electrodes.
Figure 4F:
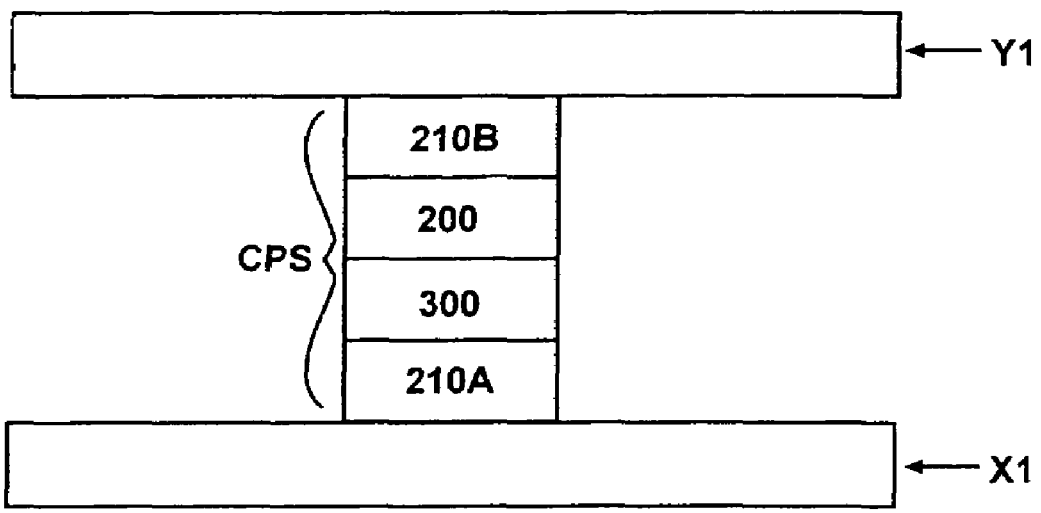
FIG. 4F shows an embodiment of a programmable connection of the present invention comprising a phase-change material, a breakdown layer and electrodes.
Figure 4G:
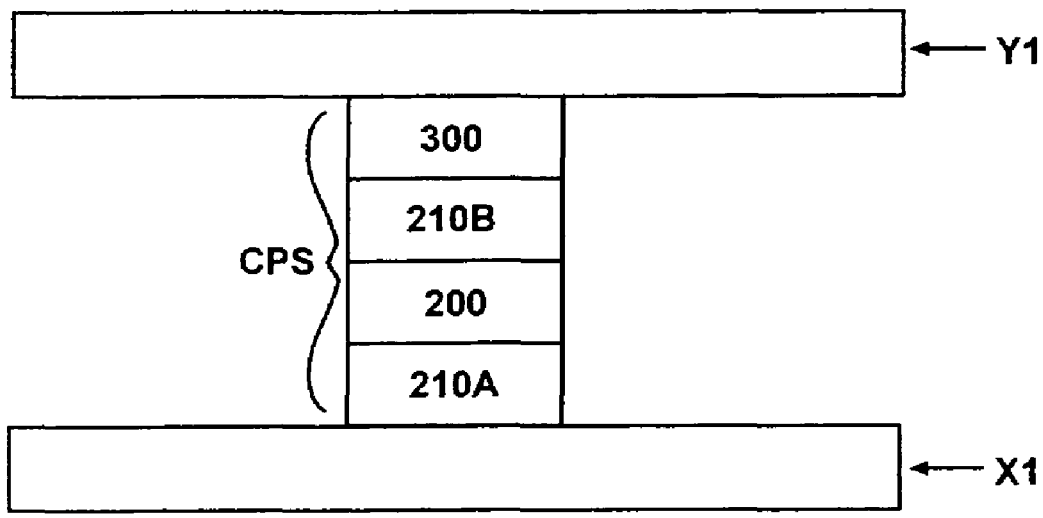
FIG. 4G shows an embodiment of a programmable connection of the present invention comprising a phase-change material, a breakdown layer and electrodes.
Figure 4H:
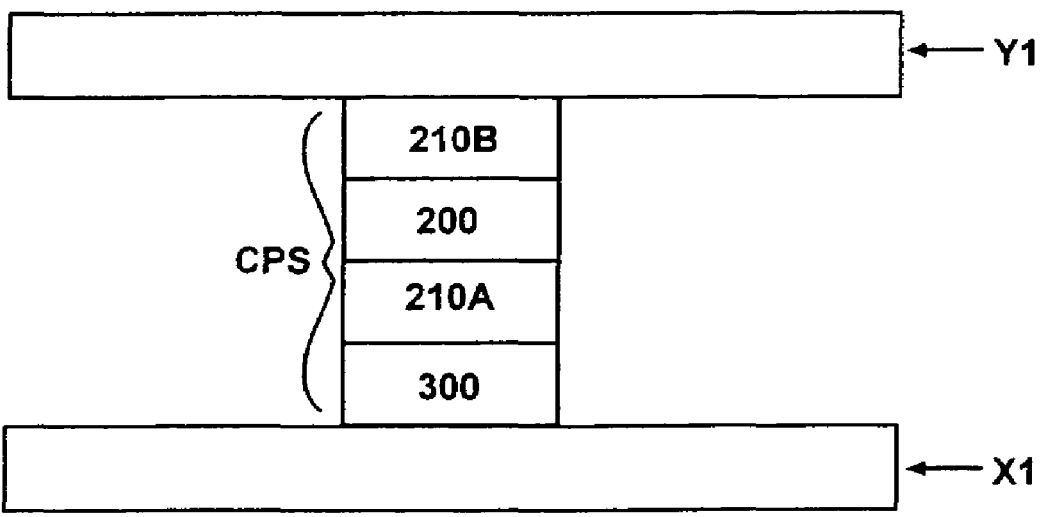
FIG. 4H shows an embodiment of a programmable connection of the present invention comprising a phase-change material, a breakdown layer and electrodes.

In the embodiment shown in FIG. 4E, the breakdown layer 300 is coupled between the top electrode 210B and the memory material 200. In FIG. 4F, the breakdown layer 300 is coupled between the bottom electrode and the memory material 200. In FIG. 4G, the breakdown layer 300 is coupled between the Y line and top electrode 210B. In FIG. 4H, the breakdown layer 300 is coupled between the bottom electrode 210A and the X line. It is possible that in each of the cases shown an additional breakdown layer be included in series with the phase-change material, such as on an opposite side of the phase-change material. This additional breakdown layer may provide further insulation until the layers are broken down, and help assure the programmable connection CPS remains OPEN despite defects.

The breakdown layer may be any dielectric or insulative material known in the art. For example, the dielectric material may comprise any oxide, nitride, oxynitride or combination thereof. The dielectric material may be oxide of aluminum or an oxide of silicon. The dielectric may be a nitride of aluminum or a nitride of silicon. Examples include silicon nitride, $SiO_2$, $Si_3O_4$ and $Al_2O_3$. In one embodiment, the breakdown layer may be formed of a material comprising the elements silicon, nitrogen and hydrogen. In another embodiment, the breakdown layer may be formed of a material comprising, in atomic, percent, between about 30-40% silicon, 40-50% nitrogen and up to 30% hydrogen. The breakdown layer may comprise an amorphous silicon material.

The thickness of the breakdown layer is not limited to any particular thickness. In one embodiment, the breakdown layer has a thickness which is preferably less than 200 Angstroms, more preferably less than 100 Angstroms, and most preferably less than 60 Angstroms. In another embodiment, the breakdown layer has a thickness which is preferably between about 10 Angstroms and about 200 Angstroms, more preferably between about 20 Angstroms and about 100 Angstroms and most preferably between about 40 Angstroms and about 60 Angstroms. In one embodiment, the breakdown layer may have a thickness of about 50 Angstroms. The thickness used may vary depending upon the selection of operating power supply range.

The material used for the breakdown layer as well as the thickness of the breakdown layer may be chosen so that the breakdown voltage across the breakdown layer is about 6 volts or less. The breakdown voltage chosen may depend on the operating power supply as well as the programming voltage used. The material for the breakdown layer as well as the thickness of the breakdown layer may be chosen so that the breakdown layer has a resistance of about 20,000 ohms or less after the breakdown layer is broken down.

The breakdown layer may have a high melting point and a low chemical reactivity. The resistivity of the breakdown layer may be between about $10^{12}$ to about $10^{17}$ ohm-cm. Silicon nitride may be preferred for improved integrity. $Al_2O_3$, for example, in the 20-40 Angstrom range, may be preferred for its higher melting point and reduced drift in device characteristics, such as reset current. Depending on whether done in-situ or the time between depositing the layers, dilute HF dip may desirably remove a native oxide. Such thickness and material may be engineered by those reasonably skilled in the art, depending on the breakdown voltage desired. Desirable variations in this layer material and adjacent electrodes for different applications will be apparent to one reasonably skilled in the art.

In the examples of shown in FIGS. 4A-H, the phase change material may be programmed by an electrical current that actually enters the phase-change material. It is conceivable that in an alternate embodiment of the invention, a programmable connection comprising a phase-change material may be structured so a programming current is used to heat the phase-change material through resistive joule heating in the electrodes without substantial joule heating within the phase-change material. In this embodiment, the phase-change material would still be coupled between the X and Y lines and the phase-change material would still be in the current pathway between the X and Y lines so as to be programmed to provide an OPEN and CLOSED programmable connection. Examples of possible devices that may be used are provided in U.S. Pat. No. 6,448,576 which is hereby incorporated by reference herein, U.S. Pat. No. 6,692,994 which is hereby incorporated by reference herein and in U.S. patent application Ser. No. 10/655,975 which is hereby incorporated by reference herein.

In another embodiment of the invention, a transistor may be added in parallel with the phase-change material or the breakdown layer. When turned on, the transistor effectively provides a short circuit across either the phase-change material or the breakdown layer so when a voltage applied across the series combination, said voltage is applied across that layer which is not shorted. Thus, when puncturing the breakdown layer, a transistor across the memory material may be turned on so that a voltage and current are primarily applied to the breakdown layer instead of the phase-change material.

In the embodiments shown in FIGS. 4A-H, the X line is electrically coupled to the Y line through the programmable connection CPS. In the embodiments shown in FIGS. 4A-H, the programmable connection CPS programmably couples the X line to the Y line. The programmable connection CPS that includes a phase-change memory material may be programmed to modify its electrical resistance and thus change the connective state between the X and Y lines (for example, connective state may be programmed between an OPEN connection where the phase-change material is in its higher resistance state and a CLOSED connection where the phase-change material is in its lower resistance state).

Referring to the examples of the programmable connections shown in FIGS. 4A-H it is seen that there is no select device (also referred to as an access device or an isolation device) in series with the phase-change material 200 between the corresponding X line (shown as X1) and corresponding Y line (shown as Y1). In the embodiments of FIGS. 4A-H, there is no select device electrically coupled between the phase-change material 200 and either one (or both) of the corresponding X and Y lines (whether or not additional layers 210A, 210B or 300 are used).

Diodes, transistors (such a MOS transistors and bipolar transistors) and threshold switches (such as a chalcogenide threshold switch) are examples of select devices. Diodes, transistors and threshold switches are examples of select devices that may be repeatedly switched back and forth between relatively more and relatively less conductive states. The select device may be an active device.

In certain embodiments of the present invention there are preferably no diodes in series with the phase-change material between the X and Y conductive lines. In certain embodiments of the present invention there are preferably no transistors in series with the phase-change material between the X and Y conductive lines. In certain embodiments of the present invention there are preferably no threshold switches in series with the phase-change material between the X and Y conductive lines. In certain embodiments of the present invention there are preferably no select devices in series with the phase-change material. In certain embodiments of the present invention, there are preferably no active devices in series with the phase-change material between the X and Y conductive lines.

Select devices may be added elsewhere on the line to effect selection of the line for programming of the programmable connection at the intersection of another selected line. Additional discussion of select devices is provided in U.S. Pat. No. 6,795,338. U.S. Pat. No. 6,795,338 is hereby incorporated by reference herein.

Figure 3B:
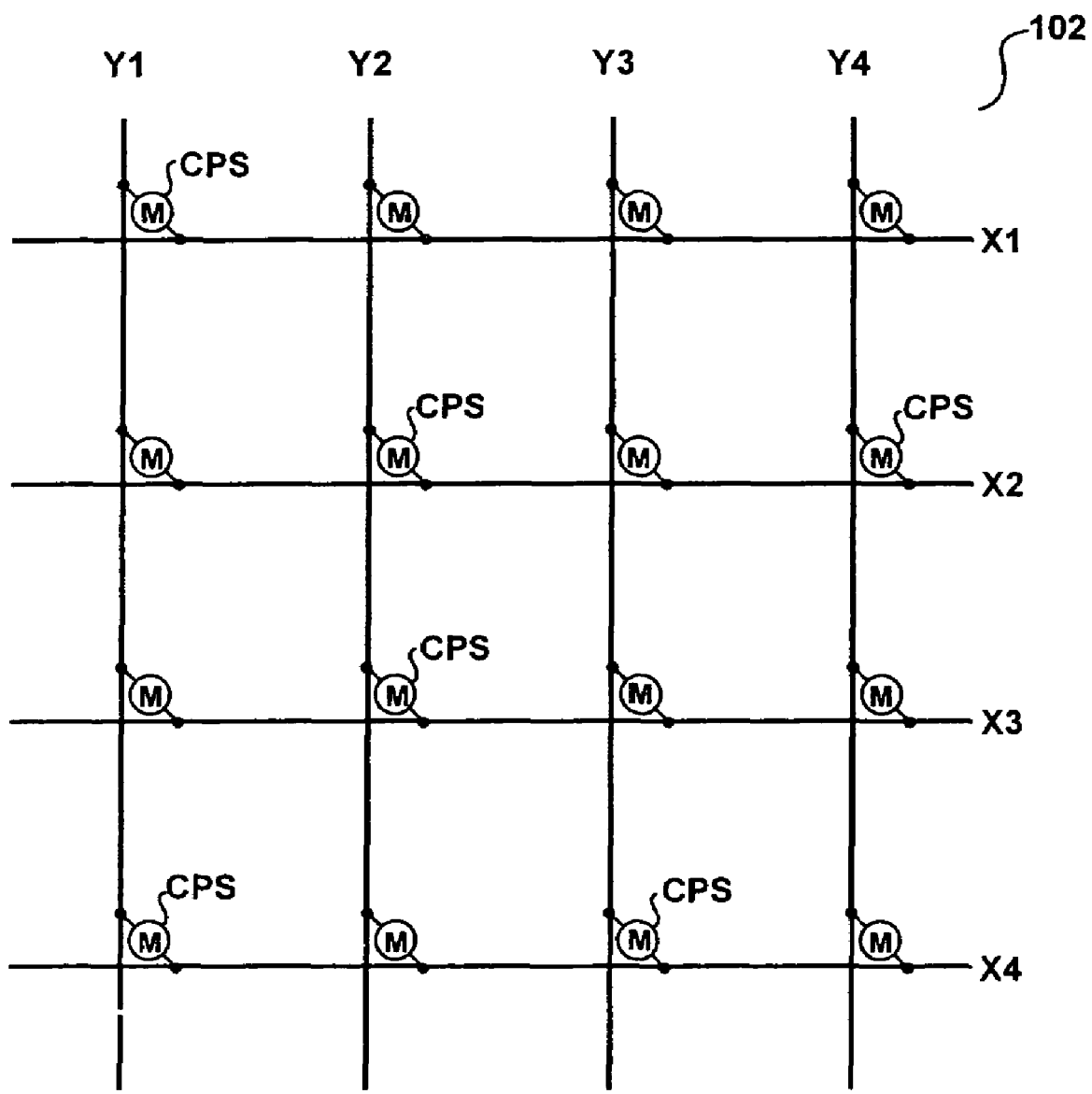
FIG. 3B is an embodiment of a programmable matrix array where each programmable connection is a memory element coupled between an X line and a Y line.
Figure 5A:
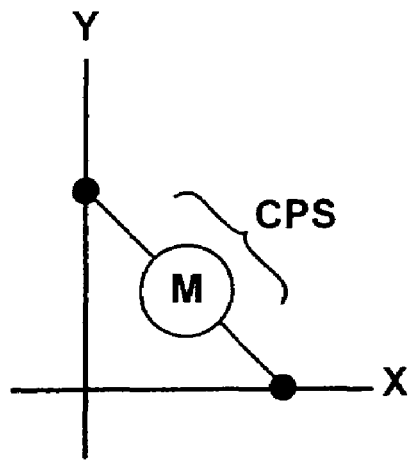
FIG. 5A shows an embodiment of a programmable connection of the present invention comprising a phase-change memory element.
Figure 5B:
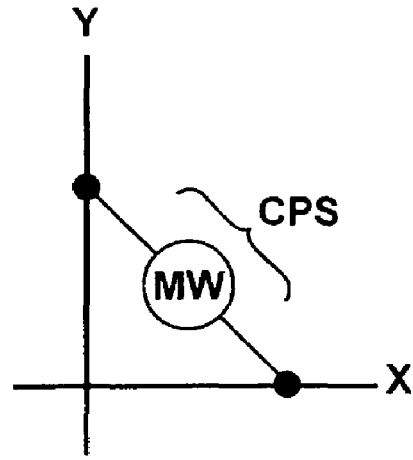
FIG. 5B shows an embodiment of a programmable connection of the present invention comprising a phase-change memory element that does not include a breakdown layer.
Figure 5C:
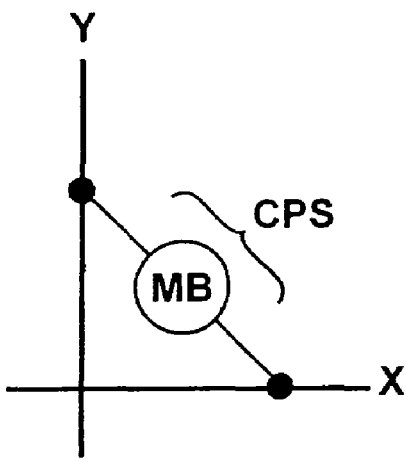
FIG. 5C shows an embodiment of a programmable connection of the present invention comprising a phase-change memory element that includes a breakdown layer.
Figure 5D:
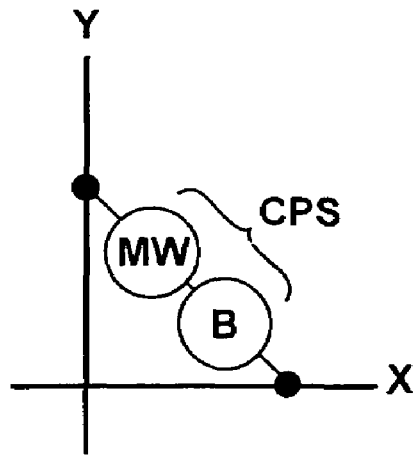
FIG. 5D shows an embodiment of a programmable connection of the present invention comprising a phase-change memory element in series with a breakdown device where the memory element does not include a breakdown layer.

In an embodiment of the invention, a programmable connection may comprise a phase-change memory element. At least one programmable connection may comprise a phase-change memory element. The phase-change memory element comprises a phase-change material. FIG. 5A shows an embodiment of a programmable connection CPS of the present invention that includes a memory element M electrically coupled between an X line and a Y line. The memory element M may or may not include a breakdown layer in series with the phase-change material. FIG. 5B shows a programmable connection CPS comprising a phase-change memory element MW that does not include a breakdown layer. FIG. 5C shows a programmable connection CPS comprising a phase-change memory element MB that includes a breakdown layer. FIG. 5D shows a programmable connection CPS comprising a phase-change memory element MW in series with a breakdown device B (such as an anti-fuse). In the embodiments shown in FIGS. 5A through 5D, it is seen that there are no diodes and/or transistors and/or threshold switches and/or select devices and/or active devices in series with the phase-change memory element between the X line and Y line. It is possible that in other embodiments of the invention, that such select devices be added in series with the memory element. FIG. 3B shows a four by four array 102 of programmable connections where each programmable connection comprises a memory element M.

The embodiments shown in FIGS. 4A-H provide examples of a programmable connection comprising a memory element where the memory element includes a phase-change material. In FIG. 4B, for example, the memory element comprises phase-change material 200, top electrode 210B and bottom electrode 210A. In FIG. 4F, for example, the memory element comprises phase-change material 200, breakdown material 300 as well as top electrode 210B and bottom electrode 210A.

Figure 6A:
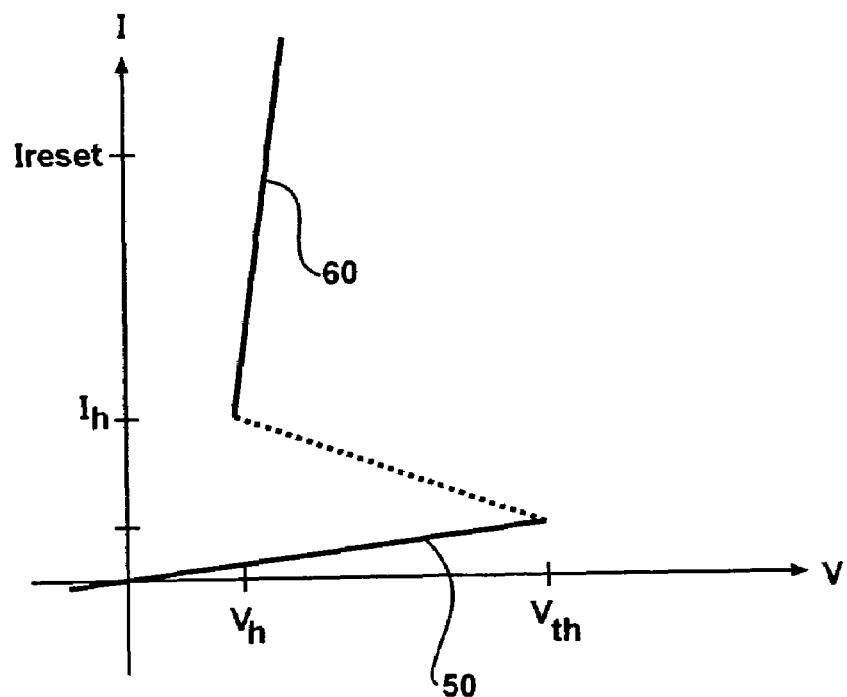
FIG. 6A is a current-voltage curve for a chalcogenide phase-change memory element in the reset state where the memory element does include a breakdown layer.
Figure 6B:
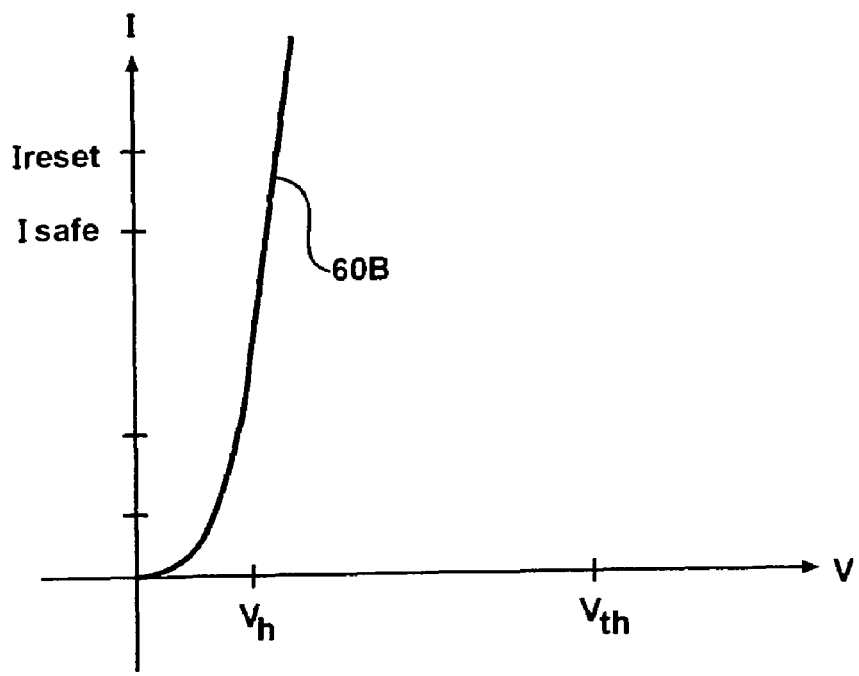
FIG. 6B is a current-voltage curve for a chalcogenide phase-change memory element in the set state where the memory element does not include a breakdown layer.

FIGS. 6A and 6B describe the current-voltage (I-V) characteristics of a phase-change memory element formed without a breakdown layer (such as an MW device) or formed with a breakdown layer that has been broken down. The set and reset states of a memory element correspond to set and reset states of the phase-change material within the memory element.

FIG. 6A shows a current-voltage (I-V) graph of a device corresponding to the high resistance or reset state of the phase-change material. The graph includes a first branch 50 and a second branch 60. The first branch 50 corresponds to a higher resistance branch in which the current passing through the device increases only slightly with increasing voltage across the device. The second branch 60 corresponds to a dynamic lower resistance branch in which the current passing through the device increases significantly with increasing voltage.

It is noted that the threshold voltage of a memory element in its reset state may be written as Vth(M) Likewise, the holding voltage of the memory element may be written as Vh(M) and the holding current of the memory element may be written as Ih(M).

When conditions are such that the current through the device and the voltage across the device is described by a point on the first branch 50, the device is in its high resistance or reset state. With no voltage across the device, the device remains in its high resistance state. When the voltage across the device reaches or exceeds the threshold voltage Vth(M), the device switches from the first branch 50 to the second branch 60. On the second branch 60, the device becomes highly conductive. For the device, if a sufficient amount of energy is applied, the device will program from its high resistance or reset state to its low resistance or set state. However, if the current is brought down below the holding current Ih(M) before the device is programmed to another state then the device may return to the first branch 50 where it remains in the reset state (it is possible that repetitions of triggering phase change memory like this may gradually result in a decline in the resistance and threshold voltage Vth(M) of the reset state). The device remains on the first branch 50 until another voltage having an amplitude greater than or equal to the threshold voltage Vth(M) is applied. Excessive temperatures may lower the resistance and threshold voltage Vth(M) over time.

As an example, for an electronic circuit normally operating at a Vcc of 3V, the threshold voltage Vth(M) of the memory element may be chosen to be around 4 volts while the values of the holding voltage Vh(M) may be around 0.5 volts. In addition, the value of resistance of the first branch 50 may be around 200,000 ohms (corresponding the resistance of the high resistance state) while the value of dV/dI on the second branch 60 may be about 1000 ohms to about 10,000 ohms (corresponding to the resistance of the lower dynamic resistance state). These values may depend, for example, on the size of the contact to the phase-change material as well as the composition of the phase-change material. The I-V characteristic of the second branch 60 may be expressed analytically as Vh(M)+dV/dI×current through the device. The holding voltage Vh(M) may be found by the imaginary straight line extension of the second branch 60 to the X axis.

To prevent accidentally programming, the memory element from its high resistance state to its low resistance state, the voltage across the memory element is preferably limited to less than Vth(M) at times other than when the element is being programmed. The threshold voltage Vth(M) is dependent upon the thickness of the layer of phase-change material, hence the thickness may be adjusted so Vth(M) is greater than the range of the operating power supply voltage Vcc (so that Vcc<Vth(M)). As an example, for an operating power supply voltage Vcc having a range of 2.7 to 3.3V, the threshold voltage Vth(M) of the memory device may be adjusted to about 4V or even higher. As explained below, a voltage regulator (such as a band gap regulator may be used to narrow the variance of the power supply voltage Vcc.

When the voltage across the memory element reaches or exceeds its threshold voltage Vth(M), the device switches from the first branch 50 to the second branch 60. After the device has switched to the second branch 60, if a sufficient energy is applied to the device, the device will program to its low resistance set state and operate on branch 60B of FIG. 6B. The device stays in the set state until programmed back to the reset state.

The resistance of the device in its low resistance set state may be about 10,000 ohms and may go even lower as the voltage drop across the device approaches and exceeds the holding voltage Vh(M) (where the slope dV/dI along the curve 60B decreases towards, for example, 1000 ohms).

When the device is operating in the set state care must be taken to limit the current through the device to a level well below Ireset unless it is actually desired to program the device back to the reset state. To ensure against accidental programming, the current through the device may be kept below a level Isafe. Isafe may be about 70% that of Ireset. Isafe may even be about 50% (or less) of Ireset to guard against noise and transients changing the state of the device (preferably, the transient edge rate applied to any X or Y line coupled to a programmable connection device is slow enough so that the voltage drop across the device does not cause the current through the device to exceed the specified/engineered value of Isafe—related to contact area to the chalcogenide and other factors familiar to those reasonably skilled in the art). Ireset may even be increased to improve margin by, for example, increasing the size of the contacts between the conducting layers and the phase-change material. Currents applied through a memory element in the set state that are not intended to program the memory element may be kept at levels that are less than 50% of Isafe.

Figure 6C:
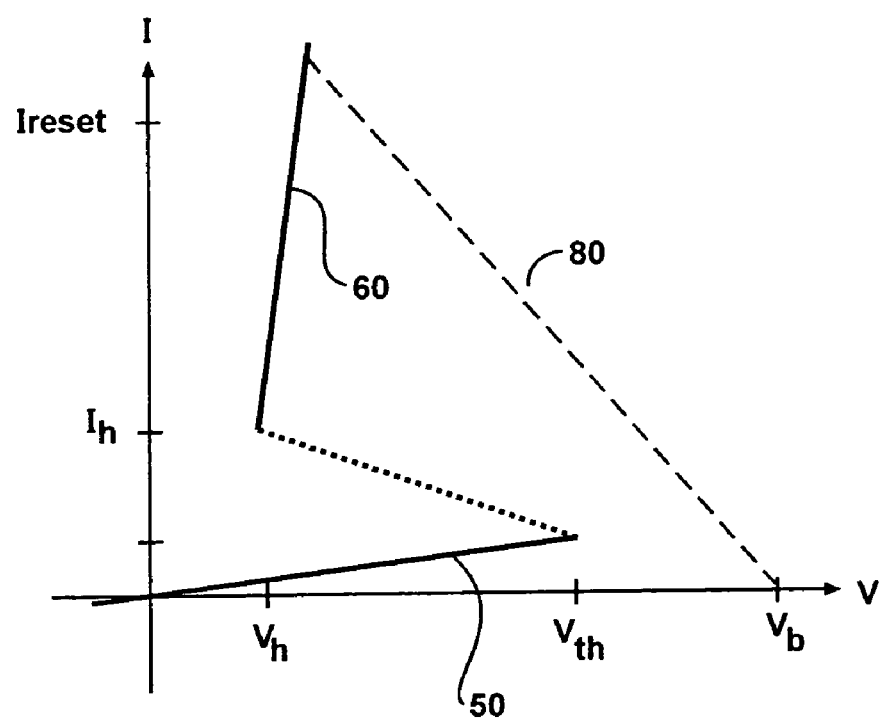
FIG. 6C is a current-voltage curve for a chalcogenide phase-change memory element having a breakdown layer where the resistance state of the memory element is programmed to the reset state after puncturing the breakdown layer.

FIGS. 6C,D show current-voltage I-V curves for a phase-change memory element that includes a breakdown layer (such as an MB device) that has not been broken down. The dashed line 80 represents that a device initially formed with a breakdown layer may be transformed into a device where the breakdown layer is broken down.

If the phase-change material is processed with a thin breakdown layer between the material and a conductor, the device has very high resistance to current flow as voltage is applied since the breakdown layer is preferably insulating. Hence, before the breakdown layer is broken down, the device provides an OPEN connection between an X line and Y line. The resistance of the device is high as increasing voltage is applied until the breakdown voltage Vb of the breakdown layer is exceeded. Vb is a voltage that may be about the same as Vth(M), or greater than Vth(M) to avoid loss of margin if the phase-change memory element comes out of the factory in a relatively low resistance condition.

After the breakdown layer is broken down and rendered conductive, the device acts like a device without a breakdown layer and returns to the dV/dI portion of the set or reset I-V curve. (The device may be set due to slow cooling after fabrication at temperatures above that necessary to set the memory element). The state after stopping the breakdown current depends on the state programmed while on the dV/dI, if Ireset was exceeded during the breakdown operation (otherwise device state may be determined by the heat and cooling rate during wafer processing). For example, after a breakdown operation with a high current of 2 ma, if the current is reduced with a trailing edge rate after breakdown that is slower than the edge rate that crystallizes, for example slower than 200 nsec for GST 225, the device will be set after the current is terminated. A peak current that is above Ireset may be terminated using a fast trailing edge, such as by using a 10 nsec edge rate after breakdown, and the device will instead be reset and still be in a relatively OPEN condition. Thereafter, unless the insulating layers were to regrow, the device will operate like a device without a breakdown layer.

Figure 6D:
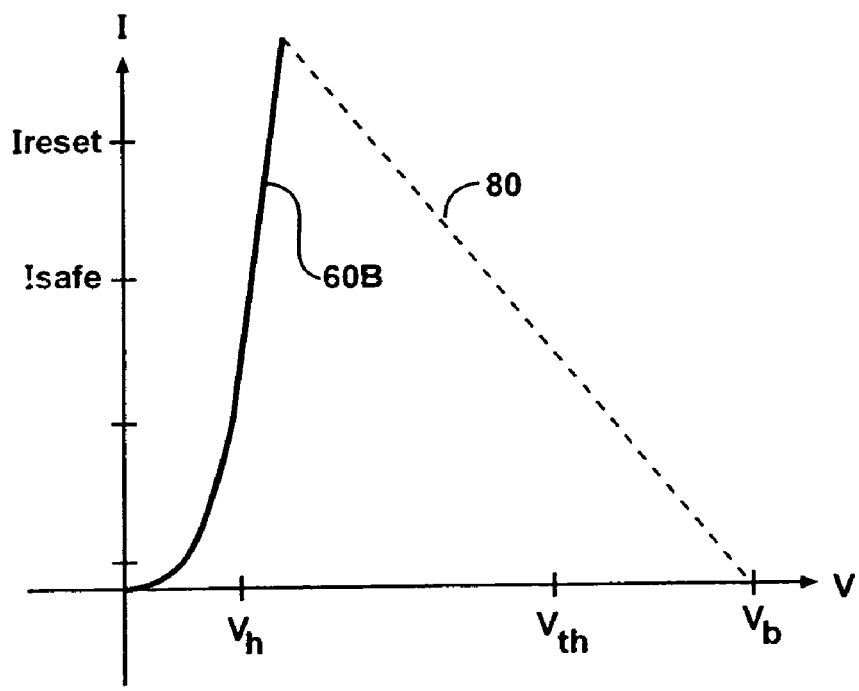
FIG. 6D is a current-voltage curve for a chalcogenide phase-change memory element having a breakdown layer where the resistance state of the memory element is programmed to the set state after puncturing the breakdown layer.

The solid line 60B in FIG. 6D is an I-V curve for a programmable connection after the breakdown layer has broken down and the device is programmed to its low resistance or set state (such as by coming out of the fab crystallized or by use of a lower current or slow trailing edge during programming the selected cross point). After breakdown (as represented by dashed line 80), the behavior of the device is like that of a device without a breakdown layer and may be programmed to its reset state with a current pulse greater than Ireset having fast trailing edge.

Figure 7:
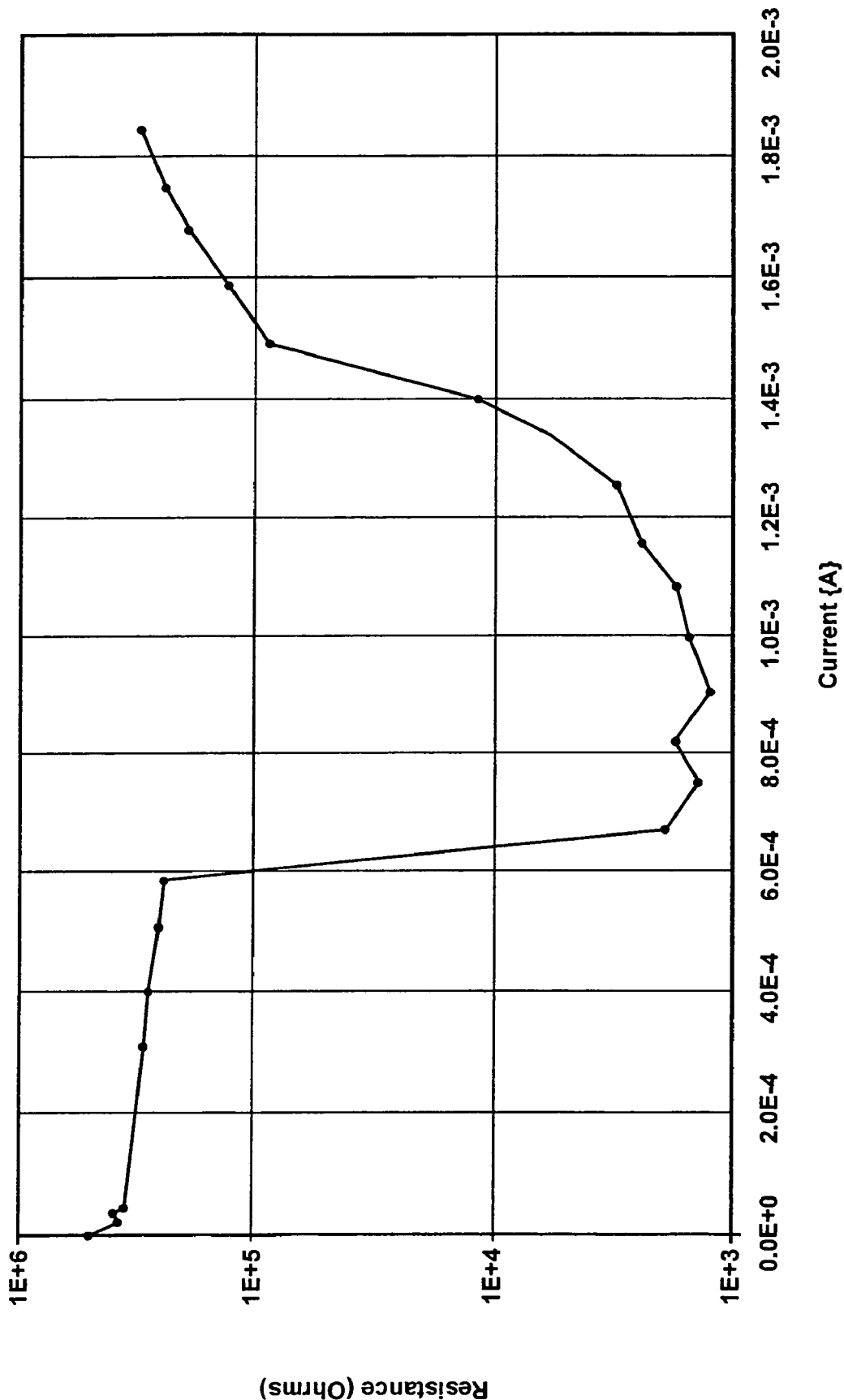
FIG. 7 is a current-resistance curve for a chalcogenide phase-change memory element that has either been formed without a breakdown layer or has been formed with a breakdown layer that has been broken down.

FIG. 7 provides an example of a current-resistance I-R curve of a chalcogenide phase-change memory element showing the resistance of the material as a function of the amplitude of a current pulse applied through the material. The current pulses applied at each point on the curve may have a pulse width of about 250 nsec with a rising edge and a trailing edge each having a time of less than 10 nsec. The left side of the curve shows that the device remains in its high resistance reset state until sufficient energy is applied to the device wherein it is programmed to its low resistance set state. The device may be programmed back and forth between its set and reset states to provide a binary mode of operation. Referring to the right side of the curve, it is seen that the device may be repeatedly programmed among two or more resistance levels. The right side of the curve shows that the device may have two or more resistance states where each state may correspond to an intermediate state with resistances between the set and reset states of the element. Hence, a device may be programmed between two resistance states where one is a higher resistance value (not necessarily the reset state) and one is a lower resistance value (not necessarily to set state). The higher resistance state may correspond to an OPEN connection while the lower resistance state may correspond to a CLOSED connection. Intermediate states may be used, for example, to control the slew rate of the voltage on the receiver lines of an X-Y matrix.

For a programmable connection including a phase-change memory element (without any additional select device such as shown in FIG. 5A-E), the state of the programmable connection may correspond to the state of the memory element. For example, a memory element programmed to its reset state corresponds to an OPEN connection (wherein data is not transmitted) while a memory element programmed to its set state corresponds to a CLOSED connection (wherein data is transmitted).

When the programmable connection is OPEN (reset state of memory element) a data signal applied to the corresponding driver line (for example, the output of a logic gate coupled to the driver line) should preferably not be allowed to transmit from the driver line to the corresponding receiver line. Hence, a desired operating condition may be that the voltage of the data signal, Vsignal, minus the voltage on the receiver line, V(receiver), may be less that the threshold voltage Vth(M) of the corresponding memory element. Hence, a condition may be $|Vsignal-V(receiver\ line)|<|Vth(M)|$ where |number| represents the absolute value or magnitude of "number". The voltage Vsignal of the data signal may be equal to the power supply voltage Vcc and the voltage on the receiver line may be 0 volts or ground potential so that a possible operating condition may be $|Vcc|<|Vth(M)|$. As an example, if Vcc is about 3 volts, then the threshold voltage Vth(M) of the memory element may be chosen to be about 4 volts.

When the programmable connection is CLOSED (set state of the memory element) a data signal applied to the corresponding driver should preferably be allowed to transmit to the receiver line. Since, the threshold voltage of the memory element in the set state may be effectively about 0 volts, all signals applied to the driver line may transmit to the receiver line through the programmable connection when the memory element is in the set state. With the programmable connection in the CLOSED state, the voltage on the receiver line may be driven by the voltage on the driver line.

For a programmable connection including a phase-change memory element (without any additional select device such as shown in FIG. 5A-E), the memory element may be repeatedly programmed back and forth between its reset and set states (thereby programming the corresponding programmable connection back and forth between its OPEN and CLOSED states, respectively). In one embodiment, the programming voltage Vp used to program the memory element may be chosen to be greater than the threshold voltage Vth (M). That is, Vp>Vth(M) or, in terms of magnitudes |Vp|>|Vth(M)|. This condition may assure that, when programming the memory element, the threshold voltage of the memory element is exceeded regardless of the state of the memory element.

As noted above, the condition Vth(M)>Vcc (expressed above as Vcc<Vth(M)) is a possible operating condition. If this is the case, then the programming voltage Vp is preferably chosen to be greater than the power supply voltage Vcc (that is, Vp>Vcc). For this to occur, a charge pump may be needed to provide a programming voltage Vp greater than the power supply voltage Vcc. The use of a charge pump is discussed in more detail below.

As noted, the phase-change memory element (and the corresponding memory material) may be programmed back and forth between its set and reset states with set and reset current pulse having with the same rising edge, the same amplitude (such as an amplitude greater than Ireset) and the same width, but with different trailing edges. For example, the trailing edge of the set pulse is slower (e.g. 1 usec) than the trailing edge of the reset pulse (e.g. 10 nsec). A current amplitude useful to program the memory material to its set state may be about 0.5 ma to 1 ma (which can vary with contact opening size across the die and may drift with repeated write cycles). A current amplitude to program the memory element to its reset state may be about 1.5 ma. A common amplitude may be selected to program a memory element to either set or reset states. This common amplitude may be greater than either the individual set or reset amplitudes (for example, it may be chosen to be about 3 ma). A common pulse width (for example, about 20 nsec may also be used. However, as noted, the trailing edge for the reset pulse will be much faster than the trailing edge for the set pulse. For example, 10 nsec for a reset pulse and about 1 usec for a set pulse. The trailing edge may fall slowly to at least less than half of Ireset, such as to 0.5 ma, and fast thereafter to off current. Application of this set sweep technique may be better understood by reference to U.S. Pat. No. 6,487,113 which is hereby incorporated by reference herein.

Alternately, the current pulse used to program the device to its set state may have a smaller amplitude and a greater width than that used to program the device to its high resistance state. For example, in one embodiment, the current pulse used to program the device to its low resistance state may have an amplitude between about 0.5 ma and 1 ma. The width may be about 200 nsec (nanoseconds). As an alternative embodiment, a device may be programmed to its set state by first applying a reset pulse and then applying a set pulse with a slow trailing edge (preferably greater than 200 nsec—such as 1 usec (microsecond)).

When a selected memory element is being programmed, unselected rows may be biased at ⅔ Vp (that is, ⅔ of the programming voltage. Likewise, all unselected columns may be biased at ⅓ Vp (that is, ⅓ the programming voltage). This places less voltage across the deselected cross-points during programming where the columns are arbitrarily chosen to be the more positive voltage during programming. The reverse scenario may be used where the positive voltage is applied to a selected row with most negative voltage to selected column, and then the unselected columns may be biased at ⅔ Vp and unselected rows may be biased to ⅓ Vp. This technique of biasing the unselected rows (or columns) at ⅔ Vp and the unselected columns (or rows) at ⅓ Vp is referred to herein as the "one-third, two-thirds biasing scheme". A bandgap regulator between the power input pin and logic Vcc may be used to assure that Vcc in the logic areas remains below Vth(M).

Figure 8A:
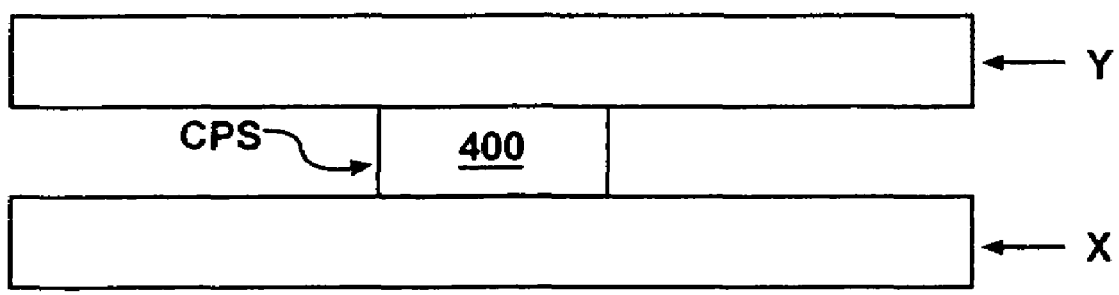
FIG. 8A is programmable connection of the present invention comprising a threshold switching material.

In an embodiment of the invention, a programmable connection may comprise a threshold switching material. At least one programmable connection may comprise a threshold switching material. In the embodiment shown in FIG. 8A, the programmable connection CPS includes a threshold switching material 400 electrically coupled between line Y and line X. In the embodiment shown in FIG. 8B the programmable connection CPS comprises a threshold switching material 400, a first (or bottom) electrode 210A and a second (or top) electrode 210B. Of course, other embodiments are possible with only a single electrode (either 210A or 210B). The threshold switching material 400 is in the current pathway between the X and Y lines.

A breakdown layer may be placed in series with the threshold switching material between the X line and Y line. FIGS. 8C and 8D show breakdown layer 300 in series with threshold switching material 400. In these cases, there are no additional electrodes. FIGS. 8E through 8H show a breakdown layer 300 in series with a threshold switching material 400 coupled between the X and Y lines. These embodiments include electrodes 210A and 210B. Of course, other embodiments are possible where only a single electrode (such as 210A or 210B is present).

Generally, any type of threshold switching material may be used. The threshold switching material may be a chalcogenide threshold switching material. A chalcogenide material comprises at least one chalcogen element. The threshold switching material may be an S-type threshold switching material.

Referring to the embodiments shown in FIGS. 8A-H, there is no phase-change memory material (or element) in series with the threshold switching material. In addition, there is no select device and/or active device in series with the threshold switching material. It is possible, however, that in other embodiments of the invention, it is possible to place a select device, such as a diode or transistor (e.g. a MOS transistor) in series with the threshold switching material.

After a sufficient voltage is placed across the breakdown layer 300, the breakdown layer may break down so as to create one or more conductive pathways through the breakdown layer. With the breakdown material broken down, if the threshold switching material 400 is in its on state until the current through the threshold switching element drops below the holding current Ih(T).

A further alternative is to add a transistor in parallel with the threshold switching material. When turned on, the transistor effectively provides a short circuit across either the threshold switching material or the breakdown layer so when a voltage applied across the series combination, said voltage is applied across that layer which is not shorted. Thus, when puncturing the breakdown layer, a transistor across the threshold switching material may be turned on so that a voltage and current are primarily applied to the breakdown layer instead of the threshold switching material.

Figure 9A:
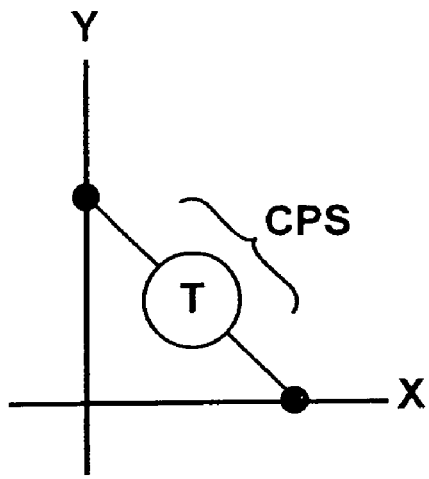
FIG. 9A is a programmable connection of the present invention comprising a threshold switching element.
Figure 9B:
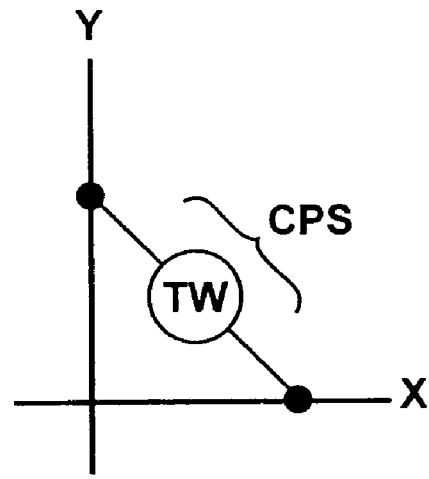
FIG. 9B is a programmable connection of the present invention comprising a threshold switching element that does not include a breakdown layer.
Figure 9C:
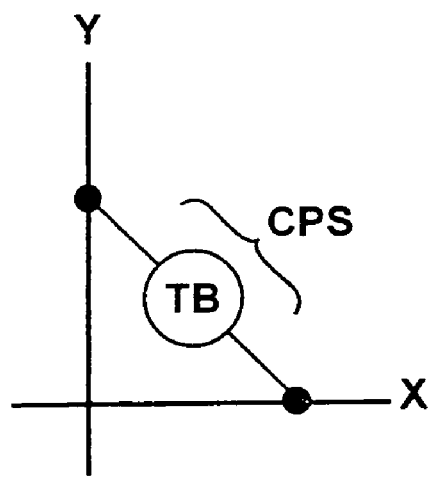
FIG. 9C is a programmable connection of the present invention comprising a threshold switching element that includes a breakdown layer.
Figure 9D:
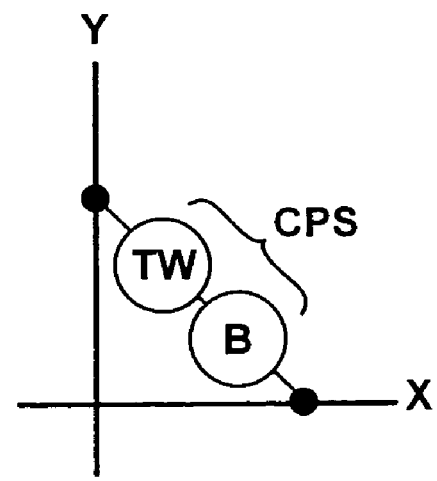
FIG. 9D is a programmable connection of the present invention comprising a threshold switching element in series with a breakdown device where the threshold switching element does not include a breakdown layer.

In an embodiment of the invention, a programmable connection may comprise a threshold switching element (also referred to as a threshold switch or switching element). At least one programmable connection may comprise a threshold switching element. The threshold switching element comprises a threshold switching material. FIG. 9A shows an embodiment of the invention with threshold switching element T electrically coupled between an X and Y line. Threshold switching element T may or may not include a breakdown layer. FIG. 9B shows an embodiment where a threshold switching element TW (without a breakdown layer) is coupled between an X and Y line. FIG. 9C shows an embodiment where a threshold switching element TB (with a breakdown layer in series with the threshold switching material) is coupled between an X and Y line. FIG. 9D shows and embodiment where a threshold switching element TW (without a breakdown layer) is coupled in series with a breakdown device B (such as an anti-fuse) that includes a breakdown layer. Hence; in FIG. 9D, the breakdown layer in the breakdown device B is in series with the threshold switching material of the threshold switching element.

Figure 9E:
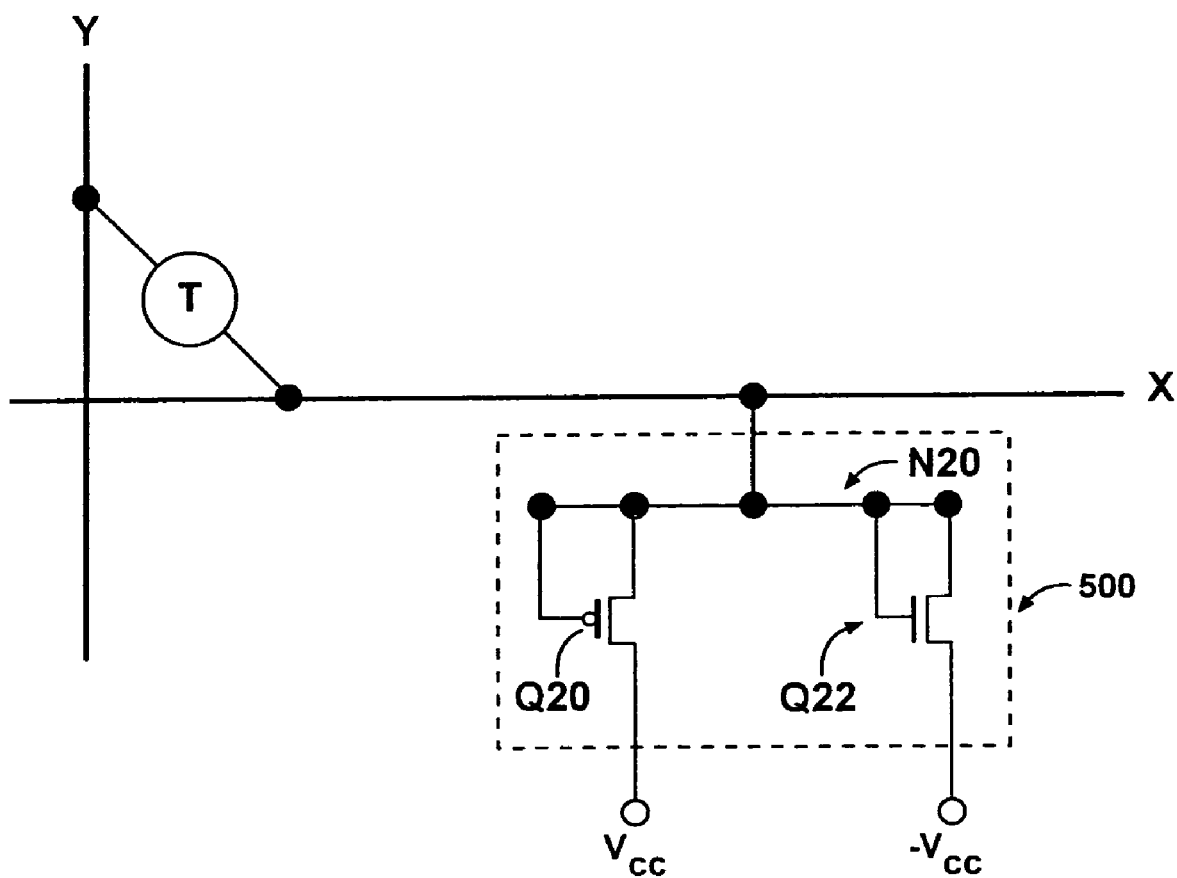
FIG. 9E is a programmable connection of the present invention comprising a threshold switching element with a bleeder circuit coupled to the X line.

FIG. 9E shows a threshold switching element T coupled between an X line and a Y line. In addition a circuit 500 is coupled to the X line to help ensure that the threshold switching element T remains on when the programmable connection is programmed CLOSED. The circuit 500, referred to as a "bleeder" circuit, includes p-channel transistor Q20 and an n-channel transistor Q22. The current through transistors Q20 and Q22 (depending on the state of the connected line) may provide the current through the threshold switching element T to better assure that a current which is greater than or equal to the holding current Ih(T) is maintained through the threshold switching element when the threshold switch T is programmed to its on state and data is being transmitted though the threshold switch. Transistor Q20 provides a current source coupled to the X line while transistor Q22 provide a current sink coupled to the X line.

Figure 3C:
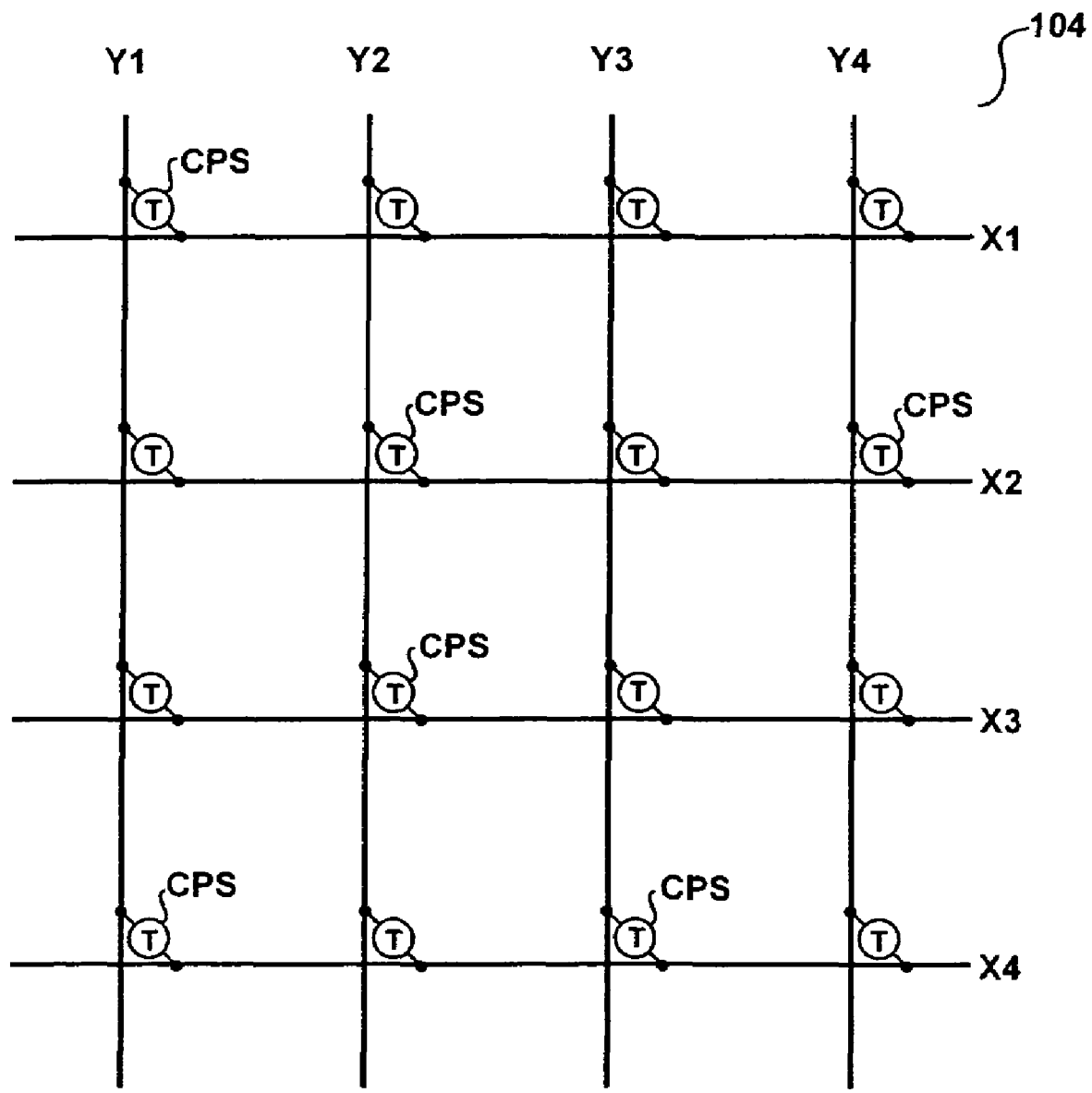
FIG. 3C is an embodiment of a programmable matrix array where each programmable connection is a threshold switch coupled between an X line and a Y line.

In the embodiments shown in FIGS. 9A-E there are no diodes or transistors in series with the threshold switching element T (either TB or TW). However, it is possible that a diode or transistor (such as a MOS transistor be placed in series with the threshold switch T. It may even be possible to place at least one additional threshold switching element in series with the threshold switching element T. FIG. 3C shows a four by four programmable matrix array 104 where each of the programmable connections is a threshold switching element T coupled between a corresponding X line and a corresponding Y line.

Figure 8B:
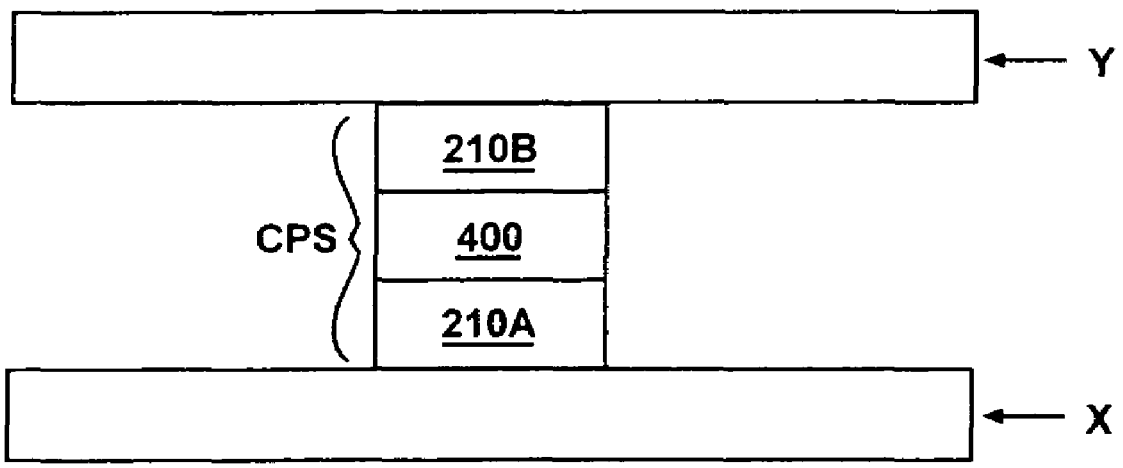
FIG. 8B is programmable connection of the present invention comprising a threshold switching material and electrodes.
Figure 8C:
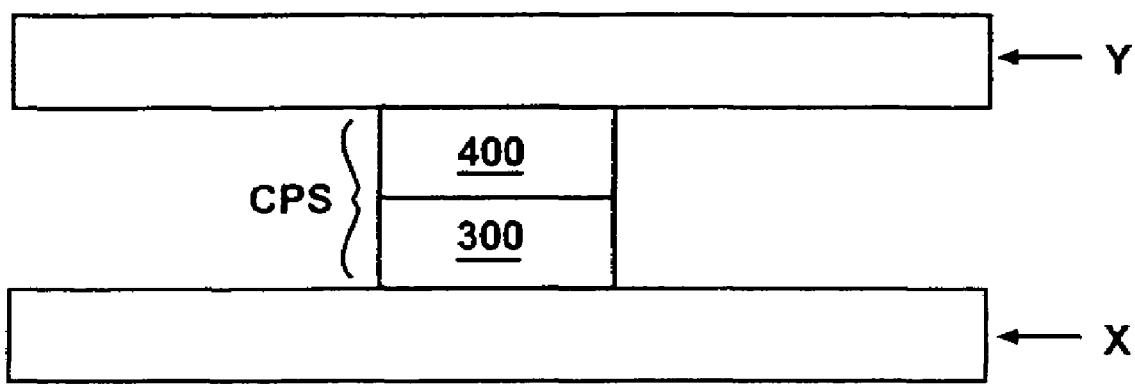
FIG. 8C is programmable connection of the present invention comprising a threshold switching material in series with a breakdown material.
Figure 8D:
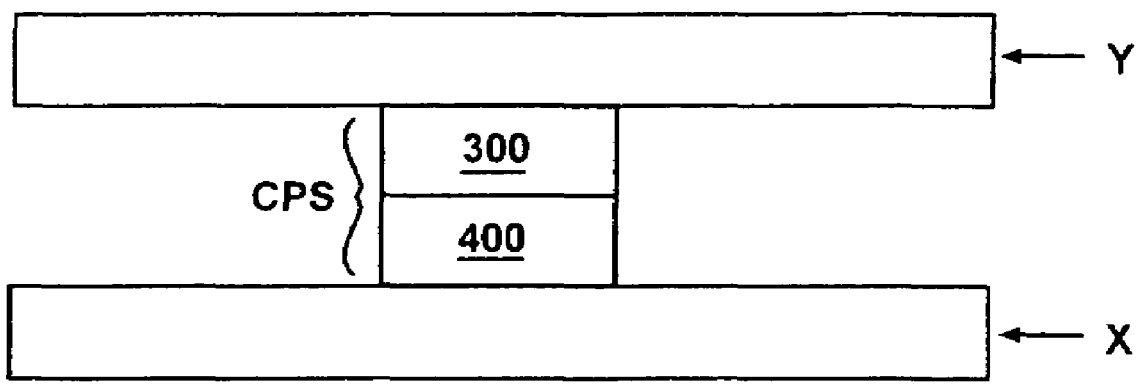
FIG. 8D is programmable connection of the present invention comprising a threshold switching material in series with a breakdown material.
Figure 8E:
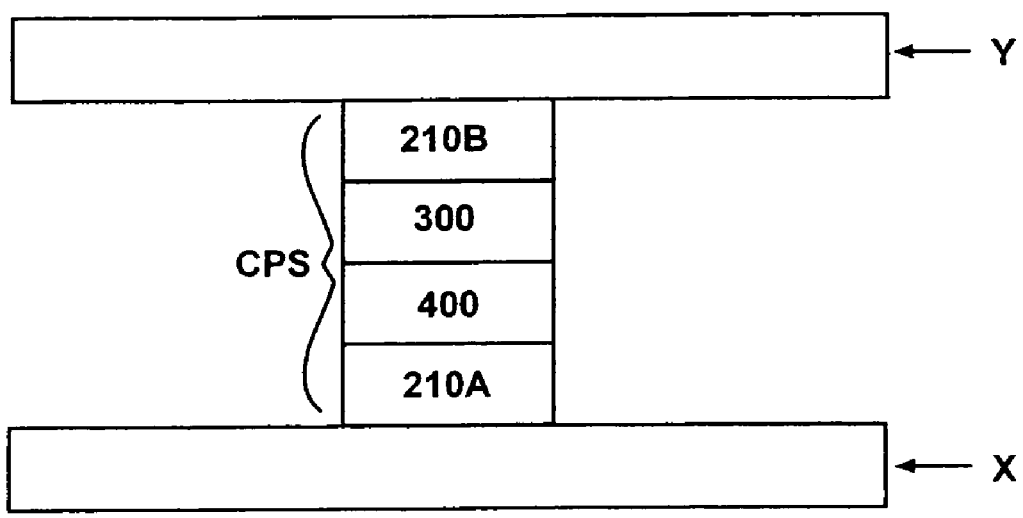
FIG. 8E is programmable connection of the present invention comprising a threshold switching material, a breakdown material and electrodes.
Figure 8F:
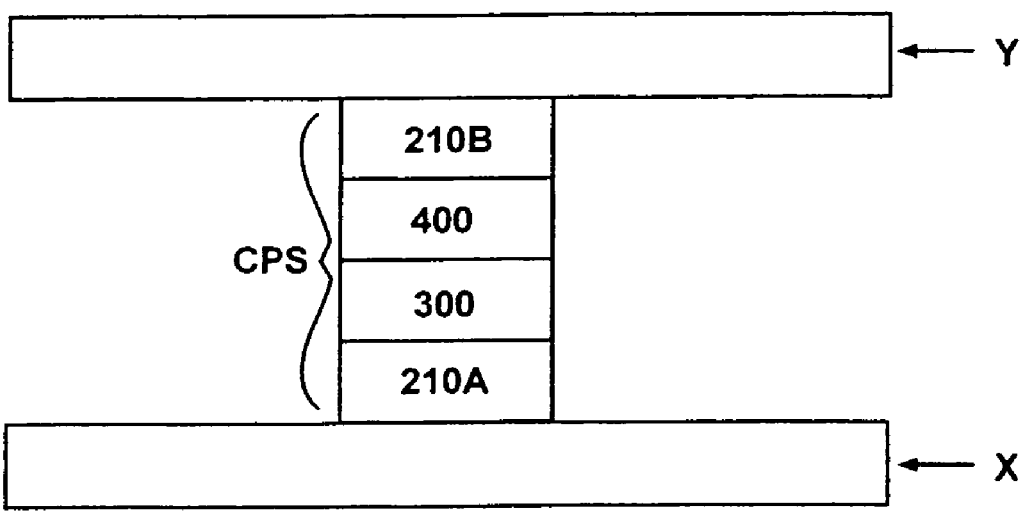
FIG. 8F is programmable connection of the present invention comprising a threshold switching material, a breakdown material and electrodes.
Figure 8G:
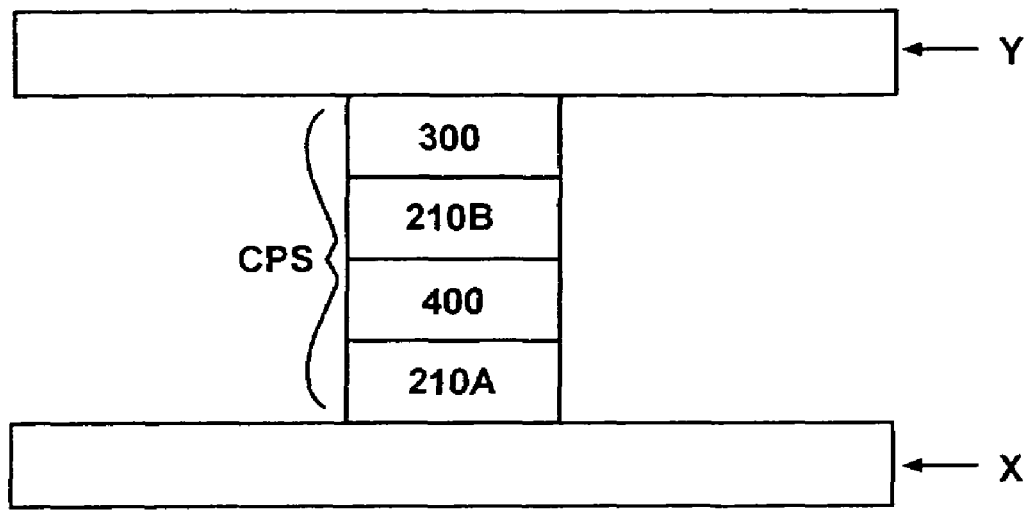
FIG. 8G is programmable connection of the present invention comprising a threshold switching material, a breakdown material and electrodes.
Figure 8H:
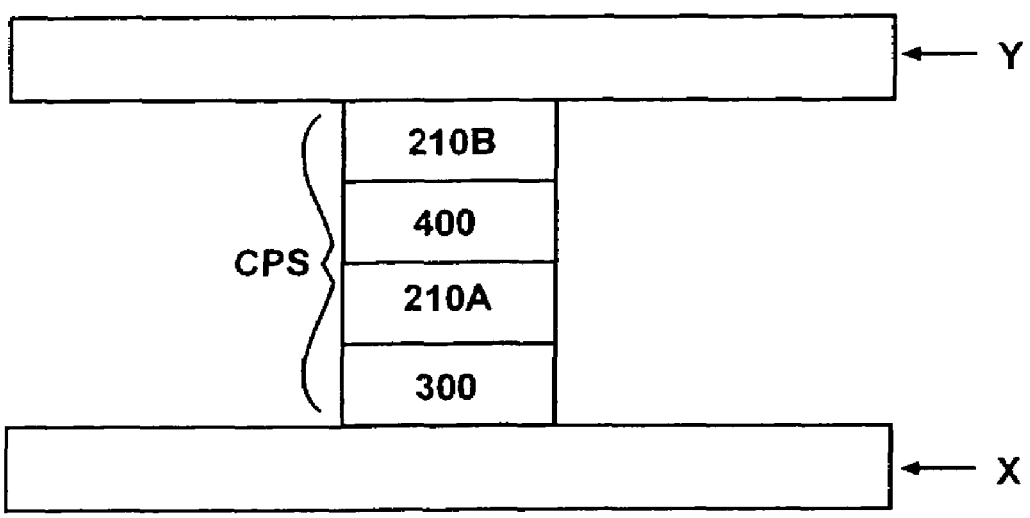
FIG. 8H is programmable connection of the present invention comprising a threshold switching material, a breakdown material and electrodes.

FIGS. 8A-H provide examples of threshold switching elements coupled between an X line and a Y line. For example, in FIG. 8B, the threshold switching element comprises threshold switching material 400, electrode 210A and electrode 210B. In FIG. 8E, the threshold switching element comprises switching material 400, breakdown material 300, electrode 210A and electrode 210B.

Figure 10A:
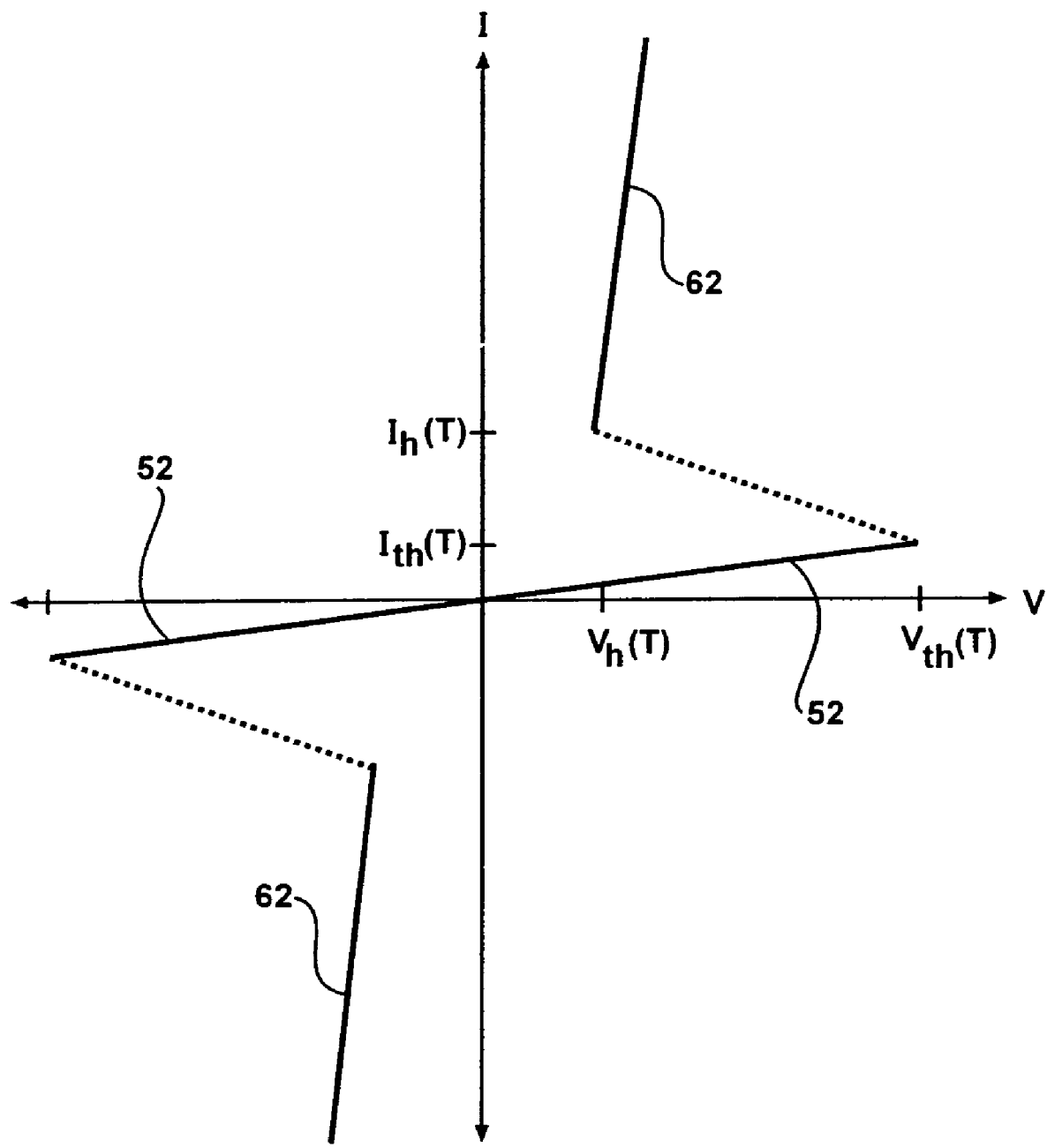
FIG. 10A is a current-voltage characteristic of a threshold switching element that does not included a breakdown layer.

An example of an I-V characteristic curve for a chalcogenide threshold switch (formed without a breakdown layer or formed with a breakdown layer that has already been broken down) is shown in FIG. 10A. FIG. 10A shows the I-V plot in both the first quadrant (where voltages and currents are positive) and the third quadrant (where voltages and currents are negative). While only the first quadrant is described below, an analogous description applies to the curve in the third quadrant of the I-V plot (where the voltage and the current are both negative). The threshold voltage of a threshold switching element may be referred to as Vth(T). The holding voltage of a threshold switching element may be referred to as Vh(T). The holding current of a threshold switching element may be referred to as Ih(T). The threshold current of a threshold switching element is shown in FIG. 10A and in FIG. 10B as Ith(T).

The I-V characteristic curve IV includes an "off-state" branch 52 and an "on-state" branch 62. The off-state branch 52 corresponds to the branch in which the current passing through the threshold switch increases slightly upon increasing the voltage applied across the threshold switch. This branch exhibits a small positive slope in the I-V plot and appears as a nearly horizontal line in the first (and third) quadrant of FIG. 10A, characteristic of high resistance. The on-state branch 460 corresponds to the branch in which the current passing through the threshold switch increases significantly more upon increasing the voltage applied across the threshold switch. The magnitude of the slope of the on-state branch is greater than the magnitude of the slope of the off-state branch. In the example shown in FIG. 10A, the on-state branch exhibits a large slope in the I-V plot and appears as a substantially vertical line in the first (and third) quadrant of FIG. 10A.

The slopes of the off-state and on-state branches shown in FIG. 10A are illustrative and not intended to be limiting. Regardless of the actual slopes, the on-state branch exhibits a steeper slope than the off-state branch. When conditions are such that the current through the threshold switch and voltage across the threshold switch is described by a point on the off-state branch 62 of the I-V curve, the threshold element is said to be in the "off" state. When conditions are such that the current through the threshold switch and voltage across the threshold switch is described by a point on the on-state branch of the I-V curve, the threshold switch is said to be in the "on" state.

The switching properties of the threshold switch can be described by reference to FIG. 10A. When no voltage is applied across the switch, the switch is in the "off" state and no current flows. This condition corresponds to the origin of the I-V plot shown in FIG. 10A (current=0, voltage=0). The threshold switch remains in the off state as the voltage across the threshold switch and the current through the threshold switch is increased, up to a voltage Vth(T) which is referred to as the threshold voltage of the threshold switch. When the voltage across the threshold switch is less than Vth(T), the slope of the off-state branch of the I-V curve is small and the current flowing through the threshold switching element increases only in a small amount as the applied voltage is increased.

When the applied voltage across the threshold switching element equals or exceeds the threshold voltage Vth(T), the threshold switching element switches from the off-state branch 52 to the on-state branch 62 of the I-V curve. The switching event occurs instantaneously and is depicted by the dashed line in FIG. 10A. Upon switching and depending upon the load impedance between the forced voltage and the chalcogenide threshold switch, the voltage across the threshold switch may decrease significantly and/or the current through the threshold switch increases and becomes much more sensitive to changes in the device voltage (hence, branch 62 is steeper than branch 52). The voltage across the threshold switching element may drop ("snapback") to a holding voltage Vh(T) which is less than the threshold voltage Vth(T).

The difference between the threshold voltage Vth(T) and the holding voltage Vh(T) is referred to as the snapback voltage. The threshold switching element may be switched from an off state to an on state where the off state has a higher resistance than the on state.

The threshold switching element remains in the on-state branch 62 as long as a minimum current, labeled Ih(T) in FIG. 10A, is maintained. Ih(T) is referred to as the holding current of the threshold switching element and the associated voltage Vh(T) is referred to as the holding voltage of the threshold switching element. If the current through the switch drops below Ih(T), the threshold switch normally returns to the off-state branch 52 of the I-V plot and requires re-application of a voltage across the switch which is greater than or equal to the threshold voltage Vth(T) to resume operation on the on-state branch. If the current is only momentarily (a time less than the recovery time of the chalcogenide material) reduced below Ih(T), the on state of the threshold switch may be retained and/or recovered upon restoring the current through the threshold material which is at or above Ih(T).

Analogous switching behavior occurs in the third quadrant of the I-V plot shown in FIG. 10A. Provided one is aware of the negative polarities of both the voltage and current of the I-V curve in the third quadrant, the switching behavior in the third quadrant is analogous to that described hereinabove for the first quadrant. For example, applied voltages having a magnitude greater than the magnitude of the negative threshold voltage in the third quadrant induce switching from the off-state branch 52 to the on-state branch 62. It is noted that the current-voltage characteristic curve shown in FIG. 10A is an example of an S-type current-voltage characteristic curve.

Figure 10B:
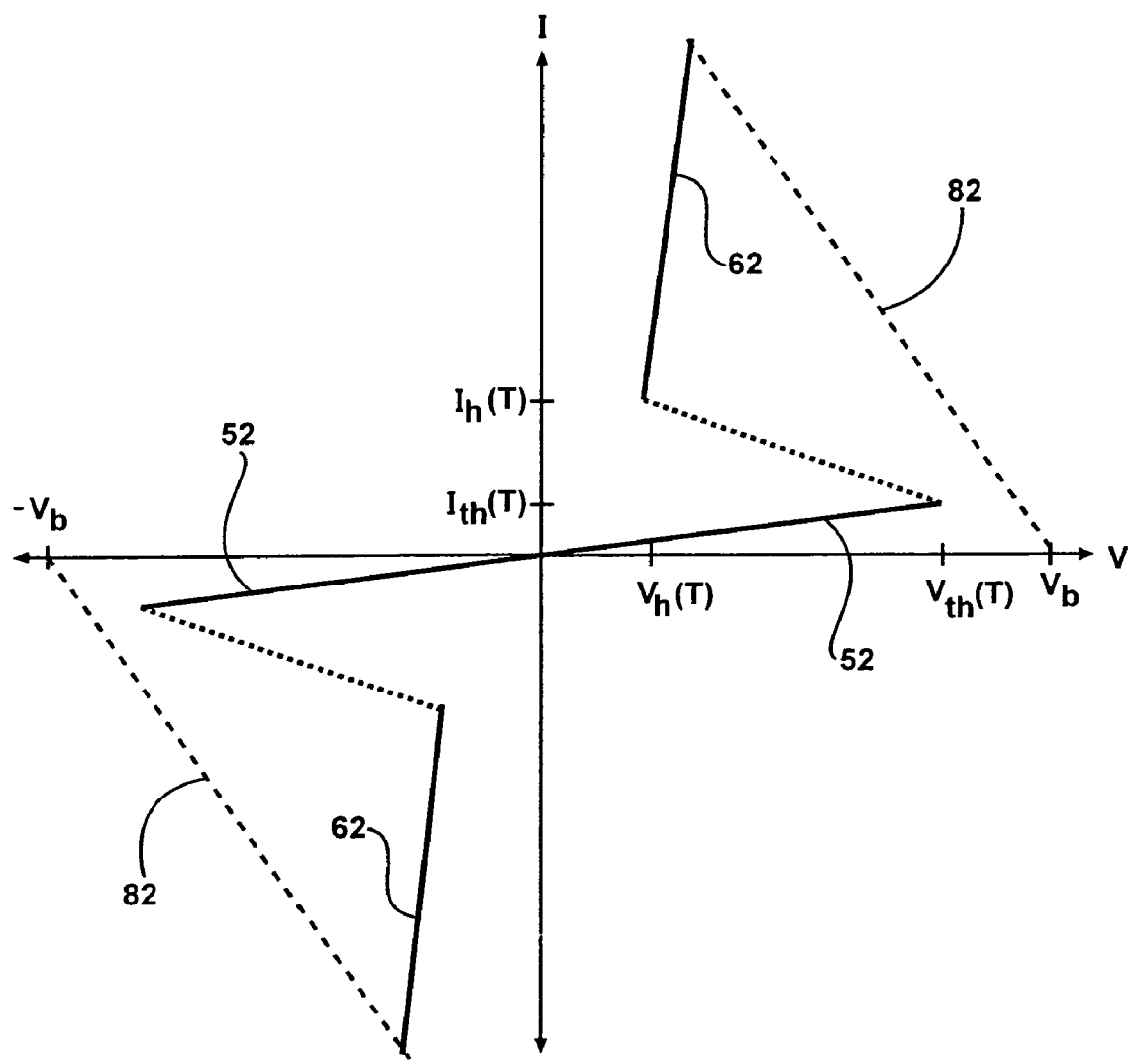
FIG. 10B is a current-voltage characteristic of a threshold switch that includes a breakdown layer.

FIG. 10B shows the characteristics of a threshold switch formed with a breakdown layer in series with the threshold material. The curves 52 and 62 represent the off state and on state curves after the breakdown layer is broken down. The voltage Vb represents the breakdown voltage of the breakdown layer (typically greater than the threshold voltage Vth (T)), and the current flowing is negligible with a good insulating layer—so in effect the curve traces along the X-axis to Vb. The dashed line 82 from Vb shows the characteristic after the breakdown layer is punctured. Thereafter the threshold switching element follows the 52 and 62 curves (unless the breakdown layer regrows or the device is destroyed into an open state). The current-voltage (I-V) curve of FIG. 10B is also an example of an S-type current-voltage characteristic.

The threshold switching element (formed with or without a breakdown layer) may be a chalcogenide threshold switching element including a chalcogenide threshold switching material. In one embodiment, the switching material may comprise tellurium and/or selenium. In another embodiment, the switching material may comprise silicon (Si), tellurium (Te), arsenic (As), and germanium (Ge), or combinations of these elements. In other embodiments, a composition for switching material 220 may include an alloy of silicon (Si), tellurium (Te), arsenic (As), germanium (Ge), and indium (In) or an alloy of Si, Te, As, Ge, and phosphorous (P).

Although the scope of the present invention is not limited in this respect, in one example, the composition of the switching material may comprise a Si concentration of about 14%, a Te concentration of about 39%, an As concentration of about 37%, a Ge concentration of about 9%, and an In concentration of about 1%. In another example, the composition of the switching material may comprise a Si concentration of about 14%, a Te concentration of about 39%, an As concentration of about 37%, a Ge concentration of about 9%, and a P concentration of about 1%. In these examples, the percentages are atomic percentages which total 100% of the atoms of the constituent elements.

In another embodiment, a composition for the switching material may include an alloy of arsenic (As), tellurium (Te), sulfur (S), germanium (Ge), selenium (Se), and antimony (Sb) with respective atomic percentages of 10%, 21%, 2%, 15%, 50%, and 2%.

Although the scope of the present invention is not limited in this respect, in other embodiments, switching material may include Si, Te, As, Ge, sulfur (S), and selenium (Se). As an example, the composition of the switching material may comprise a Si concentration of about 5%, a Te concentration of about 34%, an As concentration of about 28%, a Ge concentration of about 11%, a S concentration of about 21%, and a Se concentration of about 1%.

A chalcogenide threshold switching material may not readily crystallize and may not readily change its structural state with application of electrical energy. Certain embodiments of chalcogenide threshold switching materials may not change structural states regardless of the current applied. A threshold switching material in a substantially amorphous state may remain in this substantially amorphous state. A chalcogenide material used for a threshold switching material may have a different composition from a chalcogenide material used for a phase-change material.

The threshold switching element may be any threshold switching element that has an S-type current-voltage characteristic (examples of which are shown in FIGS. 10A,B). A threshold switching element that satisfies an S-type current-voltage characteristic is referred to as an S-type switching element and the corresponding threshold switching material is be referred to as an S-type threshold switching material. A threshold switching element satisfying an S-type current-voltage (I-V) behavior and its corresponding threshold switching material does not have to be formed of a chalcogenide material.

The threshold switching material used in a programmable connection is not limited to any particular thickness. Although the scope of the present invention is not limited in this respect, the threshold switching material may be a thin film material having a thickness ranging from about 20 Angstroms to about 2000 Angstroms. In one embodiment, the thickness of switching material may range from about 200 Angstroms to about 1000 Angstroms. In another embodiment, the thickness of switching material may be about 500 Angstroms. A switching material may be formed overlying a bottom electrode using a thin film deposition technique such as, for example, a chemical vapor deposition (CVD) process or a physical vapor deposition (PVD).

The thickness of any one or more of the electrodes used in a threshold switching element is not limited to any particular value. In one embodiment, as an example, an electrode may be a formed of a thin film material having a thickness ranging from about 20 angstroms (Angstroms) to about 2000 Angstroms. In another embodiment, the thickness of an the electrode may range from about 100 Angstroms to about 1000 Angstroms. In another embodiment, the thickness of an electrode may be about 300 Angstroms to about 600 Angstroms. The electrodes may be formed of any conductive material. Suitable materials for the electrodes have been described above.

Referring to FIG. 8B, in one embodiment, the top electrode 210B and bottom electrode 210A may comprise carbon and may have a thickness of about 500 Angstroms. In this embodiment, the programmable connection may be referred to as a vertical structure since electrical current may flow vertically through switching material 400 between top electrode 210B and bottom electrode 210A. The switching element may be referred to as a thin film select device if thin films are used for switching material 400 and electrodes 210A,B.

The threshold voltage Vth(T) of the threshold switching element may be altered by changing process variables such as, for example, the thickness or alloy composition of the switching material. For example, increasing the thickness of the switching material may increase the threshold voltage Vth(T) of the threshold switching element. The holding voltage Vh(T) of the threshold switch may be altered or set by the type of contact to the switching element (e.g., the composition of the electrodes may determine the holding voltage of the threshold element).

As examples, referring to FIG. 8B, if the thickness of switching material composed of silicon (Si), tellurium (Te), arsenic (As), and germanium (Ge) is about 300 Angstroms, and electrodes 210A and 210B are layers of carbon (C), then it is possible that the threshold voltage Vth(T) of threshold switching element may be about two volts and the holding voltage Vh(T) of the threshold switching element may be about one volt. Alternatively, if electrodes 210A and 210B are, layers of TiSiN with a thickness of about 300 Angstroms, then it is possible that the holding voltage Vh(T) of the threshold switching elment may be about 0.8 volts. In another embodiment, if electrodes 210A and 210B are layers of titanium aluminum nitride (TiAlN) with a thickness of about 300 Angstroms, then the holding voltage of the threshold switch may be about 0.4 volts. In yet another embodiment, if electrodes 210A,B are layers of cobalt silicide, then the holding voltage of the threshold switching element may be about 0.15 volts.

For a programmable connection including a threshold switching element (without any additional memory element as shown in FIGS. 9A-E), the state of the programmable connection may correspond to the state of the threshold switching element. For example, a threshold switch programmed to its off state corresponds to an OPEN programmed connection (wherein data is not transmitted) while a threshold switch programmed to its on state corresponds to a CLOSED programmable connection (wherein data is transmitted through the CLOSED programmable connection from the driver output line to receiver logic line).

When the programmable connection is OPEN (off state of the threshold switch), a data signal applied to the corresponding driver line (for example, the output of a logic gate coupled to the driver line) should preferably not be allowed to transmit from the driver line to the corresponding receiver line. The data signal may not transmit through a threshold switching element in its off state if the different in voltage between the driver line and receiver line (across the threshold switching element) is less than the threshold voltage Vth(T) of the threshold switching element.

Hence, a possible operating condition may be that the voltage of the data signal, Vsignal on the driver line minus the voltage on the receiver line is less than the threshold voltage of the threshold switching element. That is, |Vsignal−V(receiver line)|<|Vth(T)|. The voltage Vsignal of the data signal applied to the driver line may be equal to the power supply voltage Vcc. Also, the value of the voltage on the receiver line may be 0 volts or ground potential) so that an operating condition may be |Vcc|<|Vth(T)|. As an example, if Vcc is about 3 volts, then the threshold voltage Vth(T) of the memory element may be chosen to be about 4 volts.

When the programmable connection is CLOSED (on state of the threshold switching element) a data signal applied to the corresponding driver should preferably be allowed to transmit to the receiver line. In this case, the voltage applied to the driver line should preferably be allowed to drive the voltage on the receiver line. With the programmable connection in the CLOSED state, the voltage on the receiver line may be driven by the voltage on the driver line. In the on state, the voltage across the threshold switch is Vh(T) so that a possible operating condition is that Vsignal on the driver line minus the voltage on the receiver line, V(receiver line), should be greater than Vh(T) (that is, |Vsignal−V(receiver line)|>|Vh(T)|). The difference between Vsignal and the voltage on the receiver line may be greater than Vh(T) by more than the input transition level voltage Vtl of the receiving logic. Vtl is the input level to the logic at which the output of the logic gate switches. A possible operating condition may be |Vsignal−V(receiver line)|>|Vh(T)+Vtl|. If Vsignal is chosen to be Vcc and V(receiver line) is 0 volts or ground potential, then a possible operating condition may be |Vcc|>|Vh(T)+Vtl|.

For a programmable connection including a threshold switching element (without any additional select device such as shown in FIGS. 9A-E), the threshold switch may be repeatedly programmed back and forth between its off and on states (thereby programming the corresponding programmable connection back and forth between its OPEN and CLOSED states, respectively). In one embodiment, the programming voltage Vp used to program the threshold switch may be chosen to be greater than the threshold voltage Vth(T). A possible operating condition may be that Vp>Vth(T) or, in terms of magnitudes, |Vp|>|Vth(T)|. This condition will assure that the threshold switch is turned on. The threshold switch will stay on provided that the current through the threshold switch stays at or above the holding current Ih(T).

The condition Vth(T)>Vcc (expressed above as Vcc<Vth(T)) is a possible operating condition. If this is the case, then the programming voltage Vp may be chosen to be greater than the power supply voltage Vcc (that is, Vp>Vth(T)>Vcc). For this to occur, a charge pump may be needed to provide a programming voltage Vp greater than the power supply voltage furnished the chip, such as greater than Vcc and also greater than Vth(T). The use of a charge pump is discussed in more detail below.

As noted, the threshold switching element stays on provided that the current through the threshold switching element stays above its holding current Ih(T). To help provide that the current through the threshold switching element remains at or above its holding current Ih(T), a bleeder circuit may be used as shown in FIG. 9E. In FIG. 9E, the bleeder circuit 500 is coupled to the receiver line which, for example, is the X line as shown here. In another embodiment, the Y line may be the receiver line while the X line may be the driver line. In addition, it is conceivable that in another embodiment of the invention, a bleeder circuit may be coupled to a driver line. The bleeder circuit 500 includes a p-channel transistor Q20 and an n-channel transistor Q22. The p-channel transistor turns on and acts as a current source when the voltage on the X line is sufficiently low. As a current source, the p-channel transistor is sourcing a current through the threshold switch T from the X line to the Y line. The n-channel transistor Q22 turns on and acts a current sink when the voltage on the X line is sufficiently high. As a current sink, the n-channel transistor Q20 pulls a current through the threshold switching element from the Y line to the X line. It is possible that the bleeder circuit 500 may be coupled instead to the Y line, where the Y line is a receiver line.

In an embodiment of the invention, a programmable connection may comprise a phase-change memory material in series with a threshold switching material. At least one programmable connection may comprise a phase-change material in series with a threshold switching material. The series combination of threshold switching material and memory material may help to reduce current leakage and allow larger voltages across an OPEN connection between the X and Y lines. In another embodiment, a breakdown material or breakdown device may be placed in series with the series combination of memory material and threshold switching material.

Figure 11A:
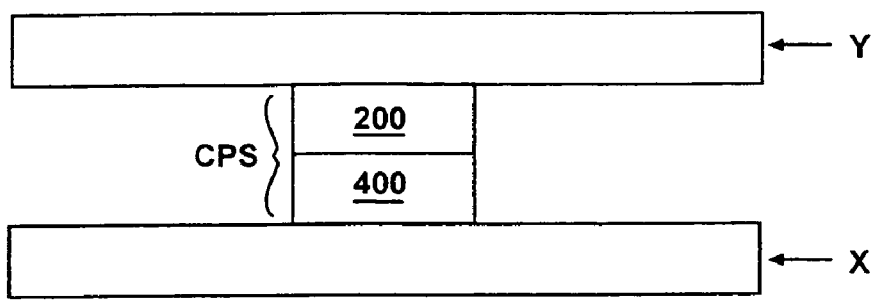
FIG. 11A is a programmable connection of the present invention comprising a memory material in series with a threshold switching material.
Figure 11:
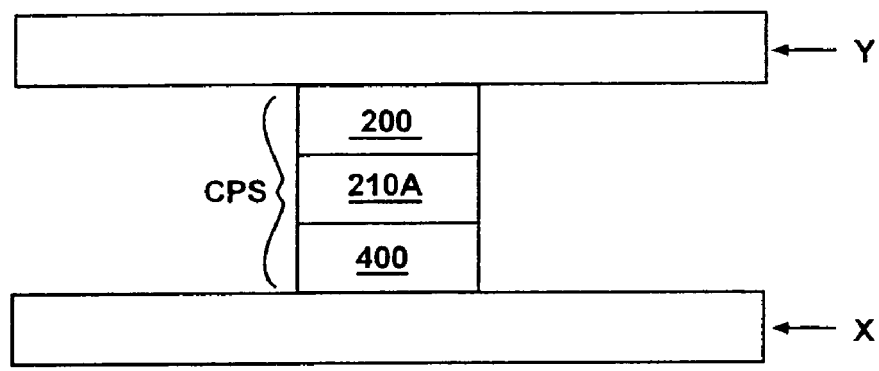
FIG. 11B is a programmable connection of the present invention comprising a memory material in series with a threshold switching material and an electrode coupled between the memory material and threshold switching material.
FIG. 11C is a programmable connection of the present invention comprising a memory material, a threshold switching material and electrodes.
FIG. 11D is a programmable connection of the present invention comprising a memory material and a threshold switching material and electrodes.
FIG. 11E is a programmable connection of the present invention comprising a series combination of a memory material, a threshold switching material and a breakdown material.
FIG. 11F is a programmable connection of the present invention comprising a memory material, a threshold switching material, a breakdown material and electrodes.
FIG. 11G is a programmable connection of the present invention comprising a memory material, a threshold switching material, a breakdown material and electrodes.
FIG. 11H is a programmable connection of the present invention comprising a memory material, a threshold switching material, a breakdown material and electrodes.

Examples of the present invention are shown in FIGS. 11A through 11G. FIG. 11A shows a programmable connection comprising a memory material 200 and a threshold material 400. The series combination of the memory material and threshold material is coupled between an X line and a Y line so that the memory material and threshold material are in the current pathway between the X and Y conductive lines. In this embodiment the memory material is directly coupled to the Y line while the threshold material 400 is directly coupled to the X line. The X and Y lines may be reversed. FIG. 11B shows an additional electrode 210A placed between the threshold material and the memory material. Electrode 210A may include a material appropriately chosen to help prevent electromigration of materials between the memory material 200 and the threshold material 400. The embodiment shown in FIG. 11C using three electrodes 210A,B,C. Other embodiments are possible where only one or two of the electrodes are used.

Figure 11C:
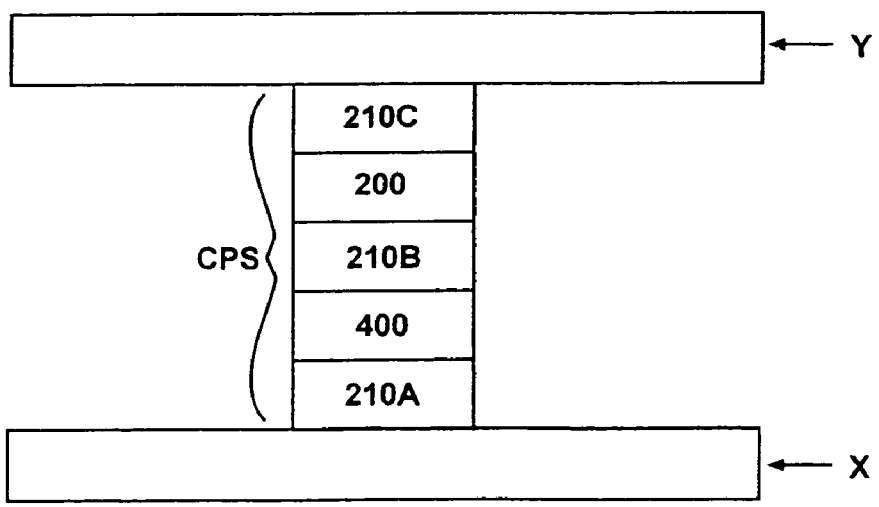
Figure 11D:
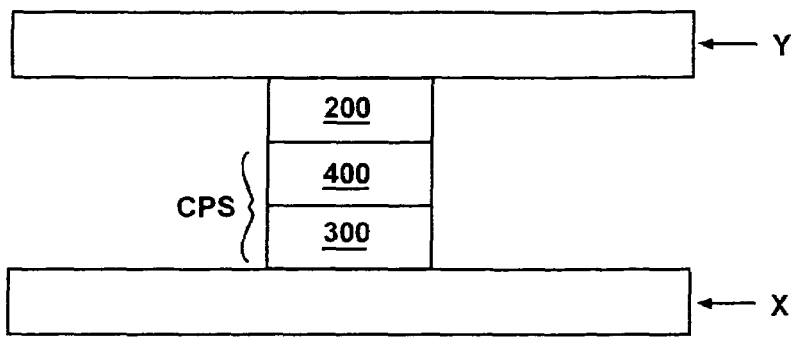

FIG. 11D shows a programmable connection comprising a series combination of a memory material 200, threshold switching material 400 and breakdown material 300. The series combination of memory material, threshold switching material and breakdown material is coupled between an X line and a Y line. In this embodiment the memory material 200 is directly coupled to the Y line, the breakdown material 300 is directly coupled to the X line while the threshold material is directly coupled between the memory material and threshold material. Other embodiments are possible where the order of the materials is changed.

Figure 11E:
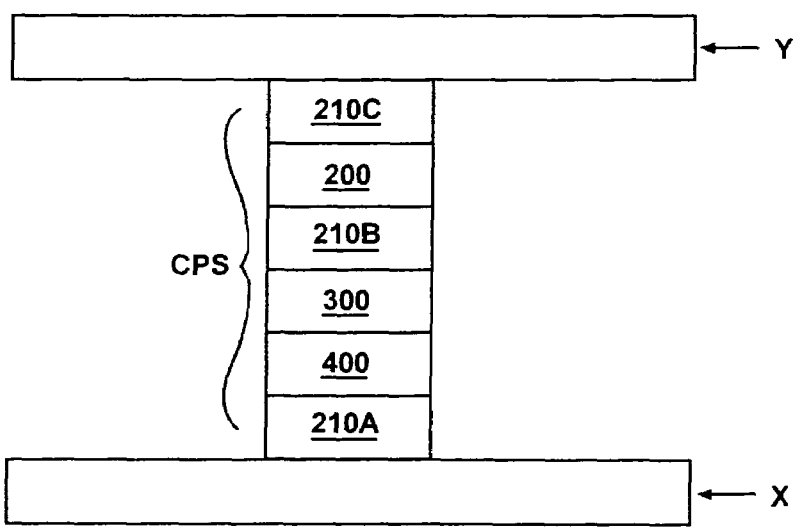

FIGS. 11E,F show a programmable connection of the present invention that includes a series combination of a memory material, a threshold material and a breakdown material with additional electrodes 210A,B,C. Other embodiments are possible where one or more of the electrodes are removed.

In an embodiment of the invention, a programmable connection may comprise a phase-change memory element in series with a threshold switching element. At least one programmable connection may comprise a phase-change memory element in series with a threshold switching element. The series combination is coupled between an X line and a Y line. The memory element comprises a memory material while the threshold switching element comprises a threshold switching material. The memory element and/or the threshold switching element may include one or more breakdown layers. Also, a breakdown device (such as an anti-fuse) may be placed on or separately wired in series with the series combination of memory element and switching element between the X and Y conductive lines.

Figure 12A:
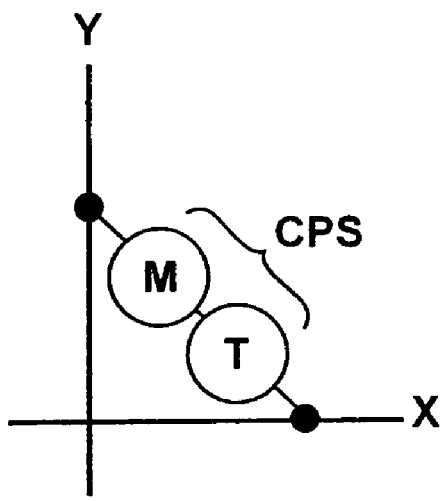
FIG. 12A is a programmable connection of the present invention comprising a memory element in series with a threshold switching element.

An embodiment of the invention is shown in FIG. 12A showing a memory element M and a threshold switching element T electrically coupled in series between an X line and a Y line. The memory material within the memory element M is coupled in series with the threshold switching material within the threshold switching element T.

Figure 3D:
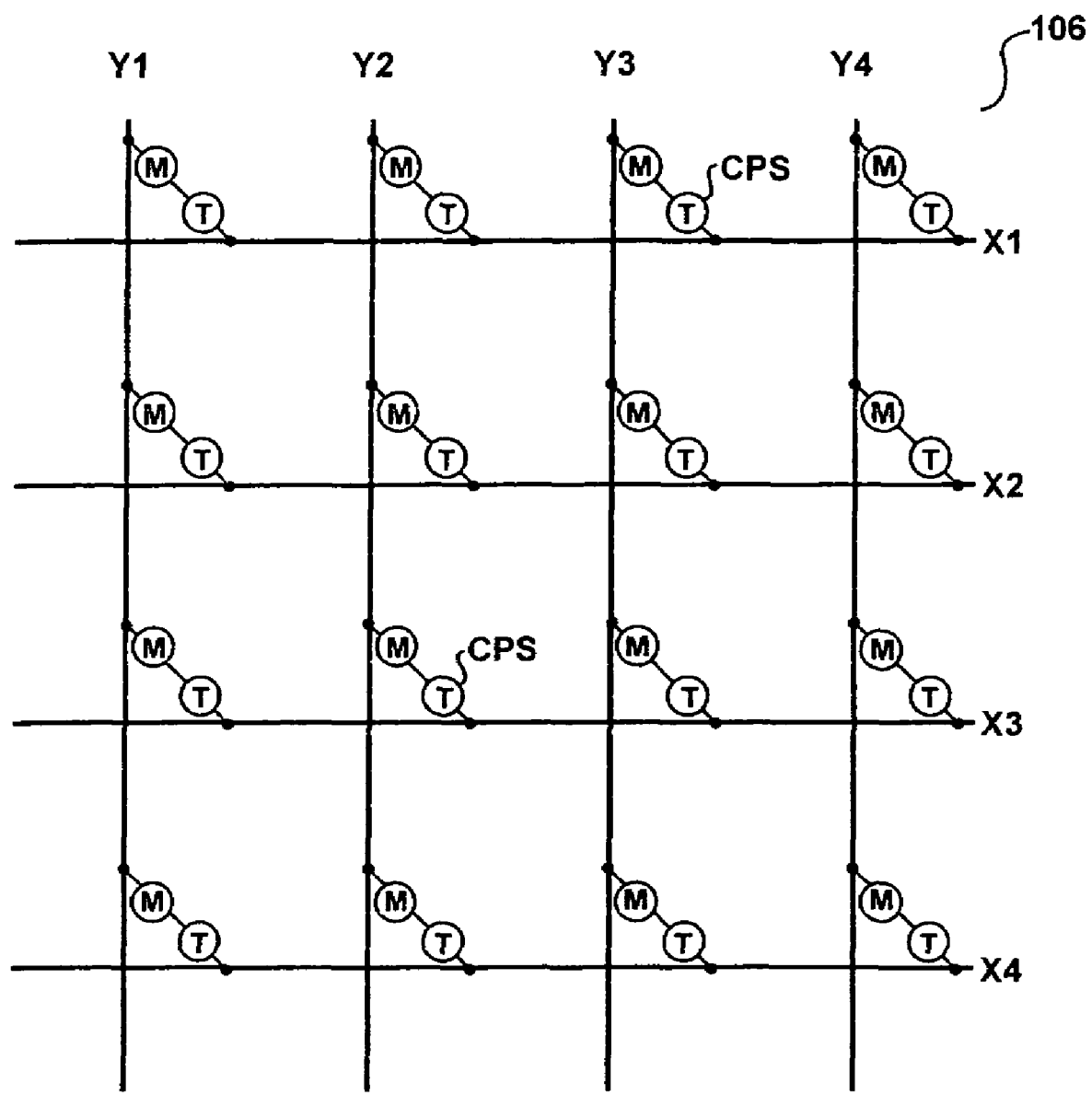
FIG. 3D is an embodiment of a programmable matrix array where each programmable connection is a series combination of a memory element and threshold switch coupled between an X line and a Y line.
Figure 12B:
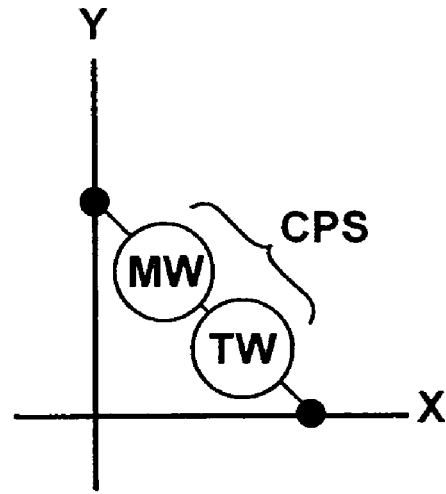
FIG. 12B is a programmable connection of the present invention comprising a memory element in series with a threshold switching element where the memory element does not include a breakdown layer and the threshold switching element does not include a breakdown layer.
Figure 12C:
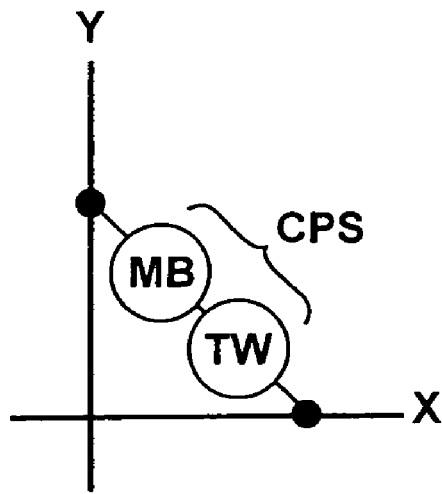
FIG. 12C is a programmable connection of the present invention comprising a memory element in series with a threshold switching element where the memory element includes a breakdown layer and the threshold switching element does not include a breakdown layer.
Figure 12D:
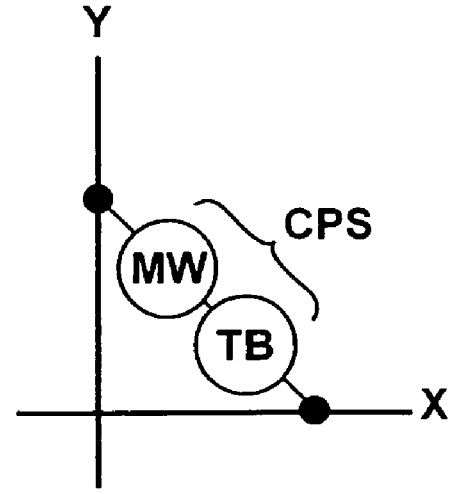
FIG. 12D is a programmable connection of the present invention comprising a memory element in series with a threshold switching element where the memory element does not include a breakdown layer and the threshold switching element includes a breakdown layer.

A breakdown layer may be coupled in series with the memory material within the memory element. Likewise, a breakdown layer may be coupled in series with the threshold switching material within the threshold switching element. FIG. 12A shows an embodiment of the invention in which a memory element M is in series with a threshold switch T. The memory element M may or may not have a breakdown layer in series with the memory material. The threshold switch T may or may not have a breakdown layer in series with threshold material. FIG. 12B shows an embodiment of the invention in which a memory element MW (without a breakdown layer) is in series with a threshold switch TW (without a breakdown layer). FIG. 12C shows an embodiment of the invention in which a memory element MB (having a breakdown layer in series with a memory material) is in series with a threshold switch TW (without a breakdown layer). FIG. 11D shows an embodiment of the invention in which a memory element MW (without a breakdown layer) is in series with a threshold switch TB (having a breakdown layer in series with a threshold material). FIG. 11E shows an embodiment of the invention in which a memory element MW (without a breakdown layer) is in series with a threshold switch TW (without a breakdown layer) and the series combination of the memory element MW and threshold switch TW is in series with a breakdown device B (such as an anti-fuse). FIG. 3D shows a four by four programmable matrix array 106 where each of the programmable connections is a memory element M in series with a threshold switching element T. Each of the programmable connections is coupled between a corresponding X line (X1 through X4) and a corresponding Y line (Y1 through Y4).

Figure 12E:
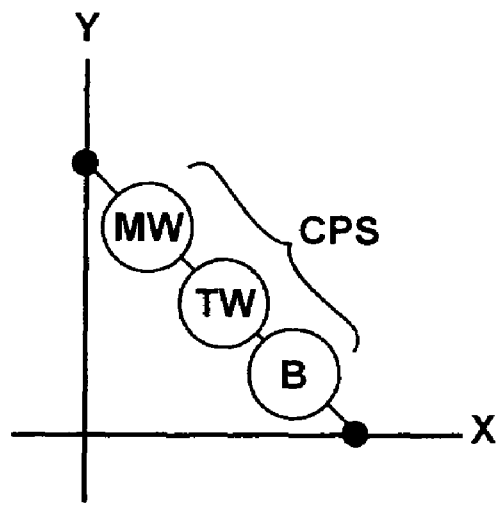
FIG. 12E is a programmable connection of the present invention comprising a memory element in series with a threshold switching element and in series with a breakdown device were the memory element does not include and breakdown layer and the threshold switching element does not include a breakdown layer.
Figure 12F:
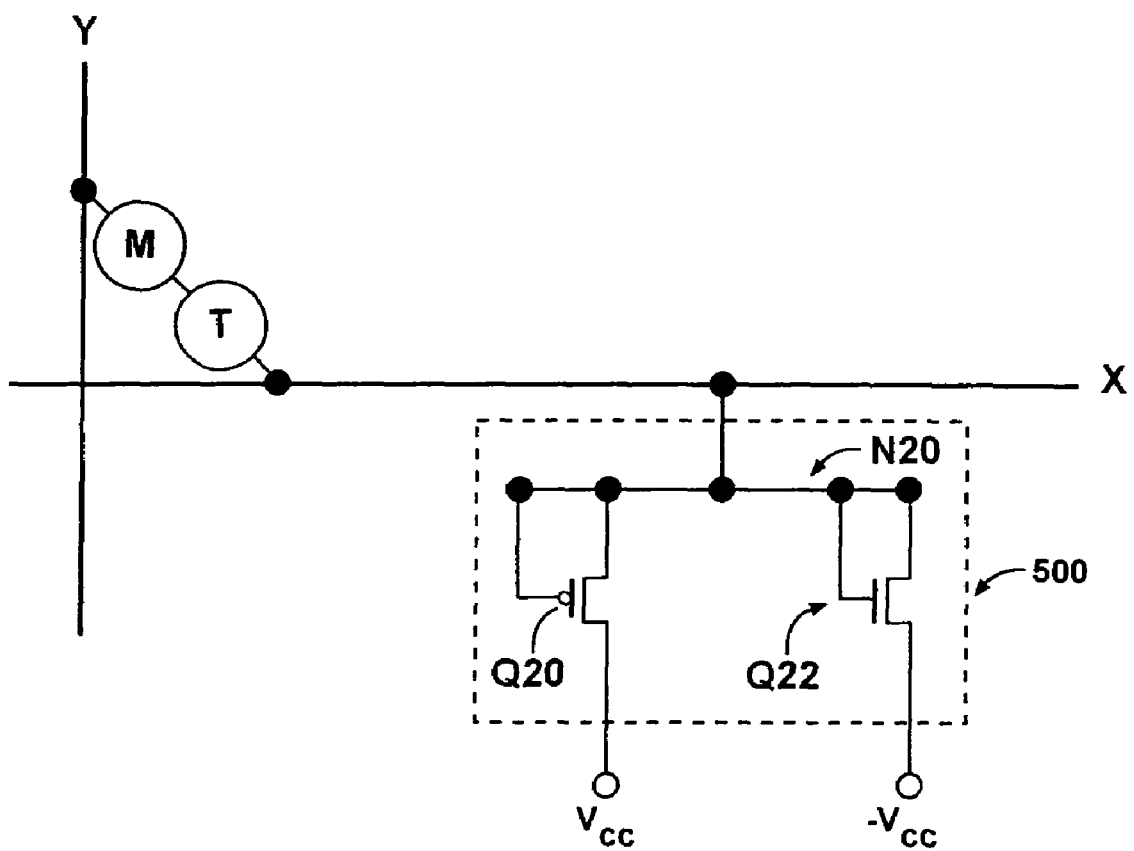
FIG. 12F is a programmable connection of the present invention comprising a memory element in series with a threshold switching element with a bleeder circuit coupled to the X line.

FIG. 12F shows an embodiment of the invention with a bleeder circuit 500 coupled to the receiver line (here the X line). The bleeder circuit has been discussed above for the programmable connection that includes a threshold switch without a memory element and it has similar use here.

Figure 11F:
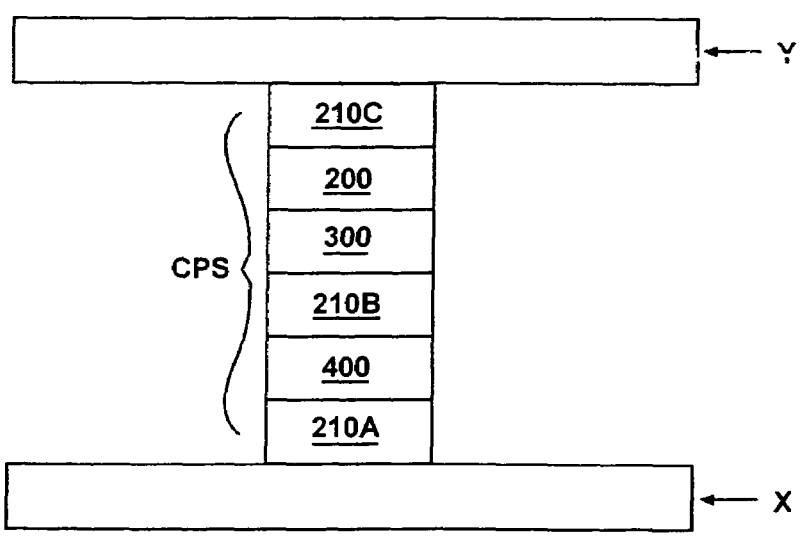
Figure 11G:
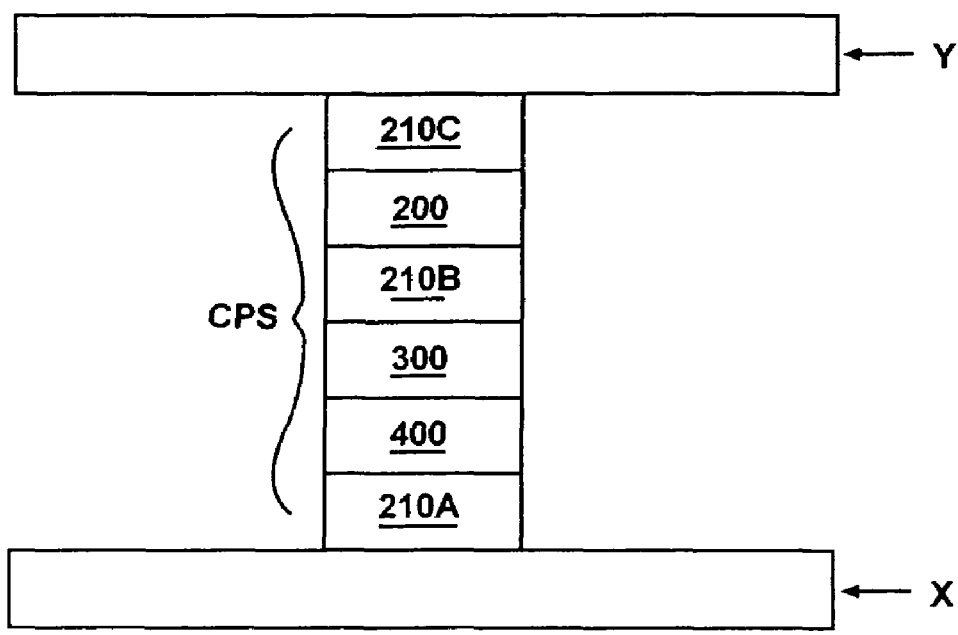
Figure 11H:
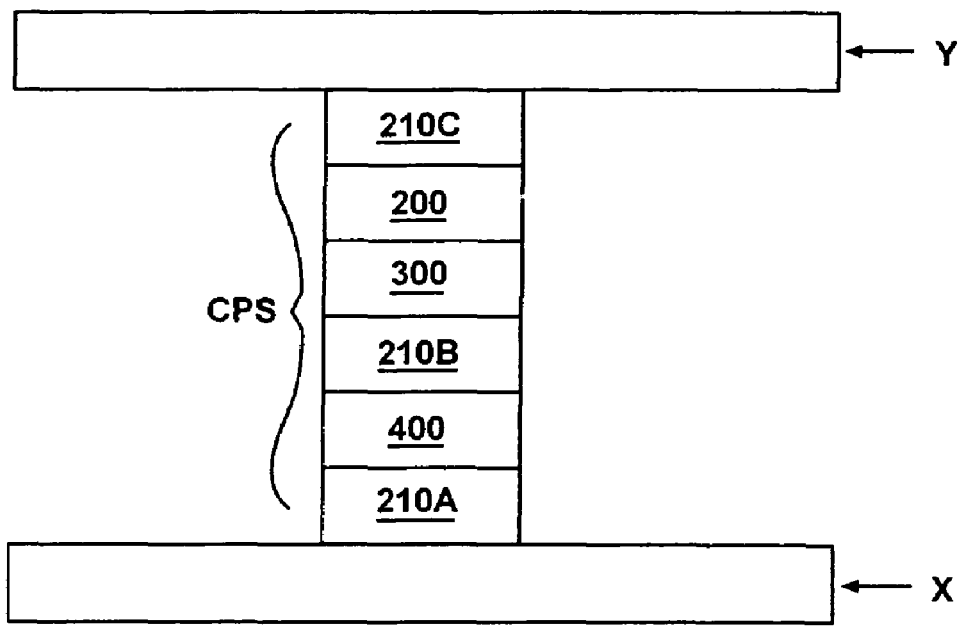

The embodiments shown in FIGS. 11A-H provide examples of a programmable connection comprising a memory element in series with a threshold switching element. In FIG. 11C, for example, the memory element comprises phase-change material 200, electrode 210C and electrode 210B. The threshold switching element comprises threshold switching material 400, electrode 210B and electrode 210A. In FIG. 11F, the memory element comprises memory material 200, breakdown material 300, electrode 210C and electrode 210B while the threshold switching element comprises threshold switching material 400, electrode 210B and electrode 210A.

During normal operation, at high supply, considerable voltage may be dropped across a memory element that is in its low resistance state during fast transitions (with the threshold switch turned on if used). This current may be limited by use of two (or more) memory elements in series (instead of one). Two (or more) threshold switching elements may also be provided in series. Likewise, two or more memory elements may be series with two or more threshold switches. The two memory elements in series (and/or two threshold switches in series) will reduce the voltage across either memory element (and/or threshold switch) when both are in the low resistance case (reducing current), as well as when both are in the high voltage threshold condition (reducing leakage).

Figure 13A:
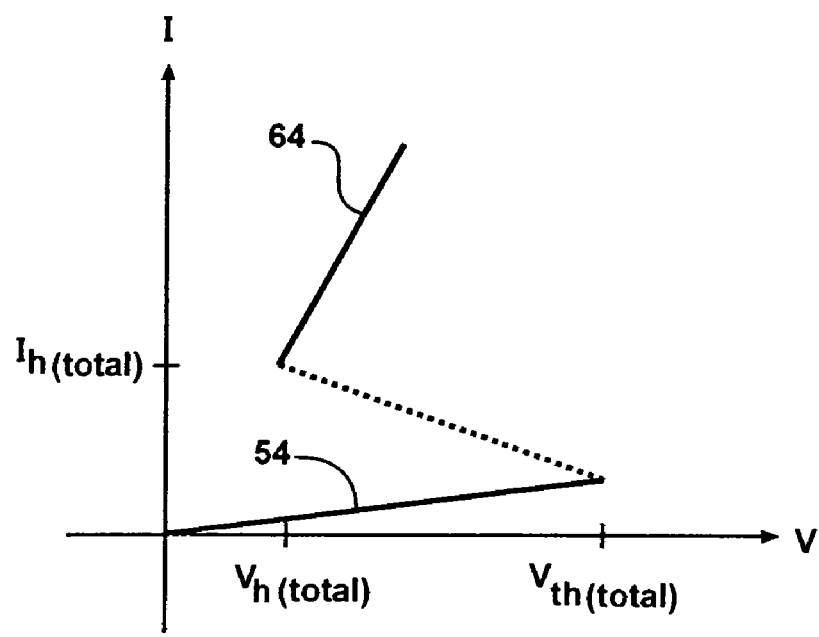
FIG. 13A is a current-voltage characteristics of a memory element in series with a threshold switching element where the memory and threshold switching elements do not include breakdown layers and the memory element is in the reset state.
Figure 13B:
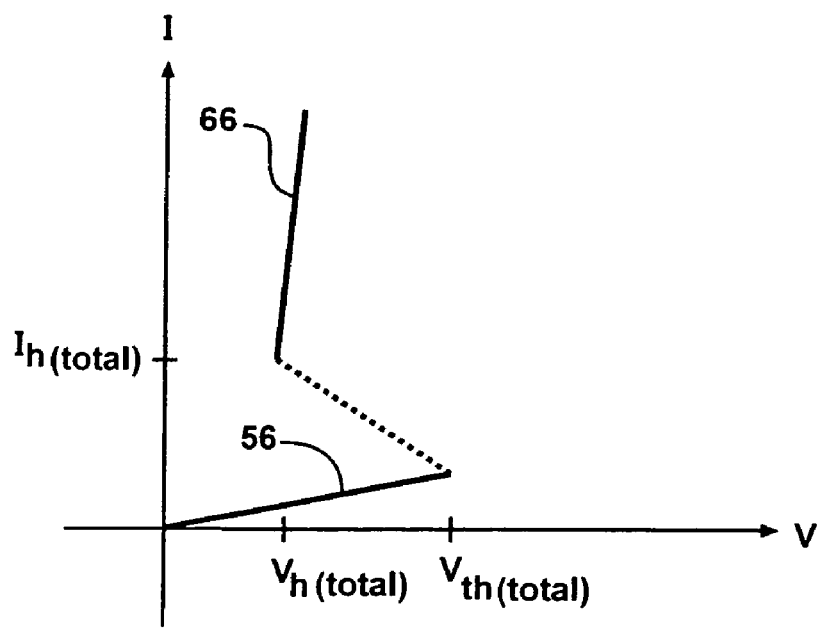
FIG. 13B is a current-voltage characteristics of a memory element in series with a threshold switching element where the memory and threshold switching elements do not include breakdown layers and the memory element is in the set state.
Figure 13C:
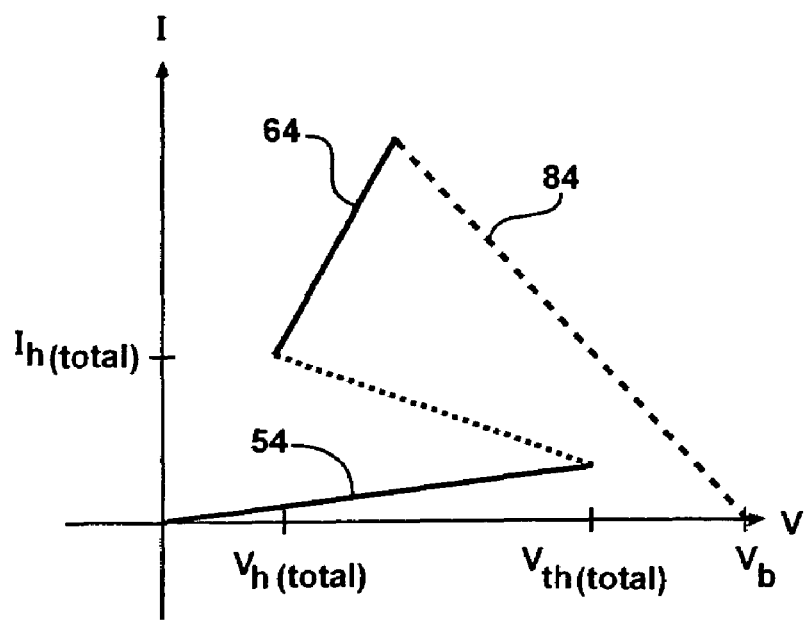
FIG. 13C is a current-voltage characteristics of a memory element in series with a threshold switching element where the memory element is programmed to the reset state after a breakdown layer is broken down.
Figure 13D:
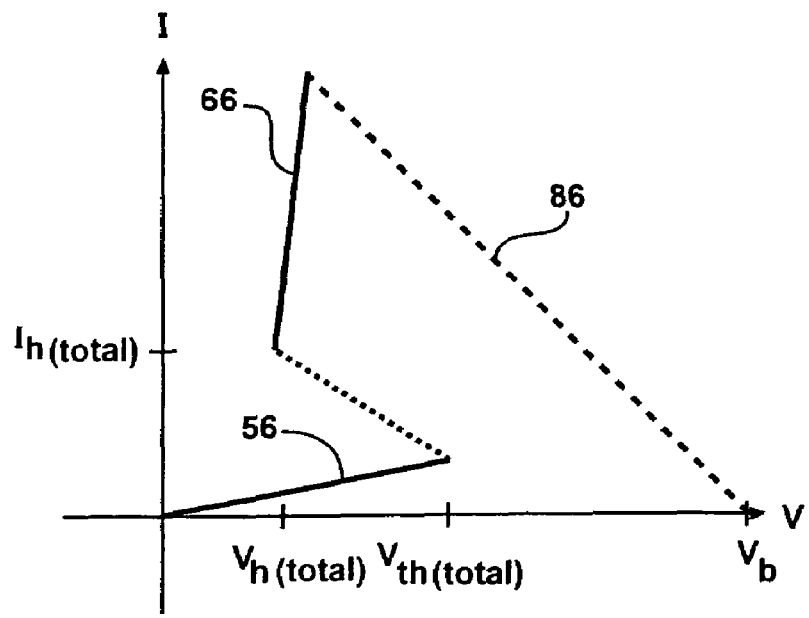
FIG. 13D is a current-voltage characteristics of a memory element in series with a threshold switching element where the memory element is programmed to the set state have a breakdown layer is broken down.

Examples of current-voltage (I-V) characteristics for the memory element and the threshold switching element individually have been explained above. An example of a current-voltage (I-V) curve for the combined memory element in series with a threshold switching element is shown in FIG. 13A when the memory element is in the reset state (without a breakdown layer or with a breakdown layer that has been broken down). FIG. 13A includes branches 54,64. FIG. 13B shows an I-V curve for a series combination of memory element and threshold switching element when the memory element is in the set state (without a breakdown layer or a breakdown layer that has been broken down). FIG. 13B includes branches 56, 66. FIG. 13C shows an I-V curve for a series combination of memory element and threshold switching element when the memory element is in the reset state and there is a breakdown layer in series with the memory material and threshold switching material. FIG. 13C includes branches 54,64. Dashed line 84 from Vb shows that the I-V characteristics follow branches 54,64 after the breakdown layer is punctured. FIG. 13D shows an I-V curve for a series combination of memory element and threshold switching element when the memory element is in the set state and with a breakdown layer in series with the memory material and threshold switching material. FIG. 13D includes branches 56,66. Dashed line 86 from Vb shows that the I-V characteristics follow branches 56,66 after the breakdown layer is broken down.

Vth(total) represents the threshold voltage of the series combination, Vh(total) represents the holding voltage of the series combination and Ih(total) represents the holding current of the series combination. It is noted that the combined threshold voltage Vth(total) of the series combination of the memory element M and the threshold switching element T may be approximately the sum of the threshold voltage of the memory element M and the threshold voltage of the threshold switching element T.

The total threshold voltage of the programmable connection will vary with the state of the memory element. When the memory element is in its reset state, the threshold voltage Vth(M) of the memory element in the reset state will have a nonzero value and the total threshold voltage Vth(total) may be Vth(M)+Vth(T). When the memory element is in its set state, the threshold voltage of the memory element in the set state should be effectively 0 and the total threshold voltage Vth(total) may be Vth(T). As an example, when the threshold switching element is in its reset state, the threshold voltage Vth(M) may be around 1V and the threshold voltage Vth(T) may be around 1V. When the memory element is in its reset state, the combined threshold voltage may be around 2V. When the memory element is in its set state, the threshold voltage of the memory element is effectively 0V so that the total threshold voltage may be around 1V.

A programmable connection comprising a series combination of memory element and threshold switching element coupled between an X conductive line and a Y conductive line (such as shown in FIG. 12A) may be electrically programmed to provide an electrical connection between the two lines. The state of the programmable connection may correspond to the state of the memory element.

For example, when the memory element is programmed to its set state, this may correspond to the programmable connection being in a CLOSED state. In this case, the total threshold voltage of the threshold switching element and memory element Vth(total) may be equal to Vth(T) (since the threshold voltage of the memory element is effectively 0 volts when the memory element is in its set state). When the memory element is programmed to its reset state, this may correspond to a programmable connection being in an OPEN state. In this case the total threshold voltage Vth(total) of the series combination may be equal to Vth(T)+Vth(M), where Vth(T) is the threshold voltage of threshold switching element and Vth(M) is the threshold voltage of the memory element in its reset state.

The voltage level of a data, signal applied to a driver line (for example, the Y line) may be represented as Vsignal. The data signal Vsignal may be a binary signal having a high value of Vhigh and a low value of Vlow. As an example of a possible method of operation, when the data signal is applied to a CLOSED connection, it may be desired that the application of the data signal causes the threshold switching element to switch from its off state to its on state so data can be transmitted. (In this case, the voltage across the programmable connection may, at least temporarily, become greater than the threshold voltage Vth(T) so that the threshold switching element will switch on). On the other hand, when the data signal is applied to an OPEN connection it may be desired that the voltage across the programmable connection is not sufficient to cause the threshold switching element to switch on so that no data is transmitted.

Figure 14:
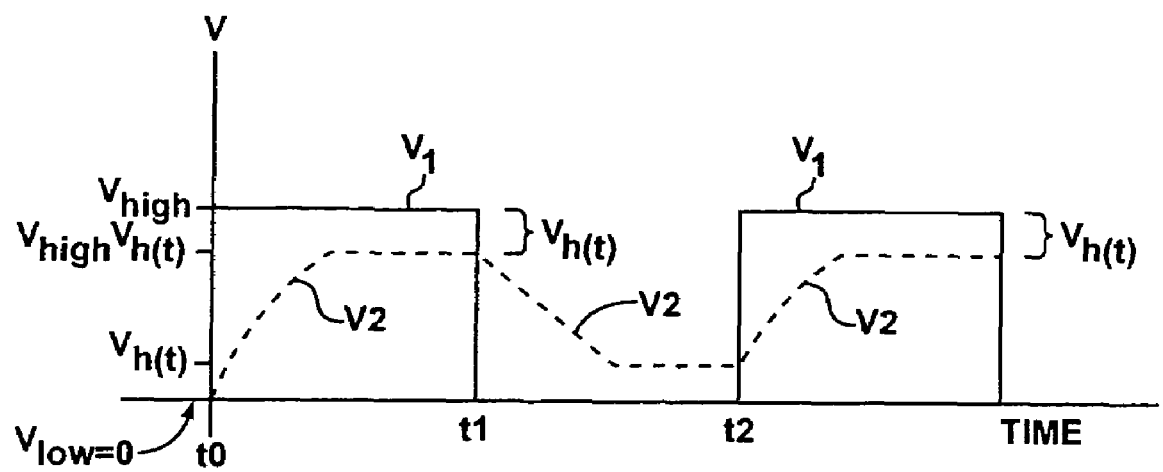
FIG. 14 shows a first voltage V1 (solid line) on a driver line of an X-Y matrix and a second voltage V2 (dashed line) on the corresponding receiver line of the same X-Y matrix.

When the programmable connection is in a CLOSED state, it is desired that data is transmitted across the programmable connection from the driver line to the receiver line. FIG. 14 shows an example of operating the programmable connection in the CLOSED state (e.g., memory element programmed to the set state). This example is applicable for an embodiment of the invention where the receiver line is left to float. In alternate embodiments, the receiver line may be coupled to a bleeder circuit and/or biased through a resistance and/or terminated through a resistance. It is noted that a receiver line may first be precharged to a certain voltage value (such as, for example, 0 volts or Vlow as defined below) before being allowed to float.

FIG. 14 provides an example of a voltage signal V1 (solid line) of the driver line and the corresponding voltage signal V2 of the receiver line. V1 (solid line) represents the voltage Vsignal that is applied to the driver line. V2 (dashed line) represents the voltage on the receiver line. In this example, the voltage V1 is a binary signal having a high value of Vhigh and a low value of Vlow. The voltage level of Vhigh may be Vcc while the voltage level of Vlow may be 0 (e.g. ground potential). When the receiver line is allowed to float, it may, for example, start to float at about time t0 or it may start to float, for example, before time t0. (However, other embodiments are conceivable where the receiver line may start to float, for example, after time t0). As noted, the receiver line may be precharged to a certain voltage value before being allowed to float.

Generally, a data signal applied to a driver line is not limited to any particular type. It may be a digital signal having discrete values. It may be a binary signal having two discrete values. The voltage Vhigh may be the maximum value of the voltage of the data signal while Vlow may be the minimum value of the voltage of the data signal. If the data signal is a binary signal, then Vhigh may correspond to the high voltage value of the binary signal while Vlow may correspond to the low voltage value of the binary signal.

Referring again to the example of FIG. 14 (where the data signal applied to the driver line is a binary signal), the voltage level of V1 makes a first transition from Vlow to Vhigh at about time t0. It is noted that the transition of V1 from Vlow to Vhigh may not be instantaneous but may take some finite time. Because of the resistance and capacitance of the circuit, the voltage V2 may not instantaneously follow the voltage V1. Instead the voltage V2 may rise exponentially with a time constant which may corresponding to RC (where R may be the series resistance of memory element and threshold switch while C may be the capacitance of the receiver line) Hence, there is a voltage difference across the programmable connection. The magnitude of this voltage difference V1–V2 may be about |Vhigh–Vlow| during the low to high transition of V1 at t0. If the magnitude of the voltage difference between the driver line and the receiver line is greater than the total threshold voltage Vth(total), then the threshold switch should turn on. Hence, if |Vhigh–Vlow|>|Vth(total)|, then the threshold switch should turn on. Since, for a CLOSED connection Vth(total) may be Vth(T), we may have the possible operating condition, |Vhigh−Vlow|>|Vth(T)|.

With the programmable connection being CLOSED and with the threshold switching element turned on, the voltage level V2 of the receiver line attempts to track the voltage V1 of the driver line and rises exponentially. When the voltage level of V2 reaches Vhigh−Vh(T), the voltage level stops rising. As the voltage level of V2 levels off at Vhigh−Vh(T), the current through the threshold switching element may drop below the holding current so that the threshold switching element should turn off.

At about time t1, the voltage V1 on the driver line will make a transition from Vhigh to Vlow. It is noted that the transition from Vhigh to Vlow may not be instantaneous but may take some finite time. Once again, the voltage V2 on the receiver line does not follow V1 instantaneously. Instead, it may exponentially drop to a voltage of Vh(T). As seen, at about the time of the transition, there is a voltage difference across the programmable connection between the driver and receiver lines. The magnitude of the voltage difference |V2−V1| may be equal to |(Vhigh−Vh(T))−Vlow| which is equal to |Vhigh−Vlow−Vh(T)|. Hence; if |Vhigh−Vlow−Vh(T)| is greater than |Vth(T)|, the threshold switching element should again turn on. It should remain on until the current through the threshold switching element drops below the holding current which may occur as the voltage V2 levels off at about Vh(T).

At about time t2, the voltage V1 on the driver line makes a transition from Vlow to Vhigh. Once again, the voltage V2 rises exponentially to Vhigh−Vh(T). At about the time of the transition t2, there again is a voltage difference across the programmable connection between the driver and receiver lines of |V1−V2| which may be equal to about |Vhigh−(Vlow+Vh(T))|. Hence, if |Vhigh−Vlow−Vh(T)|>|Vth(T)| then the threshold switching element should again switch on (if it was not still already on, perhaps because the current through the threshold switching element had not fallen below its holding current Ih(T)).

When the programmable connection is in the CLOSED state (and the memory element is in the set state) it may thus be desired that the voltage of the applied signal to the driver line satisfies the inequality |Vhigh−Vlow−Vh(T)|>|Vth(T)| so that the threshold switching element may be switched on (and data may be transmitted) when the data signal makes a transition on the driver line from either Vhigh to Vlow or from Vlow to Vhigh.

When the programmable connection is in the OPEN state (and the memory element is in the reset state), it may be desired that data is not transmitted from the driver line to the receiver line. For an OPEN connection it may be desired that the magnitude of the voltage difference across the programmable connection between the driver line and receiver line is less than the total threshold voltage Vth(total). Hence, it may be desired that the applied signal to the driver line satisfies the inequality |Vhigh−Vlow|<|Vth(total)| so that data is not transmitted. For an OPEN connection Vth(total) may be equal to Vth(T)+Vth(M) so that a possible operating condition may be |Vhigh−Vlow|<|Vth(T)+Vth(M)|. These conditions correspond to the following relationships:

$$|Vhigh-Vlow-Vh(T)|>|Vth(T)| \tag{1}$$

$$|Vhigh-Vlow|<|Vth(T)+Vth(M)| \tag{2}$$

These two conditions may be expressed as follows:

$$|Vth(T)+Vh(T)|<|Vhigh-Vlow|<|Vth(T)+Vth(M)| \tag{3}$$

The voltage level Vhigh of the signal may be equal to the logic power supply voltage Vcc. In addition, the value Vlow may be ground or 0 volts (that is Vlow may be equal to 0 volts). If this the case, then we have the conditions:

$$|Vcc-Vh(T)|>|Vth(T)| \tag{4}$$

$$|Vcc|<|Vth(T)+Vth(M)| \tag{5}$$

These two conditions (4) and (5) may be combined to form the expression:

$$|Vth(T)+Vh(T)|<|Vcc|<|Vth(T)+Vth(M)| \tag{6}$$

It is noted that the relationship between Vhigh, Vlow, Vcc, Vth(T), Vth(M) and Vh(T) as provided in relationships (1) through (6) is simply one example of a possible way of operating the programmable connection. Other ways are also possible and the present invention is not limited to any particular method of operation.

In addition, if the threshold voltage of the memory element is nonzero when the memory element is in its set state, then relationship (3) would become $$|Vth(T)+Vth(M)_{set}+Vh(T)|<|Vhigh-Vlow|<|Vth(T)+Vth(M)| \tag{3a}$$

and relationship (6) would become $$|Vth(T)+Vth(M)_{set}+Vh(T)|<|Vcc|<|Vth(T)+Vth(M)| \tag{6a}$$

were it is again noted that Vth(M) represents the threshold voltage of the memory element in its reset state.

The example of FIG. 14 applies when the receiver line is allowed to float. However, it is possible that the receiver line may still be precharged to a certain voltage prior to being allowed to float (for example, to insure initialization for operation upon power-up). For example, the voltage on the receiver line may be precharged to Vlow or 0 volts prior to being allowed to float. This may, for example, be done when the power is turned on. Referring to the voltage V1 in FIG. 14, if the voltage transition from Vhigh to Vlow to Vhigh or from Vlow to Vhigh to Vlow is fast enough (for example, less than 1 nsec), the threshold switching element (with the programmable connection in the CLOSED state) may remain on for the duration of the transition, including during a transition from a positive to negative voltage difference across the threshold switch. However, for this "always on" CLOSED connection to remain "on" and CLOSED during the transition, current through the programmable connection should remain at or above the holding current Ih(T) of the threshold switching element when V2 stabilizes on the receiver line.

Figure 15A:
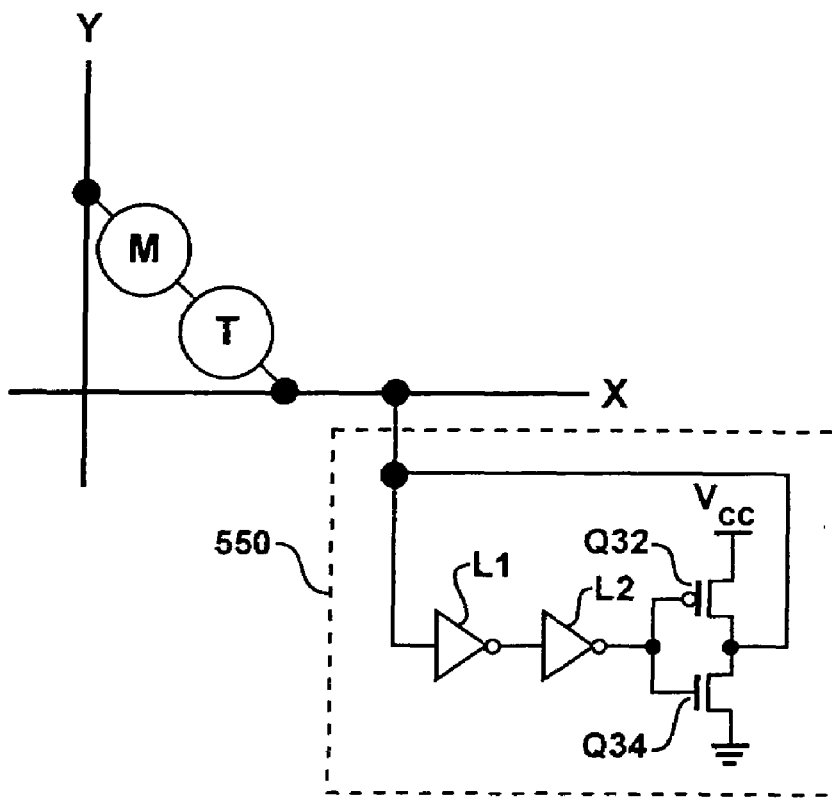
FIG. 15A shows an embodiment of a bleeder circuit coupled to a receiver X line of an X-Y matrix.

When the programmable connection is in the CLOSED state so that the memory element is in the set condition, the threshold switching element remains on as long as the current through the threshold switching element remains at or above its holding current Ih(T). The current through the programmable connection may be kept at or above the holding current Ih(T) by using a bleeder circuit coupled to the receiver line. Examples of such bleeder circuits are shown in FIGS. 12F and 15A for the embodiment of programmable connection that includes a memory element in series with a threshold switching element. (It is noted that a bleeder circuit may also be used where a threshold switching element is coupled between the lines without a memory element such as, for example, the embodiment shown in FIG. 3C).

FIG. 12F shows a memory element coupled in series with a threshold switching element T between an X line and a Y line. In addition a circuit 500 is coupled to the X line at node N20 to help ensure that the threshold switching element T remains on when the programmable connection is programmed CLOSED. In the embodiment shown, the X line is the receiver line. The circuit 500, referred to as a "bleeder" circuit, includes p-channel transistor Q20 and an n-channel transistor Q22. The current through transistors Q20 and Q22 (depending on the state of the connected line) may provide the current through the threshold switching element T to better assure the holding current Ih(T) is maintained (so that the threshold switching element T is kept on after the threshold switch T is programmed to its on state and data is being transmitted though the threshold switch. Transistor Q20 provides a current source coupled to the X line while transistor Q22 provide a current sink coupled to the X line. When the voltage on the X line goes sufficiently low (for example, below a first value), the source transistor Q20 may turn on while the sink transistor Q22 may turn off. A sufficient current may be sourced to keep the threshold switching element on (e.g. a current at or above the holding current Ih(T)). When the voltage on the X line goes sufficiently high (for examples above a second value), the sink transistor Q22 may turn on while the source transistor Q20 may turn off. A sufficient current may be sunk so that the threshold switching remains on.

FIG. 15A shows an alternate bleeder circuit 550 that may also help to maintain a sufficient current through the threshold switching element T (for example, a current at or above the holding current Ih(T) of the threshold switch) so that the threshold switch T remains on. Bleeder circuit 550 comprises an inverter L1, and inverter L2, a p-channel transistor Q32 with source coupled to the power supply voltage Vcc and an n-channel transistor Q34 with source coupled to ground. When the voltage on the X line is sufficiently high, transistor Q34 turns on (while Q32 turns off) and is a current sink pulling current through the series combination memory element and threshold switch from the Y line to the X line. The transistor Q32 sinks sufficient current to keep the threshold switch on. Then when the driver line Y goes low, if the transition from high to low and/or from low to high is fast enough, the threshold switch T says on. In addition, when the driver line Y goes low, the X line tracks the Y line and goes low at an exponential rate but remains at a voltage Vh above the Y line (see FIG. 14). When the X line voltage drops sufficiently, the transistor Q32 turns on (while Q34 turns off). Transistor Q32 is a current source which supplies a current through the series combination from the X line to the Y line. A current is supplied by transistor Q32 which is again sufficient to keep the threshold switch on. The drive of transistors Q32 and Q34 may be reduced (such as by a narrow transistor width W and a long transistor length L) to reduce leakage so long as the current when on exceeds Ih(T). This circuit 550 may be used as an alternative to the circuit 500 and the circuit 500 may be used as an alternative to the circuit 550.

When a bleeder circuit, such as the bleeder circuit 500 (as shown in FIG. 12E) or bleeder circuit 550 (as shown in FIG. 15A) is coupled to the receiver line, the threshold switching element may remain on after it is initially switched on (such as at power-up, by precharging the receiver line appropriately or after programming). It is also possible that the ratios of the drive in transistors Q32 and Q34 may, for example, be adjusted so that the receiver X line floats to a level near one of the V1 levels (for example, Vhigh or Vlow), assuring that when V1 is in the opposite state, the threshold switching element turns on so that the circuit properly initializes. Referring again to FIG. 14, it is seen that after the threshold switching element is switched on by the Vlow to Vhigh transition at time t0, it may remain on by action of the bleeder circuits. Hence, if the programmable connection is CLOSED (so that the total threshold voltage Vth(total) may be Vth(T)) and if, for example, the receiver line is at Vlow at time t0 (for example, it may be precharged to Vlow or 0 volts) and the driver line is forced to Vhigh (for example, Vcc), then it may only be necessary that |Vhigh−Vlow|>|Vth(T)| so that the threshold switching element may be switched on at time t0. In this case, a possible operating condition may be that $$|Vth(T)| < |Vhigh-Vlow| < |Vth(T)+Vth(M)| \qquad (7)$$

or if Vhigh is Vcc and Vlow is 0 volts (or ground), then $$|Vth(T)| < |Vcc| < |Vth(T)+Vth(M)| \qquad (8)$$

Figure 15B:
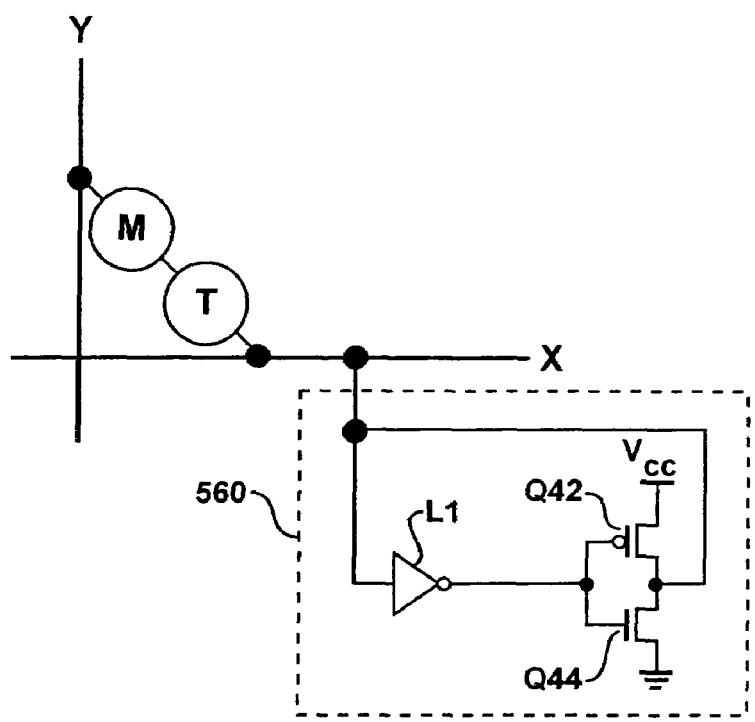
FIG. 15B shows an embodiment of a bleeder circuit coupled to a receiver X line of an X-Y matrix.
Figure 15C:
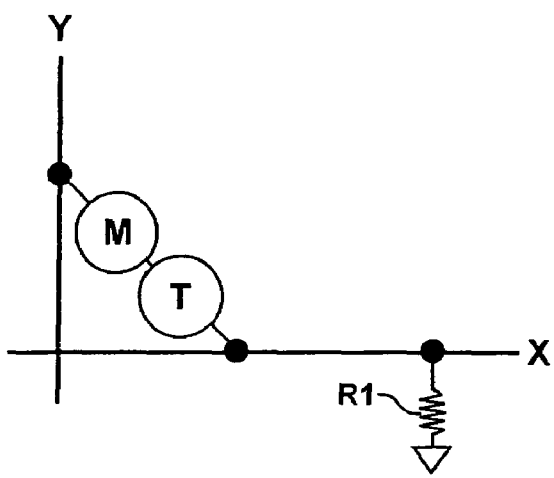
FIG. 15C shows an embodiment of a termination circuit coupled to a receiver X line of an X-Y matrix.
Figure 15D:
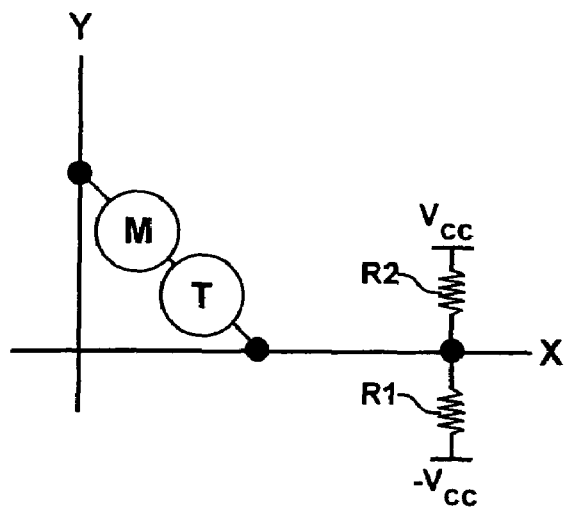
FIG. 15D shows an embodiment of a termination circuit coupled to a receiver line of an X-Y matrix.

FIG. 15B shows a bleeder circuit 560 that may be used to restore a voltage on the receiver line (for example, the X line) which is closer to the voltage on the driver line (for example, the Y line). Hence, the bleeder circuit 560 may be used to help compensate for the drop in voltage (e.g. the holding voltage Vh(T)) due to the threshold switch. Eliminating the drop from Vh(T) may better assure that driven logic gates have full input swings, which may reduce "slightly on" leakage in the receiver logic driven through a programmable connection. The bleeder circuit 560 comprises inverter L1, p-channel transistor Q42 its source coupled to the power supply Vcc, and n-channel transistor Q44 with its source tied to ground. When the voltage on the X line is sufficiently high, the voltage at the gates of the transistors Q42,44 is low so that transistor Q42 is on (while Q44 is off). With Q42 on, it sources a current into the X line so as to boost the voltage on the X line toward Vcc (which may be Vhigh). When the voltage on the X line is sufficiently low, the voltage on the gates of transistors Q42,44 is high so that transistor Q44 is on (while Q42 is off). With transistor Q44 on, it sinks a current from the X line so as to lower the voltage on the X line closer to 0 (which may be Vlow). The bleeder circuit 560 may, in general, be used in combination with any programmable connection between the X and Y lines. However, it is particularly useful for those programmable connections comprising a threshold switch (such as an S-type threshold switch or a chalcogenide threshold switch) to overcome the Vh(T) voltage dropped across the threshold switch T. The drive of transistors Q42 and Q44 may be reduced (such as by narrow transistor width W and long transistor length L) to make driving into the bleeder easier and to allow changing the logic level on the receiver X line when driven by the driver Y line.

The bleeder circuit 560 may be coupled to the receiver line. Referring again to FIG. 14, if a bleeder circuit like that of bleeder circuit 560 of FIG. 15B is attached to the receiver line, the receiver line voltage V2 may continue pulling to the voltage of the bleeder circuit. The voltages of the bleeder circuit may be set to about vhigh (e.g. Vcc) and Vlow (e.g. 0 volts). Hence, when using a bleeder circuit such as bleeder circuit 560, the voltage V2 line may rise close to Vhigh and fall close to Vlow. The voltage V1 may be stable long enough for the voltage V2 to also stabilize. In this case, an operating condition may be that:

$$|Vth(T)| < |Vhigh-Vlow| < |Vth(T)+Vth(M)| \qquad (9)$$

or if Vhigh is Vcc and Vlow is 0 volts, then $$|Vth(T)| < |Vcc| < |Vth(T)+Vth(M)| \qquad (10)$$

which are the same as relationships (7) and (8) above.

For circuits operating at sufficiently high frequency, with minimal delay between driver transactions from low to high or from high to low, it is possible that the bleeder circuits may not have the time to establish full voltages Vhigh (for example, Vcc) and Vlow (for example, 0V or ground) on the receiver line and/or to provide a sufficient current (at or above Ih(T)) to keep the threshold switching element on. Hence, it may be the case that even with the addition of a bleeder circuit that the relationships (1) through (6) may serve as possible operating conditions.

In another embodiment of the invention, it is possible that the memory element may be programmed between two resistance states, each having a non-zero threshold voltage. These may be referred to as resistance states "r1" and "r2". These may, for example, be resistance states along the right side of the current-resistance curve shown in FIG. 7. These resistance states may have resistance values between the set and reset resistance values.

As an example of a possible method of operation, for a programmable connection to be in a CLOSED state, the corresponding memory element may be programmed to the resistance state with the lower resistance. For a programmable connection to be in an OPEN state, the corresponding memory element may be programmed to the resistance state having the higher resistance. When the programmable connection is in the CLOSED state, it may be desired that data be transmitted from the driver line to the receiver line. Hence, in this case it may be desired that the magnitude of the voltage difference V1–V2 between the driver line and receiver line at least temporarily be sufficient to switch on the threshold switching element. Likewise, when the programmable connection is in the OPEN state, it may be desired that data is not transmitted. In this case, it may be desired that the voltage difference across the programmable connection between the driver and receiver lines be insufficient to switch on the threshold-switching element. In this scenario, with the assumption that the resistance of resistance state r1 is less than the resistance of resistance state r2 (with resistance state r1 corresponding to the CLOSED state and resistance state r2 corresponding to the OPEN state) and with the assumption that $|Vth(M)_{r1}|$ is less than $|Vth(M)_{r2}|$ where $Vth(M)_{r1}$ is the threshold voltage of the memory element in resistance state r1 while $Vth(M)_{r2}$ is the threshold voltage of the memory element in resistance state r2, we may have the operating condition that $$|Vth(T)+Vth(M)_{r1}+Vh(T)| < |Vhigh-Vlow| < |Vth(T)+Vth(M)_{r2}| \quad (11)$$

or if Vhigh Vcc and Vlow=0, then $$|Vth(T)+Vth(M)_{r1}+Vh(T)| < |Vcc| < |Vth(T)+Vth(M)_{r2}| \quad (12)$$

If Vh(T) is not a factor, then an operating condition may be $$|Vth(T)+Vth(M)_{r1}| < |Vhigh-Vlow| < |Vth(T)+Vth(M)_{r2}| \quad (13)$$

where $|Vth(M)_{r1}| < |Vth(M)_{r2}|$ or if Vhigh=Vcc and Vlow=0, then $$|Vth(T)+Vth(M)_{r1}| < |Vcc| < |Vth(T)+Vth(M)_{r2}| \quad (14)$$

where $|Vth(M)_{r1}| < |Vth(M)_{r2}|$

In relationships (11) though (14), $Vth(M)_{r1}$ is the threshold voltage of the memory element when in resistance state r1 while $Vth(M)_{r2}$ is the threshold voltage of the memory element when in resistance state r2. If resistance state r2 is the reset state, then $Vth(M)_{r2}$ becomes Vth(M).

Once again, it is noted that a programmable matrix array of the present invention may be operated in many different ways. In certain embodiments, the receiver lines may be left to float when a data signal is being transmitted from driver line to receiver line. In certain embodiments, the receiver lines may be coupled to bleeder circuits and/or biasing circuits (e.g. so that the receiver line is biased through a resistance) and/or termination circuits (e.g. so that the receiver line is terminated through a resistance). FIG. 16C provides an example of a termination circuit comprising a resistor R1 that has one terminal coupled to ground and another is coupled to the receiver X line. It is possible that the resistor R1 be coupled to a voltage other than ground. FIG. 16D provides another example of a termination circuit comprising a first resistor R2 and a second resistor R3. Resistor R2 has a first terminal coupled to the voltage Vcc and a second terminal coupled to the receiver line. Resistor R3 has a first terminal coupled to the voltage −Vcc and a second terminal coupled to the receiver line. Each of the resistors R2 and R3 may be coupled to voltages other than Vcc and −Vcc.

A programmable connection including a series combination of a memory element and threshold switching element may be programmed using a programming voltage Vp. As noted above, the total threshold voltage of the series combination may be equal to about Vth(T)+Vth(M) when the memory element is in the reset state, and the total threshold voltage of the series combination may be equal to about Vth(T) when the memory element is in the set state. Hence, to effectively program the programmable connection between an OPEN and CLOSED states (which corresponds to programming the memory element between its reset and set states, respectively), the programming voltage Vp may be chosen such that Vp>Vth(T)+Vth(M) (or in terms of magnitude, |Vp|>|Vth(T)+Vth(M)|) As noted above, it may be the case that Vth(T) and Vth(M) are chosen so that Vth(T)+Vth(M)>Vcc. In this embodiment for programming the programmable connection, it is thus also preferable that Vp>Vcc, and Vp may also be greater than Vth(T)+Vth(M). The programming voltage Vp should preferably be able to force a current greater than Ireset so that there is sufficient current to program the memory element from its set state to its reset state.

To provide a programming voltage Vp which is greater than the logic power supply voltage Vcc of the chip, a charge pump may be used. The charge pump may be coupled to either an X line or a Y line. Coupling may be through a select transistor that is turned on when programming is desired.

It is noted that an operating voltage of Vcc may be about 2.7 to about 3.3 volts (although other operating voltages are also possible). The threshold voltage of the memory element may be about 1V and the threshold voltage of the threshold switch may each be about 2.5V volt. If a breakdown layer is added, it may be desired to breakdown between about 4 and 5 volts. Thus, unless a higher voltage is furnished, a charge pump may be useful to furnish the higher supply voltage during programming (or an externally supplied voltage for this example of 5.5V may be provided to puncture the breakdown layers, and thereafter either regulated lower or decreased to 4V for programming the memory element and/or threshold switch).

Examples of current pulses for programming the memory element from set to reset as well as from reset to set were discussed above for the memory element alone. That discussion is applicable here as well for, the series combination of memory element and threshold switch. The discussion related to programming a breakdown layer is also applicable to the series combination of memory element and threshold switching element.

When a programmable connection is selected to be programmed, one of the corresponding conductive lines (such as the Y line) of the selected programmable connection may be brought to the programming voltage Vp while the other corresponding conductive line (such as the X line) may be brought to ground voltage. To improve margin against programming the wrong programmable connection, during the programming of the selected programmable connection, the corresponding X and Y lines of the unselected programmable connections may be kept a predetermined voltages that will prevent programming. For example during programming, one or all of the unselected X-Y lines (for example, the X line) may be kept at about ⅔ of the programming voltage Vp while other lines (for example, the Y line) may be kept at ⅓ of the programming voltage Vp. Hence, the potential difference between an X line and a Y line is only about ⅓ of the programming voltage Vp. This bias and programming approach may be used in combination with all of the programmable connections discussed, such as the memory element without the threshold switching element, the threshold switching element without the memory element, and the memory element in series with the threshold switching element. Other biasing approaches and variants may similarly be used, such as programming some or all of the lines at one-half the Vp.

The voltage output provided by a power supply may fluctuate over normal operation. Hence, a power supply that is rated at 3 volts may fluctuate between about 2.7 volts and about 3.3 volts. Hence, the output voltage may be viewed as having a mean (say 3 volts) and a variance. A regulator (such as a band gap regulator) may be used to reduce the fluctuation in voltage of the power supply. That is, the regulator reduces the variance of the power supply voltage. This regulated voltage may be used to supply voltage to any of the components of the integrated circuit such as to program and read the states of the programmable connections as well as to supply power to the logic devices (such as the logic devices coupled to the X and Y lines).

Figure 16A:
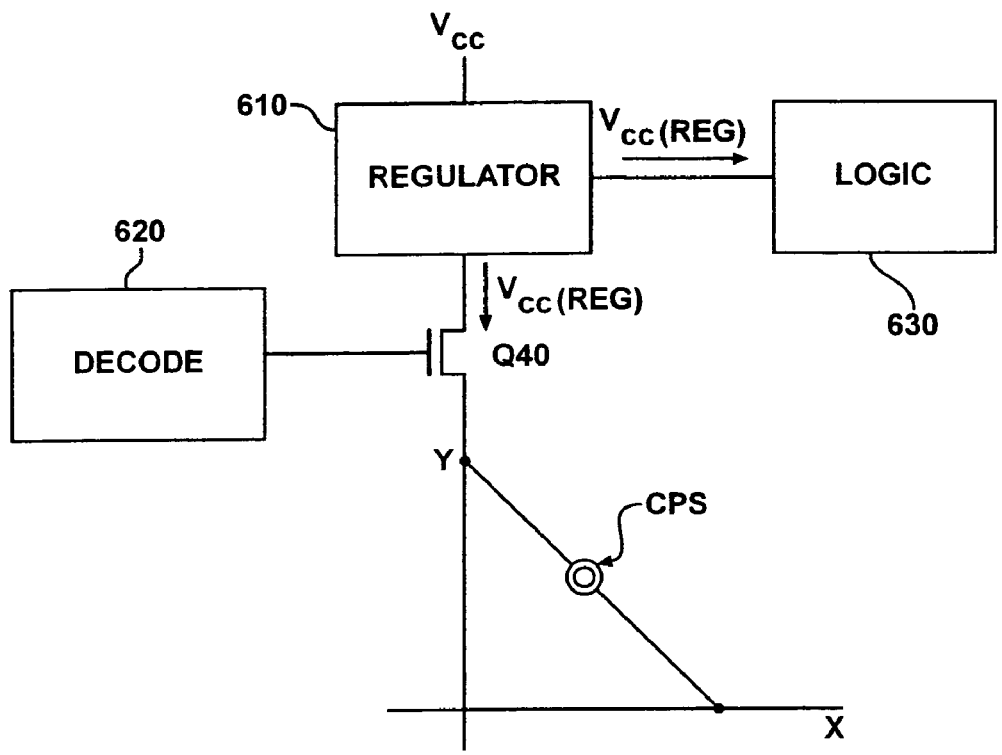
FIG. 16A shows a high level block diagram of a regulator circuit coupled to an X-Y matrix.

FIG. 16A provides a high level diagram of a system that includes a regulator 610. Regulator 610 may be a band gap regulator. An input to the regulator is the power supply voltage Vcc. The output is a regulated voltage Vcc(REG). The output voltage Vcc(REG) is selectively coupled to a Y line of an X-Y matrix through a transistor Q40 controlled by a decode circuit 620. A programmable connection CPS is coupled between the X line and Y line. The programmable connection CPS may be any programmable connection. It may include a memory element (such as shown in FIGS. 5A-D), a threshold switching element (such as shown in FIG. 9A-E) or a series combination of a memory element and threshold switching element (such as shown in FIGS. 12A-F). Of course, the programmable connection may include a breakdown layer in series with the phase-change memory material and/or threshold switching material. The regulator also provides an output voltage Vcc(REG) to the logic devices 630 of the integrated circuit, which may be at a different level, such as programming or puncturing a breakdown layer. The voltage signal that is transmitted across the programmable connection CPS may be a regulated voltage. Hence, the voltage regulator may also be used to reduce the variation in the rail to rail swing of the logic devices coupled to the X lines and/or Y lines.

Figure 16B:
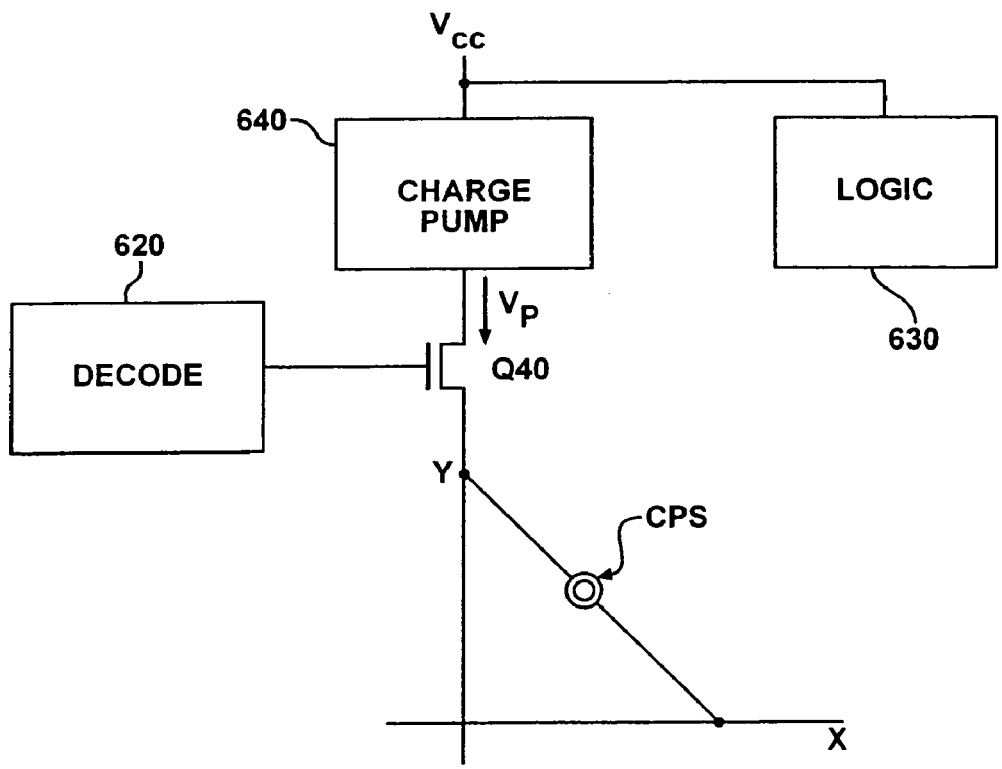
FIG. 16B shows a high level block diagram of a charge pump circuit coupled to an X-Y matrix.
Figure 16C:
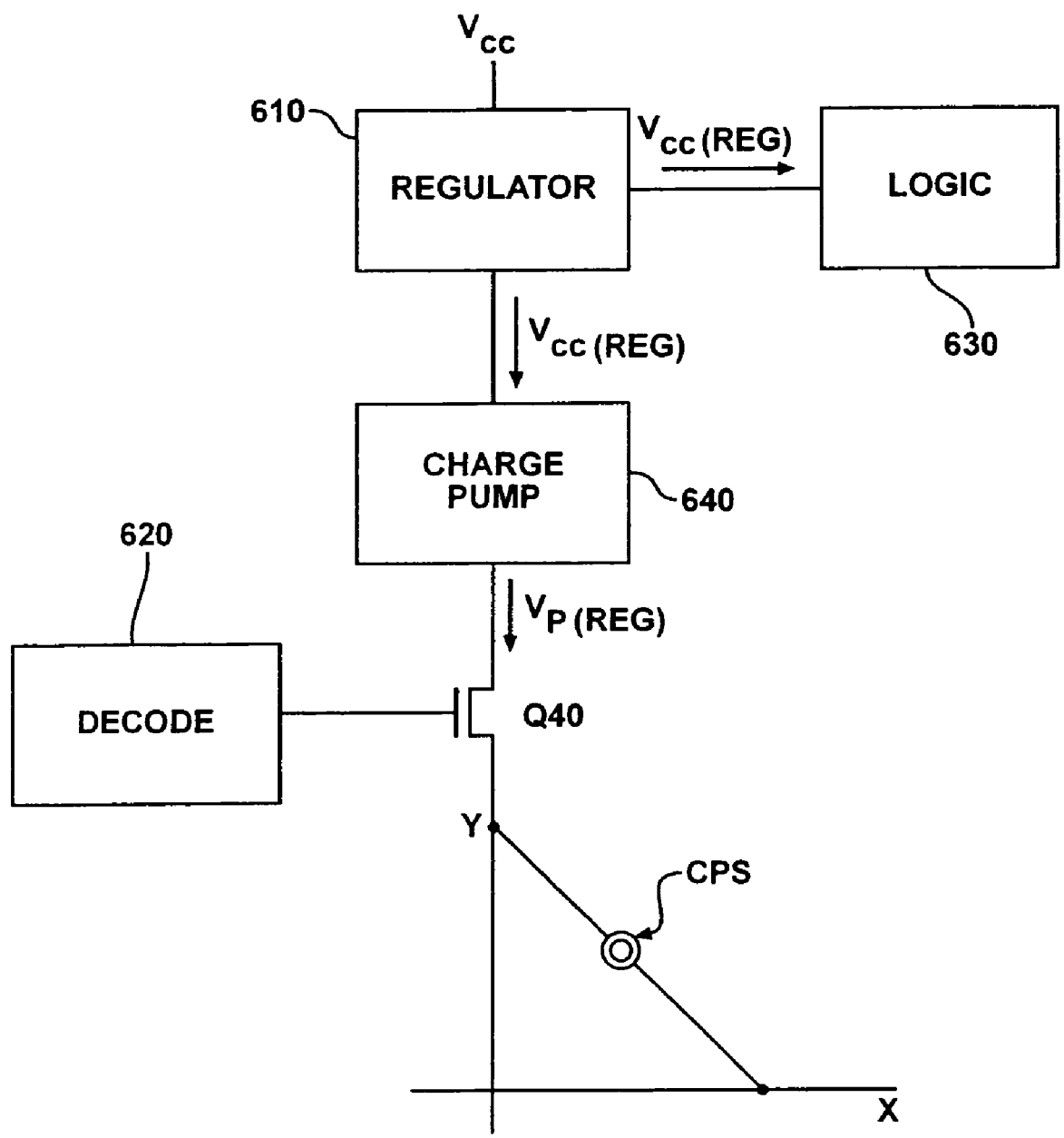
FIG. 16C shows a high level block diagram of regulator circuit and charge pump circuit coupled to an X-Y matrix.

The programming voltage Vp needed to program a programmable connection may be greater than the voltage Vcc that can be supplied by the power supply Vcc. For example, this may be true when the programmable connection comprises a series combination of the threshold switch and memory element, or only one of either. To provide a programming voltage Vp greater than the power supply voltage Vcc, a charge pump may be used. FIG. 16B provides an example of a system that uses a charge pump 640 to provide a programming voltage Vp (where Vp>Vcc) to a selected Y line of an X-Y matrix. Of course, the programming voltage may be provided to the X-line instead. The power supply voltage Vcc may be used to power the logic devices of the integrated circuit.

It may also be desired to regulate the pumped up programming voltage Vp. In this case, a charge pump may be used in combination with a regulator as shown in FIG. 16C. FIG. 16C shows charge pump 640 used to pump up the regulated power supply voltage Vcc(REG) to provide a regulated programming voltage Vp(REG) that is supplied to a selected Y line of an X-Y matrix. The regulated programming voltage Vp(REG) may be supplied to the X line instead. In the embodiment shown in FIG. 16C, the regulated power supply voltage Vcc(REG) is supplied to the logic devices 630. Also, in this embodiment, the regulator 610 is coupled between the power supply voltage Vcc and the charge pump 640. However, it is also possible that, the charge pump 640 be coupled between the power supply voltage Vcc and the regulator so that the power supply voltage Vcc is first pumped up to a voltage Vp before it is regulated.

Generally, one or more (and possibly two or more) different types of programmable connections be used and/or activated in a single integrated circuit or a single programmable matrix array. This includes all types of programmable connections, including but not limited to anti-fuses (FIG. 1), n-channel interconnect transistors controlled by SRAM (FIG. 2), n-channel interconnect transistors controlled by memory elements and threshold switches (examples of which are provided in U.S. patent application Ser. No. 11/032,792 which is hereby incorporated by reference herein), memory elements coupled between X and Y lines, threshold switches coupled between X and Y lines, series combinations of memory elements and threshold switches coupled between X and Y lines, as well as a breakdown layer or anti-fuse in series with these programmable connections. In addition, one or more of the cross-points may be directly connected (e.g. hard wired) such as for reasons of faster write speed or lower resistance to drive an output.

Figure 3E:
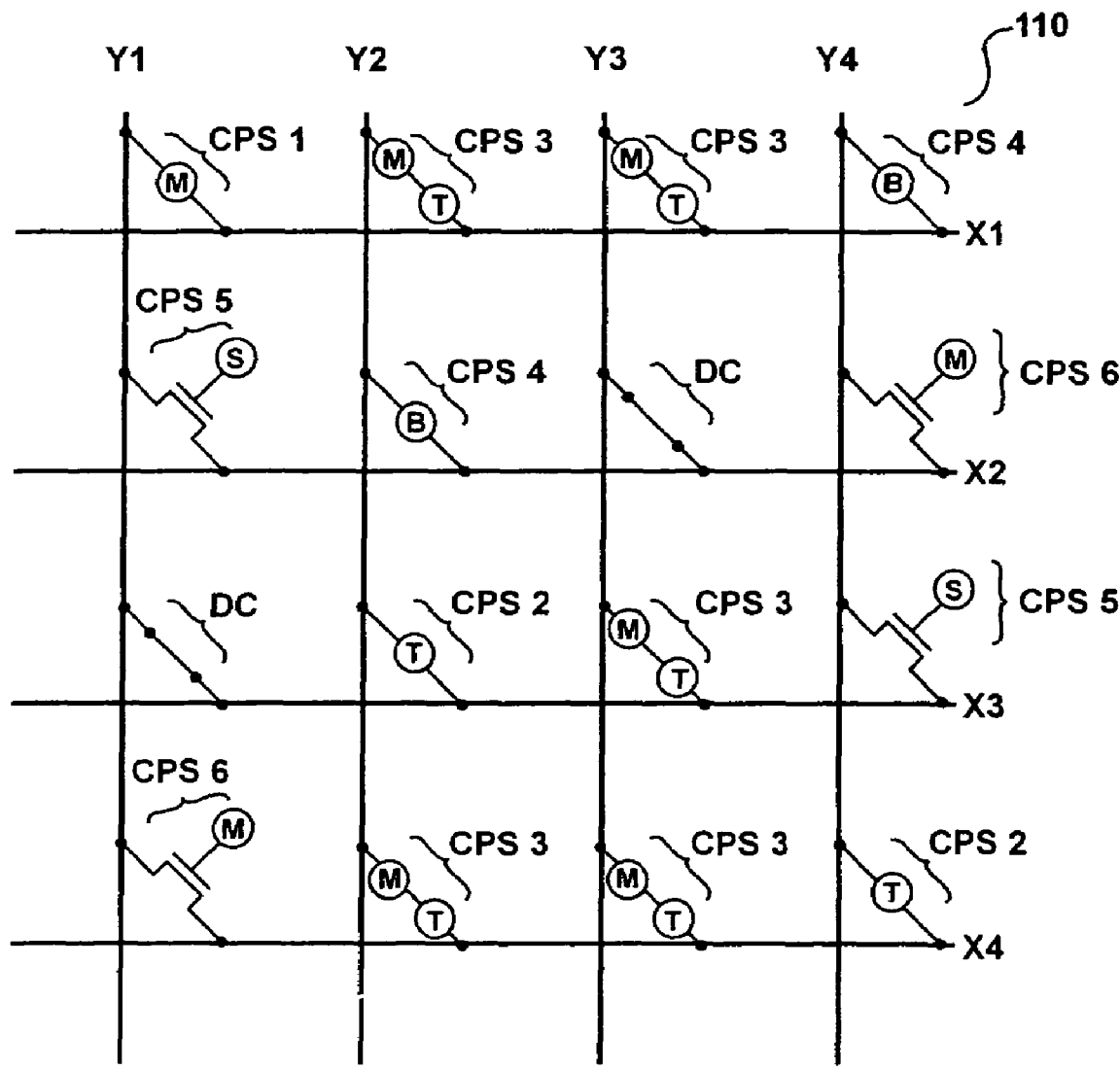
FIG. 3E is an embodiment of a programmable matrix array which includes several different types of programmable connections.

An example programmable matrix array is provided in FIG. 3E which shows a programmable matrix array 110 having X lines X1 through X4 and Y lines Y1 through Y4. The programmable matrix array 110 includes programmable connections CPS1 formed as memory elements, CPS2 formed as threshold switching element, CPS3 formed as memory elements M in series with threshold switching elements T. Other programmable connections CPS4 are formed as breakdown devices B (which may, for example, be anti-fuses). Other programmable connections CPS5 are formed as transistors controlled by SRAM devices S. Other programmable connections CPS6 are formed as transistors controlled by a control unit that includes a phase-change memory element M. Threshold voltage adjustments (such as by varying the thickness of the threshold switching element or memory element, or the programming current applied to the memory element) may improve compatibility of the different circuits when used in the same matrix and/or power supply voltage. Direct connections DC are also used. In the embodiment shown in FIG. 3E, in one or more of the programmable connections CPS1, one or more of the memory elements M and/or threshold switching elements T may include a breakdown layer. In addition, one or more of these breakdown layers may not be broken down while one or more of these breakdown layers may be broken down. If a substantial portion of programmable connections (such as programmable connection formed using a memory elements and/or threshold switches) are not needed for a particular application or market segment, these programmable connections may be fabricated with a breakdown layer and only those programmable connections that are potentially needed are broken down/punctured and tested at the factory to better assure both states are functional. Later, if needed in the field, those programmable connections that were not broken down at the factory may subsequently be broken down in the field and thus made conducting so the programmable connections may be programmed to the low resistance state or reprogrammed to whichever state is desired. Use of a breakdown layer, and leaving a breakdown layer unpunctured until its series programmable connection is actually programmed (or reasonably expected to be programmed) may reduce leakage.

As with gate arrays where the interconnect may be programmed to be an open or short for coupling selected lines through a customized mask, such as a contact mask, here also such mask programming may be used beneficially. For example, certain cross-points that will probably be programmed or tested may be mask programmed to eliminate the thin insulating breakdown layer using a contact so that selected programmable connections may not be insulated by a breakdown layer. In this way, the device need not be broken down which may be an advantage in certain applications by eliminating the breakdown step and related testing. Also, this may avoid applying special conditions or voltages to do the breakdown.

For such contact mask programmable applications, the breakdown layer may be fabricated into all or part of the programmable connections, and thus may be available for use in all or part of the programmable connections. Then, the breakdown layer may be broken down my mask programming through, for example, use of a contact mask. Other ways to break the layer down, such as while processing the wafers at intermediate steps may be through use of a laser to selectively break down the breakdown layer for selected cross-points. Where the breakdown layer alone is the cross point, the connection is then achieved with an anti-fuse, which may be used on lines with other types of connections that may be reversibly programmed in the field, as described in the embodiments herein.

Figure 17:
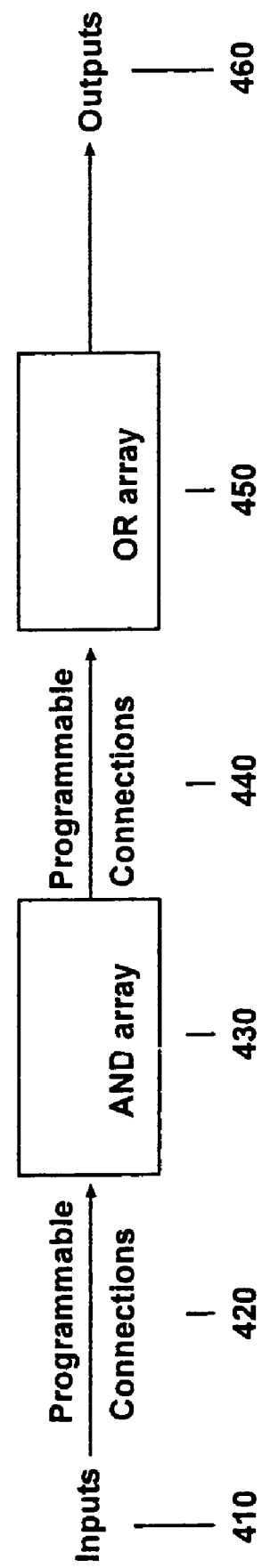
FIG. 17 is a an example of a block diagram of a programmable logic array.

The programmable matrix array using programmable connections made with phase-change materials and/or threshold switching material (with and without breakdown layers) may be used for making programmable logic devices. One type of programmable logic device is a programmable logic array (PLA). A block diagram of a PLA is shown in FIG. 17. As shown in the block diagram, the PLA includes a set of inputs 710, a first programmable matrix array 720 including a first plurality of programmable connections, an AND array 730, a second programmable matrix array 740 including a second plurality of programmable connections, an OR array 750 and a set of outputs 760. Any subset of these combinations may be usefully fabricated.

Figure 18:
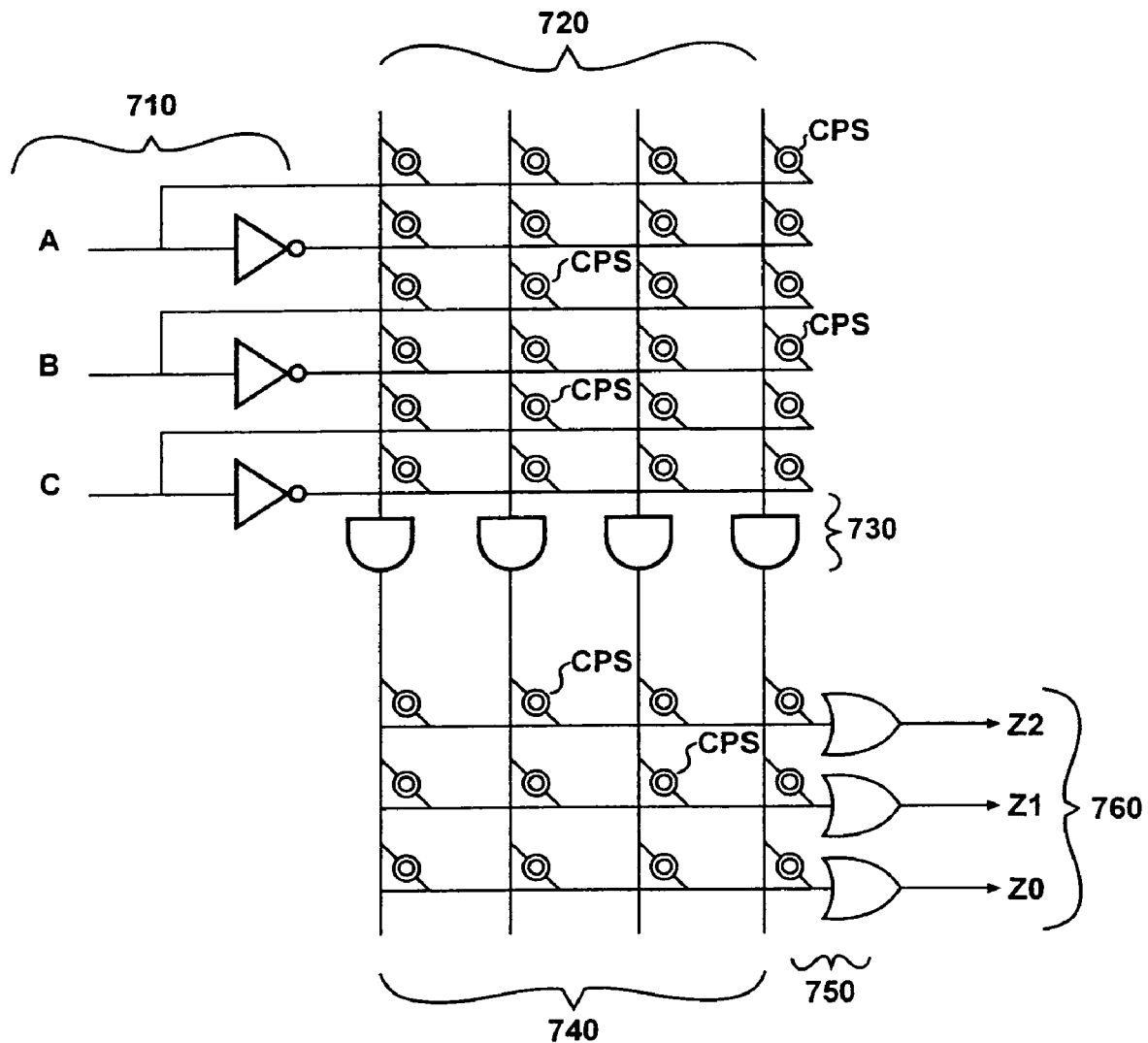
FIG. 18 is an implementation of the block diagram of FIG. 17 using programmable connections.

FIG. 18 is an example embodiment of a PLA. FIG. 18 shows a PLA that includes a set of inputs 710, a first programmable matrix array 720, an AND array 730, a second programmable matrix array 740, an OR array 750, and outputs Z0, Z1 and Z2. In the embodiment shown, the programmable logic array may be implemented using a wired-or approach. Using a wired-or approach, the AND array 730 as well as the OR array 750 may be actually physically implemented using inverting buffers.

The first programmable matrix array 720 includes X lines X1 through X6, Y lines Y1 through Y4 and programmable connections CPS coupling corresponding X lines to corresponding Y lines. Likewise, the second programmable matrix array 740 includes X lines X1 through X3, Y lines Y1 through Y4 and programmable connections CPS coupling corresponding X line or corresponding Y lines.

The programmable logic array includes inputs A, B and C which are each coupled to a corresponding X line (and in a different embodiment may be coupled to a Y line). In the embodiment shown, each of the inputs A, B and C is coupled to an INVERTER logic gate that provides additional inputs INVERTED A, INVERTED B and INVERTED C that are coupled to a corresponding X line of the programmable matrix array 720. Each of the X lines of the first programmable matrix array 720 is coupled directly to an input A, B and C or to the output terminal of an INVERTER logic gate which thereby provides an INVERTED A,B,C to an X line. The inputs A,B,C as well as the output terminals of the INVERTERS provide data signals (e.g. logic signal) onto the X lines of matrix array 720. The signals on the X lines are transmitted across CLOSED programmable connections to corresponding Y lines of matrix array 720 which are inputs to AND array 730. Hence, for matrix array 720, the X lines are the driver lines and the Y lines are the receiver lines (e.g., the X lines drive the Y lines).

The output signals of AND array 730 are placed on the Y lines of matrix array 740. The signals on the Y lines are transmitted through CLOSED programmable connections to the inputs of OR array 750. Hence, for matrix array 740, the Y lines are the driver lines while the X lines are the receiver lines (e.g. the Y lines drive the X lines).

Figure 2A:
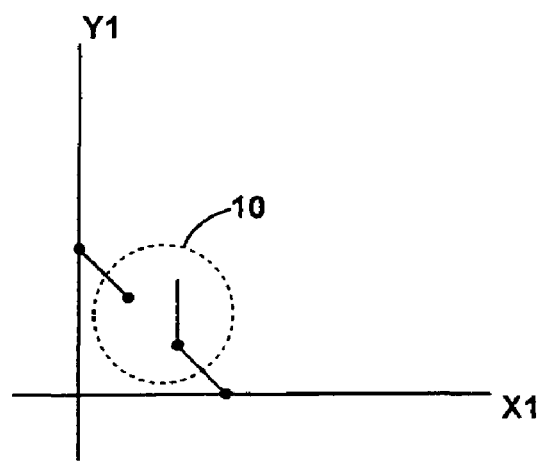
FIG. 2A shows a programmable connection using anti-fuse technology.

Each of the programmable connections CPS may be of the same type. Alternately, two or more different types of programmable connections may be used on the same programmable matrix array. For example, the programmable connections CPS may include at least one programmable connection comprising a phase-change memory material and/or at least one programmable connection comprising a threshold switching material and/or at least one programmable connection comprising a phase-change memory material in series with a threshold switching material. Each of these programmable connection may include or may not include a breakdown layer. In addition, for those programmable connections that include a breakdown layer, it is possible that one or more of the breakdown layer are broken down while others are not broken down. Also, the programmable connections may also include one or more programmable connections of other types such as breakdown devices (e.g., anti-fuses) n-channel transistors controlled by SRAM (for example as shown in FIG. 1), as well as n-channel transistors controlled by memory elements and/or threshold switching elements. As well, it is possible that one or more of the programmable connections be replaced with direct connections made at the factory. Hence, it is possible that many types of programmable connections can be used on the same programmable matrix array.

Figure 19:
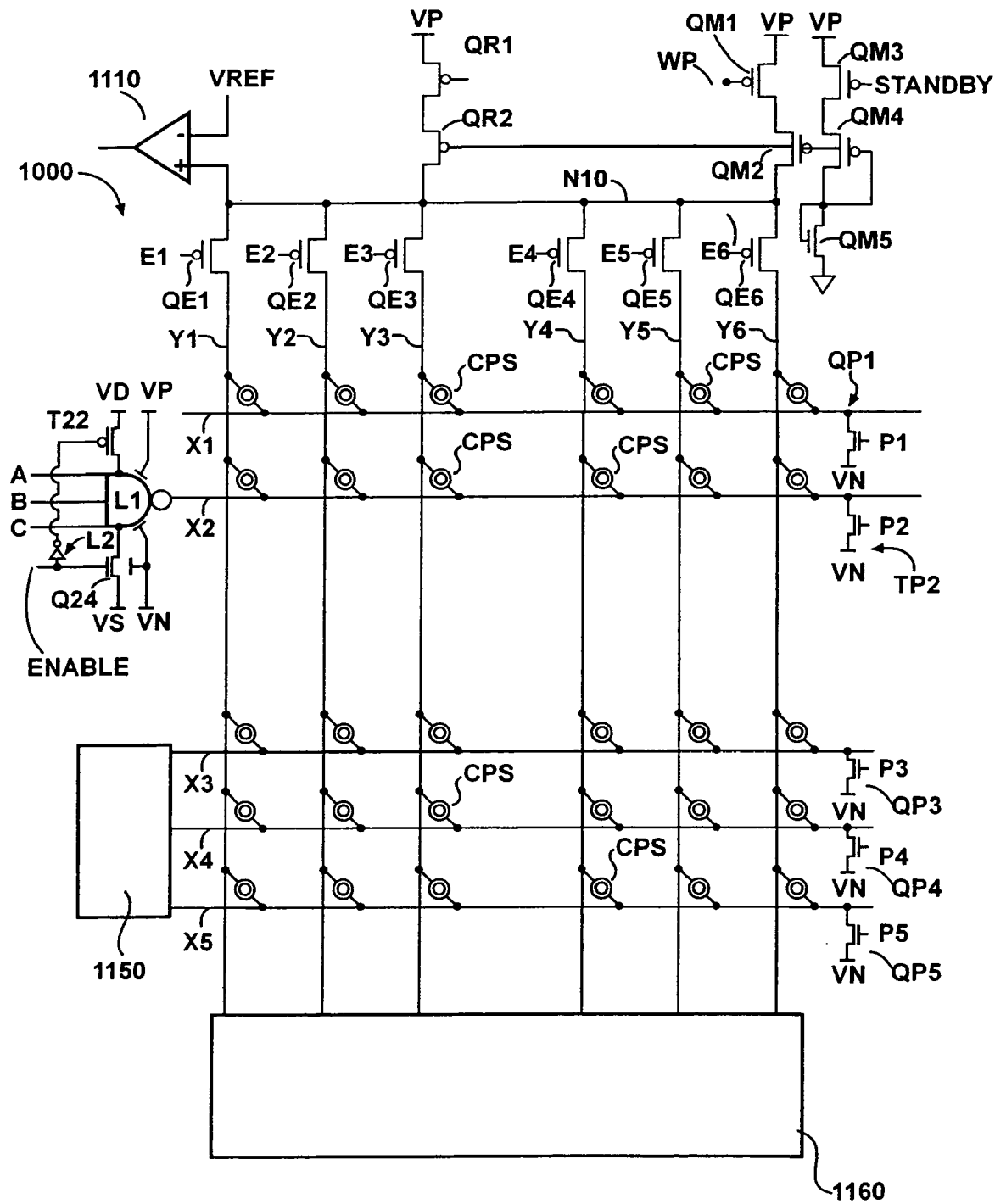
FIG. 19 is an embodiment of a programmable logic device using programmable connections.

Another example of a programmable logic device is shown in FIG. 19. FIG. 19 shows a programmable logic device 1000. The device 1000 includes a plurality of conductive interconnect X lines X1 through X5 and a plurality of conductive interconnect Y lines Y1 through Y6. As noted above, the actual number of X lines may be any integer greater than 0 (and may be an integer greater than 1). Likewise, the actual number Y lines may be any integer greater than 0 (and may be greater than 1). A programmable connection CPS may be coupled between one or more of the X lines and one or more of the Y lines. As shown in FIG. 19, a programmable connection CPS is electrically coupled between an X conductive line and a Y conductive line. A programmable connection CPS is electrically coupled to an X line and to a Y line. While an example matrix is shown on the output of NAND gate L10, such a matrix may also be constructed for programmable input to NAND gate L10.

Further describing this embodiment shown in FIG. 19, the logic gate L10, shown here is a tri-state NAND gate for generality, since almost any logic system may be built from these gates. Variations using NOR gates, tri-state NOR gates, multiplexors, flip-flops, and analog circuits may also be formed. Such circuits may be similarly "open-circuited" from the power supply and interconnect lines by similar tri-state circuits or other means having equivalent effect.

The logic NAND gate L10 is shown to have three inputs A, B and C, however the number is not limited to any particular number. Transistor Q52 is coupled between the power supply of NAND gate L10 (which is voltage Vcc) and NAND gate L1. Transistor Q54 is coupled between gate L1 and voltage Vs. Techniques may be extended to high-z the drive of an electronic function into the couplable lines. The input ENABLE is coupled to the gate of transistor Q54. The input ENABLE is also coupled to the gate of transistor Q54 though the INVERTER logic gate L12. Voltage Vp is coupled to the p-channel well of logic gate L10 while voltage Vn is coupled to the n-channel well of gate L10, if separate programming voltages are used, and otherwise kept at the operating power supply, which may be increased in magnitude for programming.

In the embodiment shown, the output of the NAND gate L10 is coupled to the conductive X line X2. Additional logic gates as well as input terminals may be coupled to any of the other X lines as well. Likewise, it is conceivable that one or more of the input terminal A, B or C may be coupled to one or more of the X lines without going through gate L10.

In the programmable device shown in FIG. 19, the logic NAND gate L10 is enabled for normal operation (and not programming) when the ENABLE input is high, allowing the logic gate L10 to drive it output node either to high or low, levels approximately equal to the power supplies Vcc or Vss, with the logic output state depending on the inputs A, B, or C. The output of NAND gate L10 is driven actively low, for example, only if all the inputs A, B and C are high, and otherwise the output node is driven high. It is noted that while only three inputs A, B and C are shown, it is possible that there be more or less than three inputs.

The logic device 1000 also includes a number of auxiliary lines, useful for the operation thereof. In particular, the logic device 1000 is provided with a supply voltage line Vcc, distributing a supply voltage Vcc through a chip including to the logic device 1000. Depending on the specific application requirements, Vcc may be typically chosen to operate at some voltage, for example here at 3 V. An additional supply line Vp may be furnished for programming programmable connections. A further supply voltage line (such as a ground voltage line GROUND, Vss or Vn) distributes the ground voltage or a negative voltage. To improve margin the power supply may be regulated from the externally supplied power supply using, for example, a band-gap regulator, and increased in value (such as for programming) with a charge pump, implementing these and other helpful functions using techniques familiar to those reasonably skilled in the art.

The programming voltage line Vp provides a relatively higher programming voltage, generated by devices (e.g. charge-pump voltage boosters not shown in the drawing, to a voltage which may also be regulated by a band-gap regulator) integrated on the same chip, or externally supplied to the logic device 1000; for example, the high voltage Vp may be at 3V for normal operation (connected through a pass transistor to Vcc), but at a higher voltage during programming, for example 5V. After programming, Vp may be returned to be at a voltage equal to or greater than Vcc. Alternately, the user may simply increase Vcc for programming so that a separate Vp is not generated on-chip or furnished from off-chip, and then all connections to Vp shown in FIG. 19 could instead be made to Vcc.

In the embodiment shown in FIG. 19, each programmable connection CPS in the example matrix shown is coupled to a corresponding one of the X lines (X1 through X5) and a corresponding one of the Y lines (Y1 through Y6), though this is diagrammatic and the number, sequence or direction of the lines may be changed from that shown. In the embodiment shown in FIG. 19, each X line is coupled to more than one programmable connection CPS. Likewise, each Y line is coupled to more than one programmable connection. Additional "dummy" unused lines may surround the array, as well as alternate redundant repair lines for field repair alternatives should a selected cross-point not program. Means may be provided so that unselected Xn lines are at the peak programming voltage times ⅔, and the unselected Yn lines are at the peak programming voltage times ⅓ to improve margin against programming an unselected cross-point.

Block 1150 represents additional circuitry coupled to the X-Y matrix such as input terminals and to logic gates. Block 1160 also represents additional circuitry coupled to the X-Y matrix such as output terminals and/or from logic gates.

Of course, it is possible that not all of the cross-points are coupled using a phase-change programmable connection. Some of the X-Y cross-points may simply be left in an OPEN connection. Also, some of the X-Y cross-points may be connected using mask programmable connections.

In particular, within each cross-point cell, a CPS cross-point element has a first terminal coupled to a corresponding X line and a second terminal coupled to a corresponding Y line. The order of coupling the programmable connection to the lines may be reversed.

In one embodiment, the phase-change programmable connection CPS within the matrix is accessed by selecting the corresponding X line and Y line to which is it coupled. For example, for the device 1000 shown in FIG. 19, each X line X1 through X5 is respectively coupled to a select transistor QP1 through QP5 (each of which is also coupled to a voltage Vn). The state of each transistor being controlled by gate inputs P1 through P5, respectively.

Likewise, each Y line Y1 through Y6 is respectively coupled to a transistor QE1 through QE6 (each of which is also coupled to node N10). The state of each transistor is controlled by gate inputs E1 through E6, respectively.

On power up in this and other embodiments, a QPn and QEn may be used to force a drive and receiver line to opposite logic states to help assure that a programmable connection intended to be CLOSED during operation enters the low resistance state. For example, a threshold switch in series with a memory in the set state may be turned on. Similarly, the QPn transistor can help assure a rapid trailing edge on programmable switches that are intended to be OPEN (by quenching the node rapidly after programming) through placement not just on receiving lines but also on driving lines (and then turned on when the QEn drivers are turning off.

For example, an X line X1 may be selected by turning on its respective select device QP1 using the select line P1 coupled to the gate of transistor QP1, such as by raising P1. Similarly, Y line Y1 may be selected by turning on QE1 through lowering the line E1 (coupled to the gate of QE1) to ground.

An X line selector circuit as well as a Y line selector circuit may me coupled to the logic device 1000. These circuits are preferably decoding circuits which operate to perform the selection of the X and Y lines to be coupled by a given programmable connection at a cross-point. The programmable connection CPS may be selected on the basis of an X address binary code such as XADD and a Y address binary code YADD, respectively, which are part of a cross-point address binary code ADD, for example received by the device 1000 from a device external to the memory (e.g., a microprocessor).

The X line selector circuit decodes the X address code XADD and select a corresponding one of the X lines X1 through X5. The Y line selector circuit decodes the Y address code YADD and select a corresponding Y line. More generally, both a pull-up (like that on the Y lines) and pull-down (like that on X lines) may both be provided on each Y line or each X line, or both. Programmable connection CPS may be programmed for forcing current only in one direction, or may be programmed through forcing current in the other direction, or both directions periodically (such as to improve endurance).

The Y line selector circuit may be coupled to additional read/write circuits. The read/write circuits preferably include components which are normally required for writing the desired logic values into the selected programmable connections (if the logic gate output connected is not used), and may include circuitry for reading the logic values currently stored therein to verify programming if necessary. For example, the read/write circuits may include a timing logic circuit for use after receiving an ADD and write command, sense amplifier circuits together with comparator circuits if read verify required, reference current/voltage generators and current generators for reading and writing the logic values stored in the programmable connections such as current mirror(s) (like transistors TM3 and TM4) and current drivers (like transistors TM1 and TM2). As shown in FIG. 19, an input line STANDBY is coupled to the gate of QM3 to reduce power when not programming. These and other techniques may be used by one familiar in the art.

If square pulses are used for writing both set and reset, then two different sizes of write current drivers (or voltages) like QM2 may be provided, each with a select on/off switch like QM1. Voltage or current compliance to avoid over-voltage or over-current may be provided by adjusting Vp and device sizes.

If trailing edge programming is used for better tolerance to changes in bit programming characteristics, only the one shown is needed, and the current may be set adequately high, such as at 2 ma or more to minimize or avoid the need to verify/rewrite (the higher current being at the expense of endurance for repeated write cycles). Then, the WP line (coupled to the gate of QM1) switches rapidly from low to high to turn off QM1, and hence the current in QM2 is quenched rapidly. If high capacitance on the node N10 (common to QE1 through QE(N)), a quench pull-down may be furnished to assist rapid pull-down internally to the X-Y matrix on the selected Y line Y1. Such pull-down may be on the common node to save area. After writing is complete with the current source off and voltage between the couplable lines quenched, Vp may be lowered to equal Vcc and the input P1 (corresponding to the selected X line X1) is taken low. Then ENABLE line may be taken high to complete the cycle by enabling the logic.

Upon requesting the write cycle, the logic may be disabled, such as by taking tri-state input ENABLE low or by putting the gate output state to the voltage level suitable for writing (if necessary by raising Vcc or lower VS). Tri-stating the output by forcing it into hi-z condition, assures that a line to be coupled is not actively driven by a logic gate so that the write circuit may operate more directly on a selected cross-point without fighting the logic gate output, and may thus allow use of a current driver for writing or reading.

Alternately, in a larger array with more leakage, a voltage force approach may be used that assures adequate voltage across the selected cross-point to be written so write current exceeds Ireset, regardless of the parallel leakage also driven. Once the write cycle is complete, the tri-state may be re-enabled logic gate output or may be used for other functional purposes, if ENABLE is not made common to all gates for programming.

By such cross-point programming to a lower resistance, connections from the logic may be made to Y and X, and in turn to inputs to gates, as is familiar to those into the art.

To minimize standby current, only those programmable connections potentially needed for a given customer's type of circuit need be tested and available for programming. In the extreme, all programmable connections at each of the cross-point may be tested at the factory, meaning any breakdown devices are made conducting and cause leakage if not programmed to the low resistance state.

As a further alternative, an optional read circuit comprising transistors QR1 and QR2 may be utilized, that is enabled whenever QR1 is low and turns on the current mirrored into QR2. To check the programming of a bit with the logic tri-stated hi-z by lowering ENABLE, a read current is driven into the selected cross-point, as determined by the selected line E1 through E6 and the selected line P1 through P5. The resulting voltage can be compared using comparator 1110 (having a positive input terminal coupled to node N10 and a negative input terminal coupled to voltage VREF) to determine if the resistance is adequately low after programming (or adequately high if being reset). If not, the programmable connection may be reprogrammed or replaced with a redundant fuse or path if available. As part of this procedure, the programming current may be increased to assist programming a recalcitrant programmable connection. The value of the increased current may be stored and used for subsequent write cycles, or integrated into a "rolling cumulative average" algorithm.

By tri-stating the logic, any diversion of programming current into a logic gate output is minimized. Also, the voltage forced on a logic output may be increased above Vcc during program. To avoid diverting programming current from Vp through the output diode to its well, any isolated wells may be tied respectively, to the more positive voltage for the p-channel well and to the more negative voltage for the n-channel well (or the well is simply grounded if a separate Vn is not used).

Vp may be at or above Vcc when Vcc is powered. Vn may be left at ground in some applications where not needed to force adequate programming voltage and current. The tri-state devices Q52 and Q54, relative to the transistors used in L10, may have longer L (channel length) or utilize a thicker gate insulator to facilitate the relatively higher voltage seen during programming.

For a matrix in which a large number of cross-points are connected to a given couplable interconnect line, biasing of deselected lines during programming may be desirable. For example, deselected lines may be either floated (as shown), or may be hooked through a pass transistor of limiting resistance to an intermediate biasing voltage, such as Vcc during programming to further provide margin against incorrectly programming the wrong cross-point during programming. Or, the X lines may be biased at ⅔Vprogram(max) and the Y lines may be biased at ⅓Vprogram(max).

The current or voltage forced during programming may be adjustable at the factory such as by paralleling additional transistor QM5 to increase the current in QM2 (as reflected by the mirror) or additional QM1 and QM2 may be paralleled and engaged by separate WP circuits, and such additional current and voltage programming options, among other helpful options familiar to those skilled in the art, may be implemented by algorithm and timing, both at the factory or in the field using an on or off-chip processor.

Since the driver devices only occur once along a line, the drivers may be oversized and deliver two or three times more current than required to better provide higher resistance resets (and lower leakage). Similarly, extending the trailing edge to be much slower than minimum, such as by use of more than 1 usec for trailing edge slope from peak to 10% of peak, may better assure lower resistance sets for applications demanding higher performance through lower sets (for better delay) or higher resets (for more voltage margin and lower leakage). Using a slower trailing edge programming method with the same current as Ireset for both set and reset may degrade endurance but allows more variation in contact size and alloy content, and hence may contribute to better yield, especially for applications that specify programming endurance at less than Flash where the firmware is infrequently reloaded or changed.

It is noted that in one embodiment of operating the programmable connection, the programming of the phase-change programmable connection from a high resistance state to a low resistance state may use a slower trailing edge turn-off relative to the trailing edge turn-off edge rate for programming the programmable connection from its low resistance state to its high resistance state.

While providing a separate driver for each interconnect line allows optimizing the driver size and programming method, another embodiment may use an existing logic gate output driver to drive a line either low or high. In such applications, an extra (overriding) input may be provided to such logic gates as will be apparent to those familiar with the art. Accordingly, programming may be done with an adjusted power supply voltage where current is limited appropriately by the internal output driver resistance and dV/dI of the phase-change material, using a higher Vp for reset and lower Vp for set, the line to be (connected to the line driving by the logic gate output) still selected to the opposite power supply by the selection driver shown.

For larger gate count circuits or those with a large number of cross-points of interconnect lines, leakage may be reduced by biasing the circuit for normal operation at a lower voltage relative to the threshold voltages of the memory elements and/or threshold switching elements. For example, to minimize battery leakage, the operating voltage may be less than half the threshold voltages. Or, for further reduction, a standby mode may be provided wherein the operating voltage is reduced to be less than half of the threshold voltages, or even zero.

The resistance of the reset phase-change memory in its reset state is non-linear. Hence, leakage is further reduced even more than a proportionate reduction in power supply because cross-points biased at a lower voltage also have a relatively higher resistance. Since the cross-point is a more like a resistor than a transistor like current source, leakage is reduced by lowering voltage. Accumulated over many open cross-connects that are programmed to be OPEN, battery drain may be reduced by increasing resistance or lowering voltage. Alternately, leakage may be reduced by use of the breakdown layer and breaking down only those breakdown layers that will probably be normally programmed. Even untested, most if not all may still be field programmable if later needed.

Leakage may be reduced and/or higher power supply voltages accommodated by adding a threshold switching element (also referred to as a threshold switch) in series with a phase change memory element (where the phase-change memory element is formed with or without a breakdown layer) as shown in FIGS. 12A-F.

Although the present invention has been described above with a certain degree of particularity with reference to preferred embodiments thereof, it should be understood that various changes in the form and details as well as other embodiments are possible. For example, the cross-point cells can be wired in parallel to reduce set resistance. Moreover, it will be apparent to those reasonably skilled in the art that the additional features providing further advantages are not essential for carrying out the invention, and may be omitted or replaced with different features more advantageous for a particular application. A person skilled in the art may apply to the solution described above many modifications and alterations all of which, however, are included within the scope of protection of the invention as defined by the claims herein.

Figure 20A:
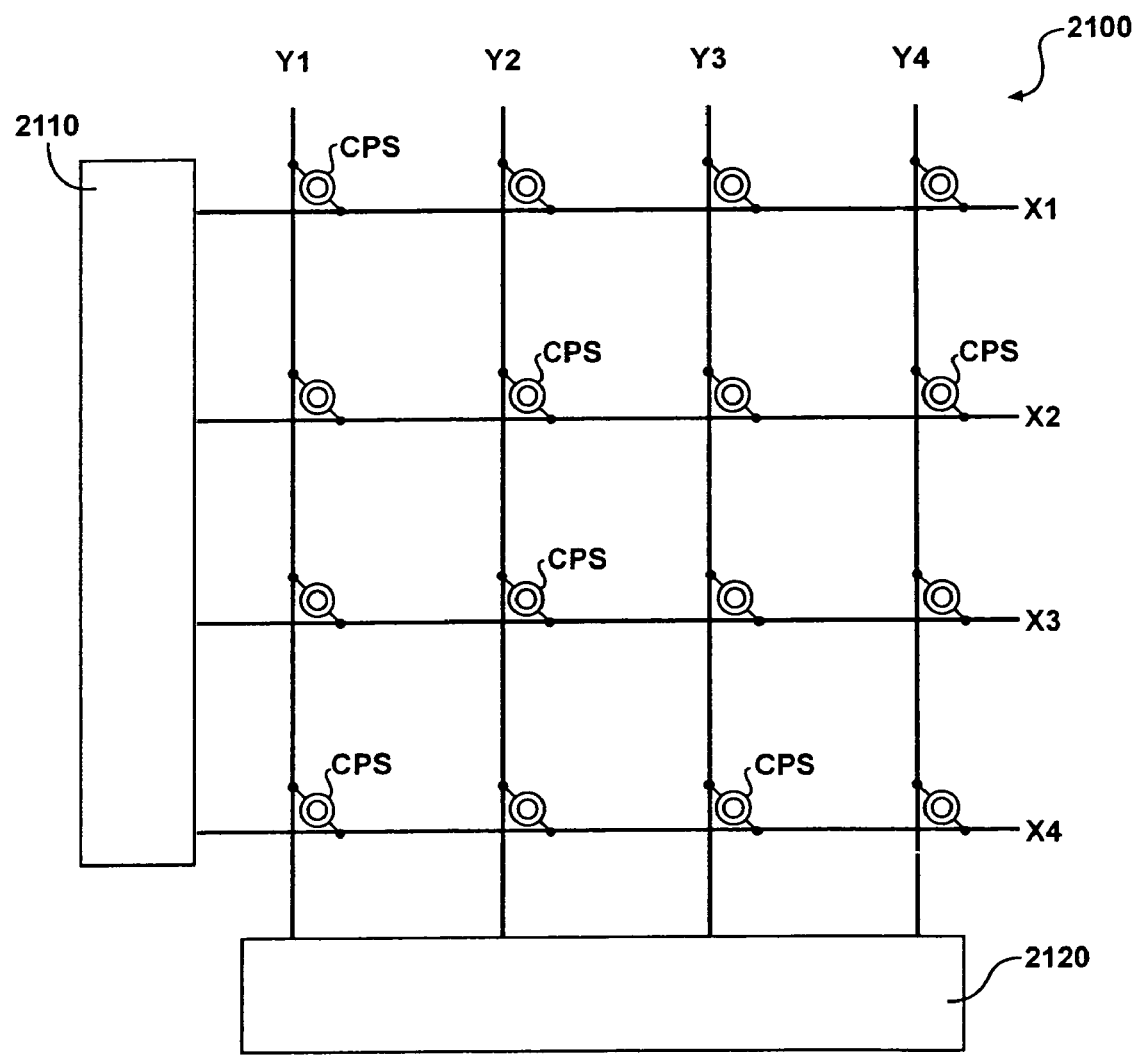
FIG. 20A shows a programmable matrix array where the X lines are driver lines and the Y lines are receiver lines.

FIGS. 20A,B provides several examples of how a programmable matrix array may be combined with logic gates and/or inputs and/or outputs. The example of FIG. 20A shows programmable matrix array 2100 comprising X lines (X1 through X4), Y lines (Y1 through Y4) and programmable connections CPS. In FIG. 20A, the X lines are coupled to circuit 2110 while the Y lines are coupled to circuit 2120. Circuit 2110 may represent inputs and/or logic gates and/or transceivers that are coupled to the X lines. Likewise, block 2120 may represent inputs or outputs and/or logic gates that are coupled to the Y lines. In one embodiment, circuit 2110 may be inputs while circuit 2120 may be logic gates. In another embodiment, circuit 2110 may be logic gates while circuit 2120 may be outputs. In another embodiment, circuit 2110 may be logic gates and block 2120 may also be logic gates. Circuit 2110 may include both inputs and logic gates that are coupled to the X lines. Likewise, circuit 2120 may include both logic gates and outputs that are coupled to the Y lines. In the example of FIG. 20A, the X lines are the driver lines while the Y lines are the receiver lines (the X lines drive the Y lines).

Figure 20B:
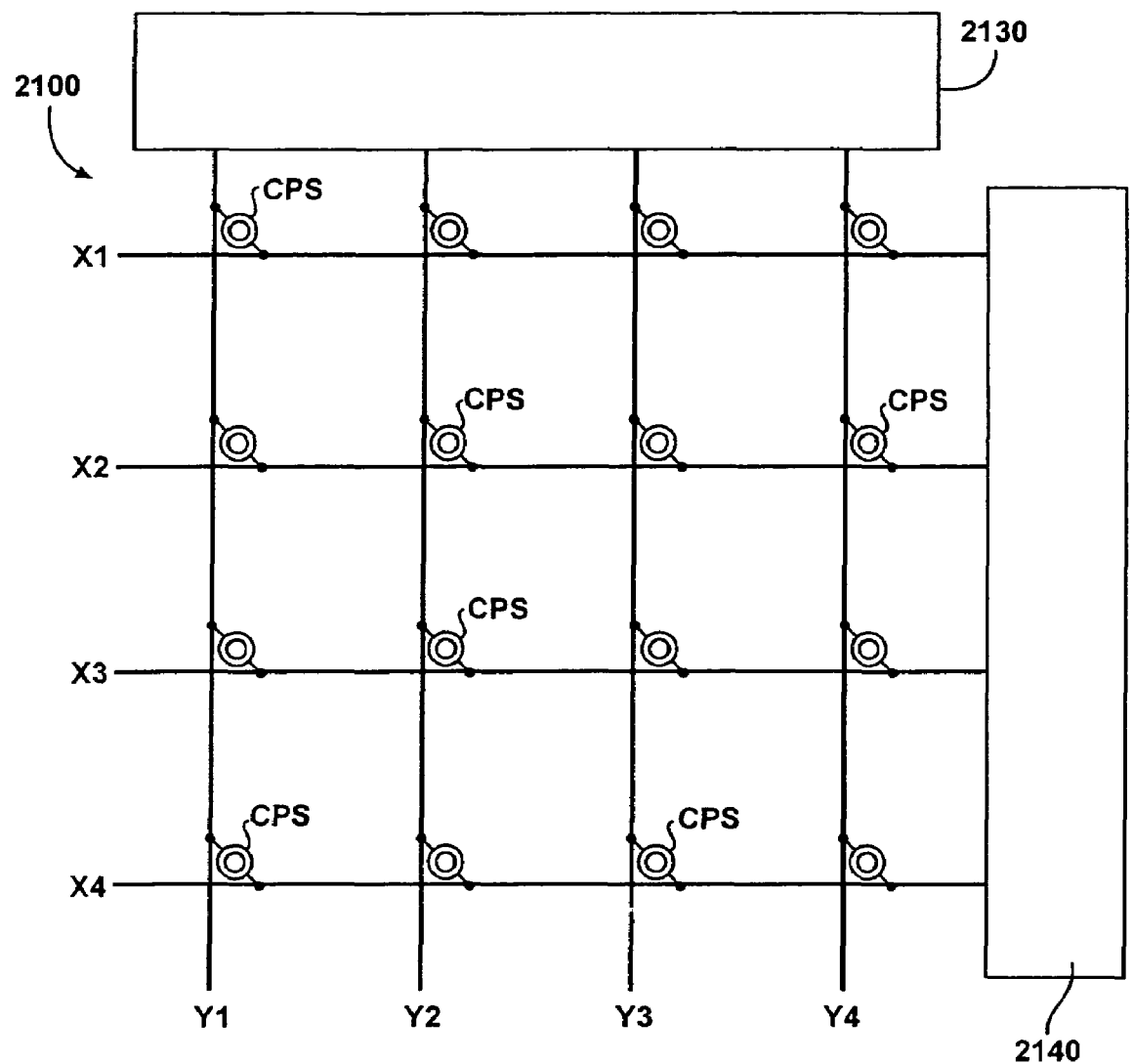
FIG. 20B shows a programmable matrix array where the Y lines are driver lines and the X lines are receiver lines.

The example of FIG. 20B shows programmable matrix array 2100 comprising X lines (X1 through X4), Y lines (Y1 through Y4) and programmable connections CPS. In FIG. 20B, the Y lines are coupled to circuit 2130 while the X lines are coupled to circuit 2140. Circuit 2130 may represent inputs and/or logic gates that are coupled to the Y lines. Likewise, circuit 2140 may represent outputs and/or logic gates that are coupled to the X lines. In one embodiment, circuit 2130 may be inputs while circuit 2140 may be logic gates. In another embodiment, circuit 2130 may be logic gates while block 2140 may be outputs. In another embodiment, circuit 2130 may be logic gates and circuit 2140 may also be logic gates. Circuit 2130 may include both inputs and logic gates that are coupled to the Y lines. Likewise, circuit 2140 may include both logic gates and outputs that are coupled to the X lines. In the example of FIG. 20B, the Y lines are the driver lines while the X lines are the receiver lines (the Y lines drive the X lines).

A logic gate may perform a logic operation. In one or more embodiments, a logic gate may, for example, perform at least one logic operation selected from the group consisting of INVERSION, AND, OR, EXCLUSIVE OR, NAND, NOR and EXCLUSIVE NOR. In one or more embodiments, a logic gate may, for example, perform at least one logic operation selected from the group consisting of AND, OR, EXCLUSIVE OR, NAND, NOR and EXCLUSIVE NOR. It is conceivable that other types of logic operations may be possible. In another embodiment, one or more of circuits 2110, 2120, 2130 and 2140 may represent logic blocks. A programmable matrix like 2100 may be used to program feedback selectively or programmably from logic outputs to inputs gate or other gates driving into the output (as will be familiar to those reasonably skilled in the art).

Figure 22A:
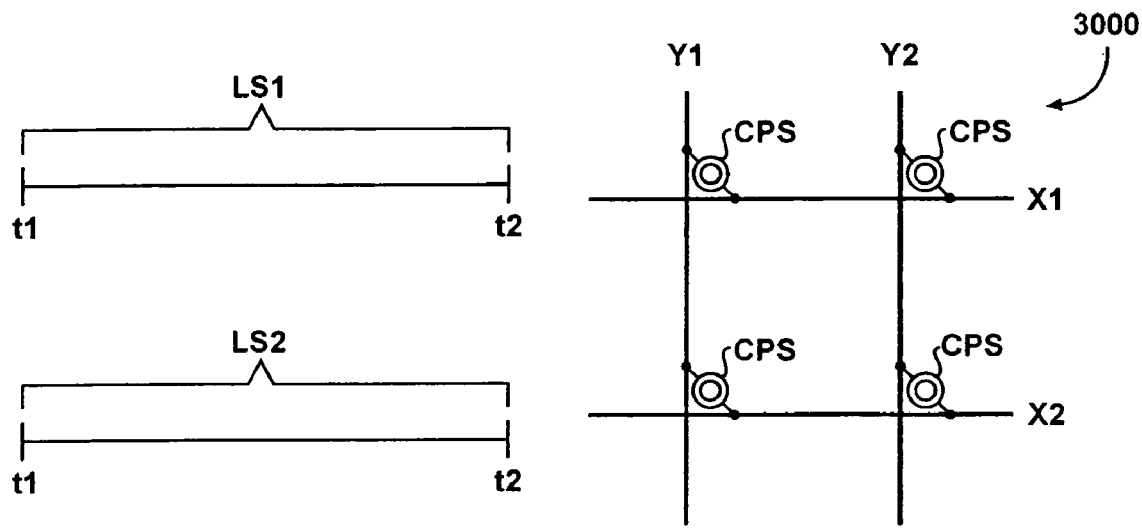
FIG. 22A shows an embodiment of a method of operating a programmable matrix array.

An embodiment of operating a programmable matrix array may be to apply signals to at least two of the X lines (and/or to at least two of the Y lines) substantially simultaneously. The embodiment shown in FIG. 22A shows a programmable matrix array 3000 comprising Y lines Y1 and Y2 as well as X lines X1 and X2. A programmable connection CPS is coupled between a corresponding X line and a corresponding Y line. The programmable connection CPS may be any type of programmable connection including, but not limited, to any of the programmable connections described herein.

In the embodiment shown in FIG. 22A, a signal LS1 is applied to the X line X1 and a signal LS2 is applied to the X line X2. The form of each signal is not shown. Each may be any type of signal including an analog signal and/or digital signal. Each may be a binary signal. Each may be an electrical signal such as a voltage or a current. Both signals are applied from time t1 to time t2. The signals are applied simultaneously.

Figure 22B:
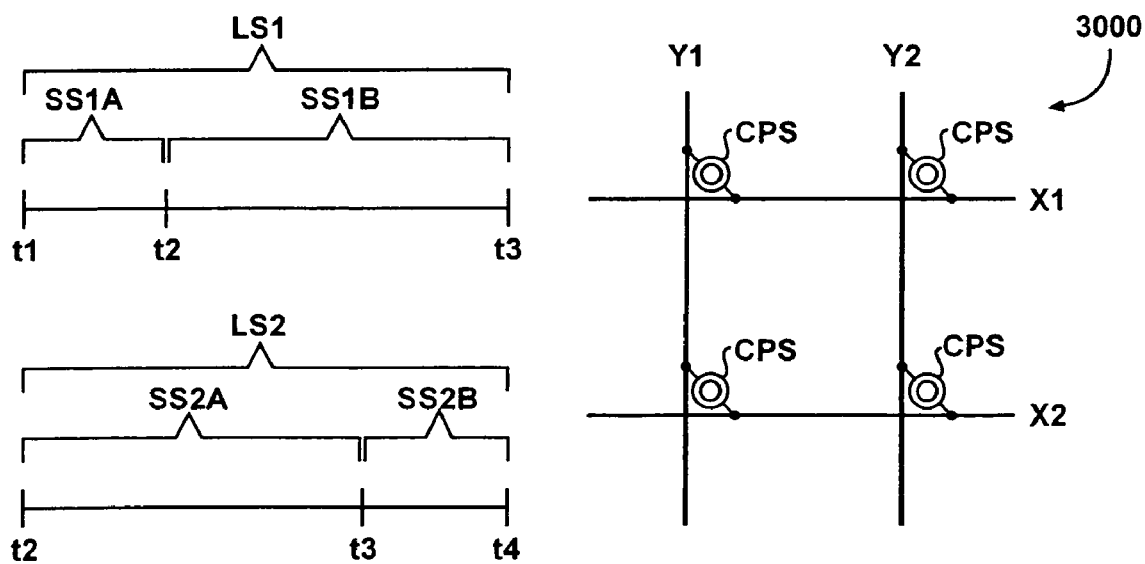
FIG. 22B shows an embodiment of a method of operating a programmable matrix array.

Another embodiment of operating a programmable matrix array is shown in FIG. 22B. In this embodiment, a signal LS1 is applied to line, X1 from time t1 to time t3 and a signal LS2 is applied to line X2 from time t2 to time t4. Signal LS1 includes a first portion (signal SS1A) from time t1 to t2 and a second portion (signal SS1B) from time t2 to time t3. Signal LS2 includes a first portion (signal SS2A) from time t2 to time t3 and a second portion (signal SS2B) from time t3 to time t4. The second portion of signal LS1 (signal SS1B) is applied simultaneously with the first portion of signal LS2 (signal SS2A). Signal SS1B is applied simultaneously with signal SS2A. Signal SS1B and signal SS2A are both being applied from time t2 to time t3.

Figure 22C:
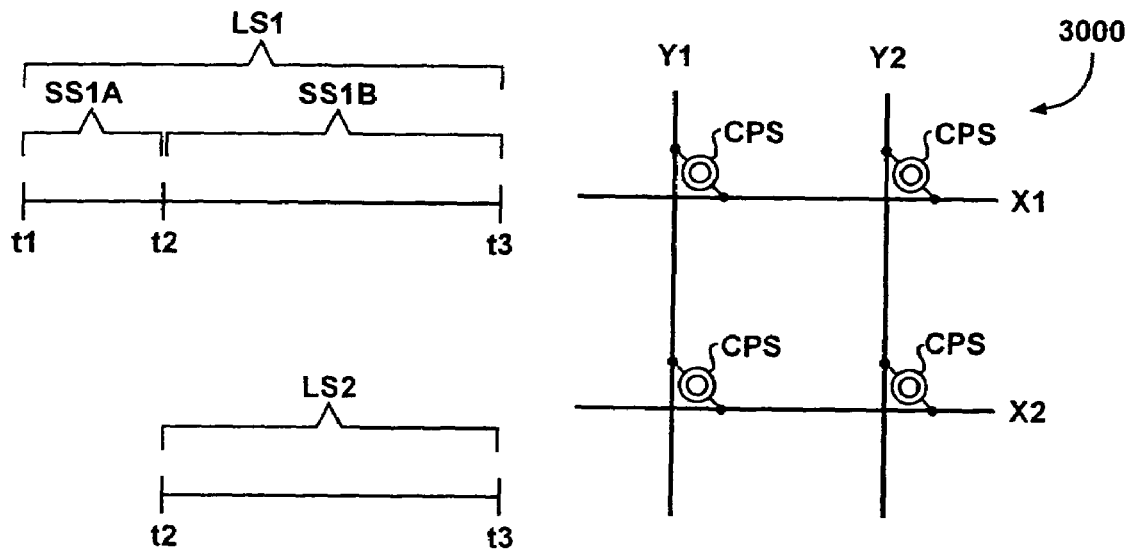
FIG. 22C shows an embodiment of a method of operating a programmable matrix array.

Another embodiment of operating a programmable matrix array is shown in FIG. 22C. In this embodiment, a signal LS1 is applied to line X1 from time t1 to time t3 and a signal LS2 is applied to line X2 from time t2 to time t3. Signal LS1 includes a first portion (signal SSLA) from time t1 to t2 and a second portion (signal SS1B) from time t2 to time t3. The second portion of signal LS1 (signal SS1B) is applied simultaneously with signal LS2. Signal SS1B is applied simultaneously with signal LS2. Signal SS1B and signal LS2 are both being applied from time t2 to time t3.

Figure 22D:
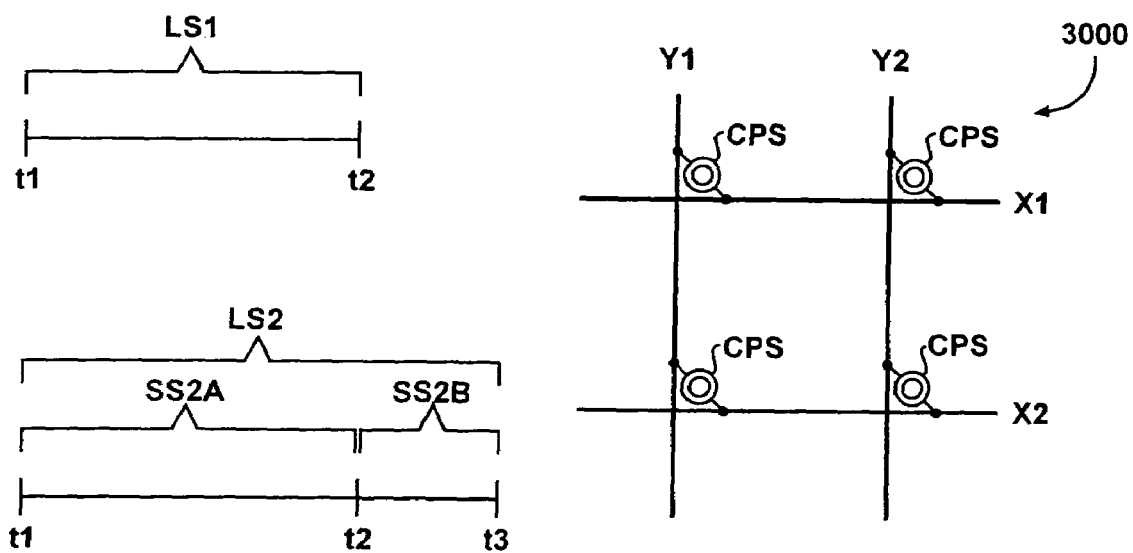
FIG. 22D shows an embodiment of a method of operating a programmable matrix array.

Another embodiment of operating a programmable matrix array is shown in FIG. 22D. In this embodiment, a signal LS1 is applied to line X1 from about time t1 to about time t2 and a signal LS2 is applied to line X2 from about time t1 to about time t3. Signal LS2 includes a first portion (signal SS2A) from time t1 to time t2 and a second portion (signal SS2B) from time t2 to time t3. Signal LS1 is applied simultaneously with the first portion of signal LS2 (signal SS2A). Signal LS1 is applied simultaneously with signal SS2A. Signal LS1 and signal SS2A are both being applied from time t1 to time t2.

In the embodiments shown in FIGS. 22A-D, the signals may be any type of signal. The signals may be data signals (such as, for example, logic signals). The signals may be analog signals. The signals may be digital signals. The signals may be binary signals. The signals may be voltage signals. The signals may be current signals. The signals may satisfy one or more of the possible operating conditions described above such as the operating conditions described by one or more of the relationships (1) through (14) above.

A possible operating scheme may be to provide signals to the X lines while floating the Y lines. It is conceivable that the X line signals may start after, at the same time as or even before the Y lines start to float. The Y lines may be precharged to certain voltages (for example, possibly to 0 or ground or possibly to a level of the applied signals) prior to floating. Of course, other operating schemes are possible. For example, a bleeder circuit and/or a biasing circuit and/or a termination circuit may be used.

In the embodiments shown in FIGS. 22A-D, the X lines may be driver lines so that the signals are applied to driver lines. The X lines may be receiver lines so that the signals are applied to receiver lines.

In other embodiments, the signals may be applied to the Y lines instead of the X lines (where the Y lines may be driver lines or the Y lines may be receiver lines). When the signals are applied to the Y lines, a possible operating scheme may be to provide the signals to the Y lines while floating the X lines. It is conceivable that the Y line signals may start after, at the same time as or even before the X lines start to float. The X lines may be precharged to certain voltages prior to being allowed to float (again, for example, possibly to 0 or ground or possibly to a level of the applied signals). Of course, other operating schemes are also possible. For example, a bleeder circuit and/or a termination circuit may be used.

In the embodiments shown in FIGS. 22A-D, the programmable connection CPS may be any type of programmable connection, including, but not limited to, programmable connections comprising phase-change and/or threshold switching materials, programmable connections comprising phase-change memory elements and/or threshold switching elements as well as all programmable connections shown in FIGS. 3A-E, 4A-H, 5A-D, 8A-H, 9A-E, 11A-H and 12A-F.

The embodiments of methods of operation shown in FIGS. 22A-D may be used in combination with bleeder circuits and/or termination circuits.

It is noted, that for programmable matrix array having a plurality of X lines (and/or a plurality of Y lines), an embodiment of a method of operation may be to apply signals to two or more of the X lines (and/or to two or more of the Y lines) substantially simultaneously. Another embodiment of a method of operation may be to apply signals to all of the X lines (and/or all of the Y lines) substantially simultaneously. The signals may be applied to the driver lines and/or the receiver lines. The embodiments of methods of operation as depicted, for example, in FIGS. 22A-D may be applied to matrix arrays having a plurality of X lines (and/or a plurality of Y lines). In one embodiment, signals may be applied to a plurality of X lines (and/or a plurality of Y lines). In another embodiment, signals may be applied to all of the X lines (and/or all of the Y lines). Other embodiments of methods of operation may, of course, be possible.

In certain applications of a programmable matrix array (for example, for certain types of programmable logic devices), it may be desirable that more that one driver line may be electrically connected (via corresponding programmable connections) to a single receiver line. In certain applications of a programmable matrix array it may be desirable to use a wired-or configuration.

In certain applications of programmable matrix array (such as, for example, for certain programmable logic devices) it may be desirable that at most one programmable connection on a driver line may be programmed CLOSED. Likewise, in certain applications of a programmable matrix array (such as, for example, for certain programmable logic devices) it may be desirable that at most one programmable connection on a receiver line may be programmed CLOSED.

In certain applications of a programmable matrix array (for example, for certain types of programmable logic devices) it may be desirable that each driver line may be electrically connected to at most one receiver line and each receiver line electrically connected to at most one driver line. A possible method of operation may be that, if a particular programmable connection is CLOSED and electrically connecting a driver line to a receiver line, then every other programmable connection on the same driver line and on the same receiver line may be OPEN. A possible method of operation may be that at most one programmable connection on a driver line and at most one programmable connection on a receiver line may be programmed CLOSED.

It is conceivable that, in one or more embodiments of the invention, a programmable connection may be formed by placing one or more memory elements in series with one or more threshold switching elements. In such cases, the total threshold voltage of the series combination may be sum of the threshold voltages of the individual elements. As an example, a programmable connection may be formed by placing a memory element in series with more than one threshold switching element.

In one or more embodiments of the present invention, a programmable connection comprising a phase-change and/or a threshold switching material may be programmed by one or more types of energy. Examples of types of energy include, but are not limited to, thermal energy, electrical energy, electron beam energy, optical energy (such as laser energy), electromagnetic energy, microwave energy, mechanical energy and acoustical energy.

In one or more embodiments of the present invention, a programmable connection may comprise a phase-change material and/or a threshold switching material. In one or more embodiments of the present invention, a programmable connection may comprise a phase-change memory element and/or a threshold switching element.

In one or more embodiments of the present invention, a programmable connection may consist essentially of a phase-change material and/or a threshold switching material. In one or more embodiments of the present invention, a programmable connection may consist essentially of a phase-change memory element and/or a threshold switching element.

It is conceivable that, in one or more embodiments of the present invention, any of the examples of programmable matrix arrays described herein may be used as a memory array. For example, it is possible that the programmable matrix arrays shown in FIG. 3B (memory elements coupled between X and Y lines), in FIG. 3C (threshold switching elements coupled between X and Y lines) and in FIG. 3D (memory elements coupled in series with threshold switching elements between X and Y lines) may be used as memory arrays for memory storage. In particular, it is noted that the matrix array shown in FIG. 3C (threshold switching elements coupled between X and Y lines) may be used for memory storage. It is possible that each of the threshold switching elements may be used for both memory storage as well as an access device.

As an example, after a phase-change memory material and/or a threshold switching material is placed on an integrated circuit chip is may be possible to use a portion of these materials for programmable logic and a portion of these materials for memory. Likewise, programmable matrix arrays incorporating these materials may be formed on the chip and certain one or more of the arrays may be used for programmable logic while other one or more of the arrays may be used for memory. Hence, there may be a programmable logic device and a memory device on the same integrated circuit chip. Each device may comprise the same form of matrix array. Each matrix array may include one or more chalcogenide materials.

Figure 21:
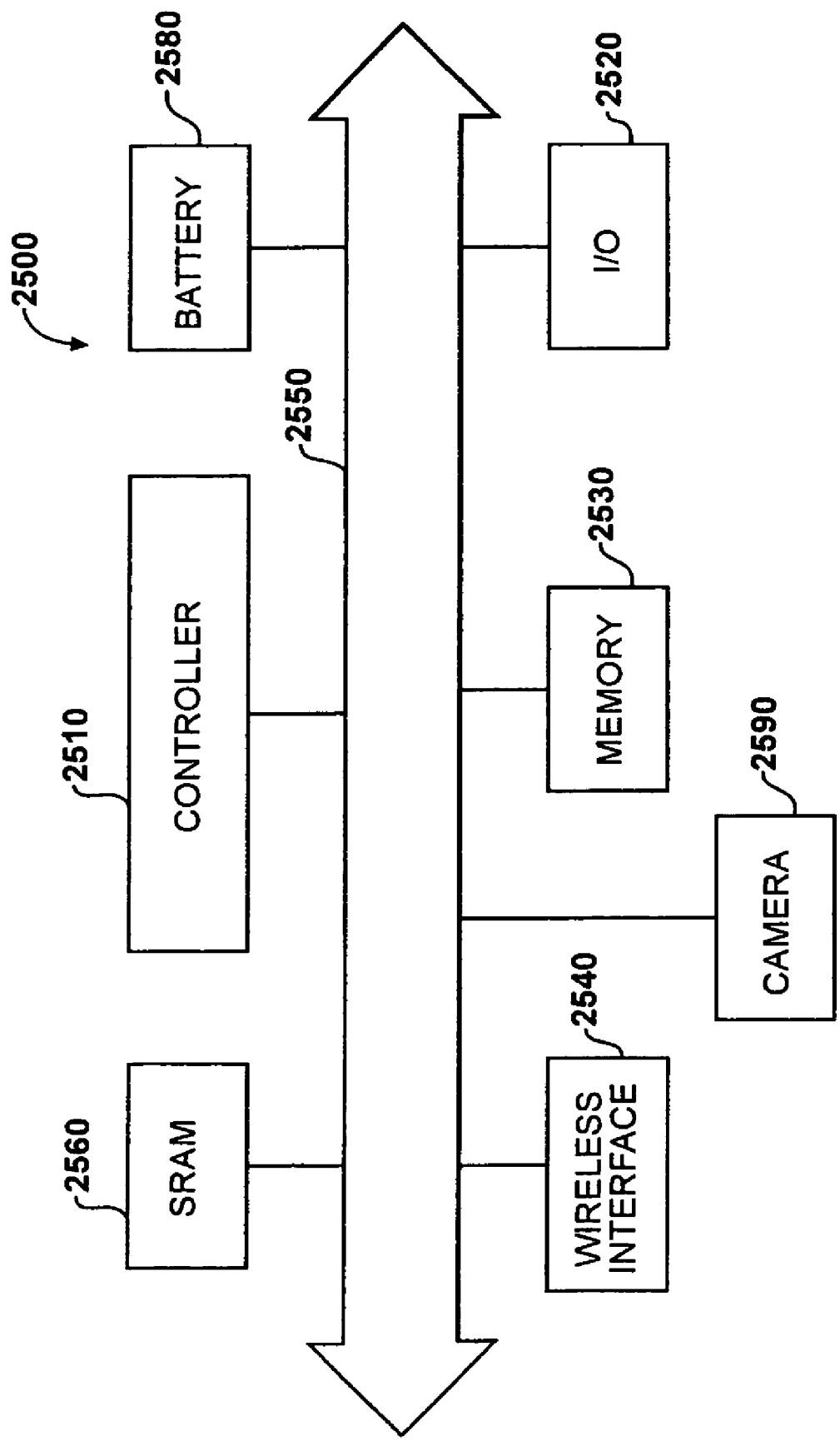
FIG. 21 shows a block diagram of an electronic device comprising memory, a controller, a wireless interface, a camera, SRAM, I/O and a battery.

Turning to FIG. 21, a portion of a system 2500 in accordance with an embodiment of the present invention is described. System 2500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 2500 may be used in any of the following systems: a wireless local area network (WLAN) system, a wireless personal area network (WPAN) system, or a cellular network, although the scope of the present invention is not limited in this respect.

System 2500 may include a controller 2510, an input/output (I/O) device 2520 (e.g. a keypad, display), a memory 2530, a wireless interface 2540, and a static random access memory (SRAM) 2560 and coupled to each other via a bus 2550. A battery 2580 may supply power to the system 2500 in one embodiment. It should be noted that the scope of the present invention is not limited to embodiments having any or all of these components (e.g. circuit elements).

Controller 2510 may comprise, for example, one or more microprocessors, digital signal processors, micro-controllers, or the like. Memory 2530 may be used to store messages transmitted to or by system 2500. Memory 2530 may also optionally be used to store instructions that are executed by controller 2510 during the operation of system 2500, and may be used to store user data. The instructions may be stored as digital information and the user data, as disclosed herein, may be stored in one section of the memory as digital data and in another section as analog memory. As another example, a given section at one time may be labeled as such and store digital information, and then later may be relabeled and reconfigured to store analog information. Memory 2530 may be provided by one or more different types of memory.

The I/O device 2520 may be used to generate a message. The system 2500 may use the wireless interface 2540 to transmit and receive messages to and from a wireless communication network with a radio frequency (RF) signal. Examples of the wireless interface 2540 may include an antenna, or a wireless transceiver, such as a dipole antenna, although the scope of the present invention is not limited in this respect. Also, the I/O device 2520 may deliver a voltage reflecting what is stored as either a digital output (if digital information was stored), or it may be analog information (if analog information was stored).

One or more of the elements of System 2500 may beneficially incorporate the embodiments herein described to optimize and/or program interconnect and the use of gates or other logic functions therein. For example, the processor may utilize programmable connections comprising a phase-change material (such as a chalcogenide phase-change material) and/or a threshold switching material (such as a chalcogenide or S-type threshold switching material), to connect a portion of the logic contained therein, or used in the chips to implement the processor. Additionally, the system 2500 may include at least a first and a second conductive line, wherein each conductive line may be coupled to one or more circuit elements. The first conductive line may be programmable coupled to the second conductive line through a programmable connection comprising, for example, a threshold switching material and/or a phase-change material. While an example in a wireless application is provided above, embodiments of the present invention may also be used in non-wireless applications as well.

While the present invention has been described with respect to a limited number of embodiments, those skilled in the art will appreciate numerous modifications and variations thereof. It is intended that the appended claims cover all such modifications and variations as fall within the true spirit and scope of this present invention.

We claim:

1. A method of operating a programmable matrix array, comprising: providing said programmable matrix array, said matrix array including at least a first conductive line, at least a second conductive line, a phase-change memory element coupled in series with a threshold switching element between said first and second conductive lines; providing an electrical signal on said first conductive line, said electrical signal satisfying the relationship: $|Vth(T)+Vh(T)|<|Vhigh-Vlow|<|Vth(T)+Vth(M)|$, where Vhigh is the maximum voltage of said electrical signal, Vlow is the minimum voltage of said electrical signal, Vth(T) is the threshold voltage of said threshold switching element, Vth(M) is the threshold voltage of said memory element in its reset state and Vh(T) is the holding voltage of said threshold switching element.

2. The method of claim 1, wherein said first conductive line crosses said second conductive line.

3. The method of claim 1, wherein said phase-change element comprises a chalcogenide material.

4. The method of claim 1, wherein said threshold switching element comprises a chalcogenide material.

5. The method of claim 1, wherein said threshold switching element comprises an S-type material.

6. The method of claim 1, wherein said electrical signal is a binary signal having a high voltage value of Vhigh and a low voltage value of Vlow.

7. A method of operating a programmable matrix array, comprising:
providing said programmable matrix array, said matrix array including a plurality of first conductive lines, a plurality of second conductive lines, a plurality of programmable connections, each said connections coupled between a corresponding one of said first conductive lines and a corresponding one of said second conductive lines, each of said programmable connections comprising a phase-change memory element coupled in series with a threshold switching element between the corresponding first and second conductive lines; substantially simultaneously applying a plurality of electrical signals to said plurality of first conductive lines where each of said electrical signals satisfying the relationship: $|Vth(T) +Vh(T)|<|Vhigh-Vlow|<|Vth(T)+Vth(M)|$, where Vhigh is the maximum voltage of each of said electrical signals, Vlow is the minimum voltage of each said electrical signals, Vth(T) is the threshold voltage of each of said threshold switching elements, Vh(T) is the holding voltage of each of said threshold switching elements, and Vth(M) is the threshold voltage of each of said memory elements in the reset state.

8. The method of claim 7, wherein said phase-change memory clement comprises a chalcogenide material.

9. The method of claim 7, wherein said threshold switching element comprises a chalcogenide material.

10. The method of claim 7, wherein said threshold switching element comprises an S-type material.

11. The method of claim 7, wherein said first conductive lines cross said second conductive lines.

12. The meted of claim 7, wherein said electrical signal is a binary signal having a high voltage value of Vhigh and a low voltage value of Vlow.

13. A method of operating a programmable matrix array, comprising:
providing said programmable matrix array, said matrix array including at least a first conductive line, at least a second conductive line, a chalcogenide material coupled between said first and second lines, said chalcogenide material comprising a chalcogenide phase- change element in series with a chalcogenide threshold switching element between said first and second conductive lines; and
providing an electrical signal on said first conductive line while floating said second conductive line, said electrical signal satisfying the relationship: $|Vth(T)+Vh(T)|<|Vhigh-Vlow|<|Vth(T)+Vth(M)|$, where Vhigh is the maximum voltage of said electrical signal, Vlow is the minimum voltage of said electrical signal, Vth(T) is the threshold voltage of said threshold switching element, Vth(M) is the threshold voltage of said memory element in its reset state and Vh(T) is the holding voltage of said threshold switching element.

14. The method of claim 13, wherein said first conductive line crosses said second conductive line.

15. The method of claim 13, wherein said electrical signal is sufficient to cause said threshold switching element to switch on when said memory element is in its set state and said electrical signal is insufficient to cause said threshold switching element to switch an when said memory clement is in its reset state.

16. The method of claim 13, wherein said electrical signal is a binary signal.

17. A method of operating a programmable matrix array, comprising:
providing said programmable matrix array, said matrix array including at least a first conductive line, at least a second conductive line, a phase-change memory element coupled in series with a threshold switching element between said first and second conductive lines; and
providing an electrical signal on said first conductive line while floating said second conductive line, said electrical signal satisfying the relationship: $|Vth(T)+Vh(T)|<|Vhigh-Vlow|<|Vth(T)+Vth(M)|$, where Vhigh is the maximum voltage of said electrical signal, Vlow is the minimum voltage of said electrical signal, Vth(T) is the threshold voltage of said threshold switching element, Vth(M) is the Threshold voltage of said memory element in its reset state and Vh(T) is the holding voltage of said threshold switching element.

18. The method of claim 17, wherein said first conductive line crosses said second conductive line.

19. The method of claim 17, wherein said electrical signal is sufficient to switch on said threshold switching element when said memory element is in its set state and insufficient to switch on said threshold switching element when said memory element is in its reset state.

20. The method of claim 17, wherein said phase-change element comprises a chalcogenide material.

21. The method of claim 17, wherein said threshold switching element comprises a chalcogenide material.

22. The method of claim 17, wherein said threshold switching element comprises an S-type material.

23. The method of claim 17, wherein said electrical signal is a binary signal.

* * * * *